US007613066B2

(12) United States Patent
Kodaira et al.

(10) Patent No.: US 7,613,066 B2
(45) Date of Patent: Nov. 3, 2009

(54) INTEGRATED CIRCUIT DEVICE AND ELECTRONIC INSTRUMENT

(75) Inventors: Satoru Kodaira, Chino (JP); Noboru Itomi, Nirasaki (JP); Shuji Kawaguchi, Suwa (JP); Takashi Kumagai, Chino (JP); Junichi Karasawa, Tatsuno-machi (JP); Satoru Ito, Suwa (JP); Masahiko Moriguchi, Suwa (JP); Kazuhiro Maekawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 641 days.

(21) Appl. No.: 11/477,719

(22) Filed: Jun. 30, 2006

(65) Prior Publication Data

US 2007/0013707 A1 Jan. 18, 2007

(30) Foreign Application Priority Data

| | | | |
|---|---|---|---|
| Jun. 30, 2005 | (JP) | ............................ | 2005-192685 |
| Feb. 10, 2006 | (JP) | ............................ | 2006-034500 |
| Feb. 10, 2006 | (JP) | ............................ | 2006-034516 |

(51) Int. Cl.
*G11C 8/00* (2006.01)

(52) U.S. Cl. ........................... 365/230.06; 365/189.04; 365/189.17; 365/233.1

(58) Field of Classification Search ............ 365/230.06, 365/189.04, 189.17, 233.1
See application file for complete search history.

(56) References Cited

U.S. PATENT DOCUMENTS 4,472,638 A 9/1984 Nishizawa et al.
4,566,038 A 1/1986 Dimick
4,648,077 A 3/1987 Pinkham et al.
4,975,753 A 12/1990 Ema
5,040,152 A 8/1991 Voss et al.

(Continued)

FOREIGN PATENT DOCUMENTS

CN 1534560 10/2004

(Continued)

OTHER PUBLICATIONS

U.S. Appl. No. 12/000,882, filed on Dec. 18, 2007 in the name of Kodaira et al.

(Continued)

*Primary Examiner*—Pho M. Luu
(74) *Attorney, Agent, or Firm*—Oliff & Berridge, PLC

(57) ABSTRACT

In an integrated circuit device, a data line driver block which drives data lines of a display panel based on data supplied from a RAM block from which data is read N times (N is an integer larger than one) in one horizontal scan period 1H of the display panel includes first to N-th divided data line driver blocks disposed along a first direction in which bitlines extend. When data supplied from the RAM block is M bits (M is an integer larger than 1) and grayscale of a pixel corresponding to the data line is G bits, each of the first to N-th divided data line driver blocks includes (M/G) (multiple of three) data line driver cells which drive (M/G) data lines. (M/3G) R data line driver cells are provided in a first subdivided driver, (M/3G) G data line driver cells are provided in a second subdivided driver, and (M/3G) B data line driver cells are provided in a third subdivided driver.

10 Claims, 39 Drawing Sheets

U.S. PATENT DOCUMENTS

| | | | |
|---|---|---|---|
| 5,058,058 | A | 10/1991 | Yasuda et al. |
| 5,233,420 | A | 8/1993 | Piri et al. |
| 5,325,338 | A | 6/1994 | Runaldue et al. |
| 5,426,603 | A | 6/1995 | Nakamura et al. |
| 5,490,114 | A | 2/1996 | Butler et al. |
| 5,544,306 | A | 8/1996 | Deering et al. |
| 5,598,346 | A | 1/1997 | Agrawal et al. |
| 5,659,514 | A | 8/1997 | Hazani |
| 5,701,269 | A | 12/1997 | Fujii |
| 5,739,803 | A | 4/1998 | Neugebauer |
| 5,767,865 | A | 6/1998 | Inoue et al. |
| 5,815,136 | A | 9/1998 | Ikeda et al. |
| 5,860,084 | A | 1/1999 | Yaguchi |
| RE36,089 | E | 2/1999 | Ooishi et al. |
| 5,909,125 | A | 6/1999 | Kean |
| 5,917,770 | A | 6/1999 | Tanaka |
| 5,920,885 | A | 7/1999 | Rao |
| 5,933,364 | A | 8/1999 | Aoyama et al. |
| 6,005,296 | A | 12/1999 | Chan |
| 6,025,822 | A | 2/2000 | Motegi et al. |
| 6,034,541 | A | 3/2000 | Kopec, Jr. et al. |
| 6,111,786 | A | 8/2000 | Nakamura |
| 6,118,425 | A | 9/2000 | Kudo et al. |
| 6,140,983 | A | 10/2000 | Quanrud |
| 6,225,990 | B1 | 5/2001 | Aoki et al. |
| 6,229,336 | B1 | 5/2001 | Felton et al. |
| 6,229,753 | B1 | 5/2001 | Kono et al. |
| 6,246,386 | B1 | 6/2001 | Perner |
| 6,259,459 | B1 | 7/2001 | Middleton |
| 6,278,148 | B1 | 8/2001 | Watanabe et al. |
| 6,324,088 | B1 | 11/2001 | Keeth et al. |
| 6,339,417 | B1 | 1/2002 | Quanrud |
| 6,421,286 | B1 | 7/2002 | Ohtani et al. |
| 6,559,508 | B1 | 5/2003 | Lin et al. |
| 6,580,631 | B1 | 6/2003 | Keeth et al. |
| 6,611,407 | B1 | 8/2003 | Chang |
| 6,646,283 | B1 | 11/2003 | Akimoto et al. |
| 6,724,378 | B2 | 4/2004 | Tamura et al. |
| 6,731,538 | B2 | 5/2004 | Noda et al. |
| 6,822,631 | B1 | 11/2004 | Yatabe |
| 6,826,116 | B2 | 11/2004 | Noda et al. |
| 6,858,901 | B2 | 2/2005 | Ker et al. |
| 6,862,247 | B2 | 3/2005 | Yamazaki |
| 6,873,310 | B2 | 3/2005 | Matsueda |
| 6,873,566 | B2 | 3/2005 | Choi |
| 6,999,353 | B2 | 2/2006 | Noda et al. |
| 7,034,792 | B2 | 4/2006 | Tamura |
| 7,078,948 | B2 | 7/2006 | Dosho |
| 7,081,879 | B2 | 7/2006 | Sun et al. |
| 7,142,221 | B2 | 11/2006 | Sakamaki et al. |
| 7,158,439 | B2 | 1/2007 | Shionori et al. |
| 7,164,415 | B2 | 1/2007 | Ooishi et al. |
| 7,176,864 | B2 | 2/2007 | Moriyama et al. |
| 7,180,495 | B1 | 2/2007 | Matsueda |
| 7,280,329 | B2 | 10/2007 | Kim et al. |
| 7,330,163 | B2 | 2/2008 | Nakai et al. |
| 7,391,668 | B2 | 6/2008 | Natori et al. |
| 7,411,861 | B2 * | 8/2008 | Kodaira et al. ......... 365/230.06 |
| 7,466,603 | B2 * | 12/2008 | Ong ...................... 365/189.08 |
| 7,522,441 | B2 * | 4/2009 | Kumagai et al. .............. 365/63 |
| 2001/0022744 | A1 | 9/2001 | Noda et al. |
| 2002/0011998 | A1 | 1/2002 | Tamura |
| 2002/0113783 | A1 | 8/2002 | Tamura et al. |
| 2002/0126108 | A1 | 9/2002 | Koyama et al. |
| 2002/0154557 | A1 | 10/2002 | Mizugaki et al. |
| 2003/0034948 | A1 | 2/2003 | Imamura |
| 2003/0053022 | A1 | 3/2003 | Kaneko et al. |
| 2003/0053321 | A1 | 3/2003 | Ishiyama |
| 2003/0156103 | A1 | 8/2003 | Ota |
| 2003/0169244 | A1 | 9/2003 | Kurokawa et al. |
| 2004/0004877 | A1 | 1/2004 | Uetake |
| 2004/0017341 | A1 | 1/2004 | Maki |
| 2004/0021947 | A1 | 2/2004 | Schofield et al. |
| 2004/0124472 | A1 | 7/2004 | Lin et al. |
| 2004/0140970 | A1 | 7/2004 | Morita |
| 2004/0239606 | A1 | 12/2004 | Ota |
| 2005/0001846 | A1 | 1/2005 | Shiono |
| 2005/0045955 | A1 | 3/2005 | Kim et al. |
| 2005/0047266 | A1 | 3/2005 | Shionori et al. |
| 2005/0052340 | A1 | 3/2005 | Goto et al. |
| 2005/0057581 | A1 | 3/2005 | Horiuchi et al. |
| 2005/0073470 | A1 | 4/2005 | Nose et al. |
| 2005/0116960 | A1 | 6/2005 | Shioda et al. |
| 2005/0122303 | A1 | 6/2005 | Hashimoto |
| 2005/0195149 | A1 | 9/2005 | Ito |
| 2005/0212788 | A1 | 9/2005 | Fukuda et al. |
| 2005/0212826 | A1 | 9/2005 | Fukuda et al. |
| 2005/0219189 | A1 | 10/2005 | Fukuo |
| 2005/0253976 | A1 | 11/2005 | Sekiguchi et al. |
| 2005/0262293 | A1 | 11/2005 | Yoon |
| 2005/0285862 | A1 | 12/2005 | Noda et al. |
| 2006/0028417 | A1 | 2/2006 | Harada et al. |
| 2006/0050042 | A1 | 3/2006 | Yi |
| 2006/0062483 | A1 | 3/2006 | Kondo et al. |
| 2007/0000971 | A1 | 1/2007 | Kumagai et al. |
| 2007/0001886 | A1 | 1/2007 | Ito et al. |
| 2007/0001982 | A1 | 1/2007 | Ito et al. |
| 2007/0001983 | A1 | 1/2007 | Ito et al. |
| 2007/0001984 | A1 | 1/2007 | Kumagai et al. |
| 2007/0002188 | A1 | 1/2007 | Kumagai et al. |
| 2007/0002509 | A1 | 1/2007 | Kumagai et al. |
| 2007/0013634 | A1 | 1/2007 | Saiki et al. |
| 2007/0013635 | A1 | 1/2007 | Ito et al. |
| 2007/0013687 | A1 | 1/2007 | Kodaira et al. |
| 2007/0013706 | A1 | 1/2007 | Kodaira et al. |
| 2007/0016700 | A1 | 1/2007 | Kodaira et al. |
| 2007/0035503 | A1 | 2/2007 | Kurokawa et al. |
| 2007/0187762 | A1 | 8/2007 | Saiki et al. |

FOREIGN PATENT DOCUMENTS

| | | |
|---|---|---|
| CN | 1542964 | 11/2004 |
| EP | 0 499 478 A2 | 8/1992 |
| JP | A 63-225993 | 9/1988 |
| JP | A 1-171190 | 7/1989 |
| JP | A 4-370595 | 12/1992 |
| JP | A 5-181154 | 7/1993 |
| JP | A 7-281634 | 10/1995 |
| JP | A 8-69696 | 3/1996 |
| JP | A 11-261011 | 9/1999 |
| JP | A 11-274424 | 10/1999 |
| JP | A 11-330393 | 11/1999 |
| JP | A-2001-067868 | 3/2001 |
| JP | A-2001-222249 | 8/2001 |
| JP | A-2001-222276 | 8/2001 |
| JP | A 2002-244624 | 8/2002 |
| JP | A-2002-358777 | 12/2002 |
| JP | A 2003-022063 | 1/2003 |
| JP | A 2003-330433 | 11/2003 |
| JP | A 2004-040042 | 2/2004 |
| JP | A 2004-146806 | 5/2004 |
| JP | A 2004-159314 | 6/2004 |
| JP | A 2004-328456 | 11/2004 |
| JP | A 2005-17725 | 1/2005 |
| JP | A 2005-72607 | 3/2005 |
| KR | A 1992-17106 | 9/1992 |
| KR | 1999-88197 | 12/1999 |
| KR | A 2001-100814 | 11/2001 |
| KR | 10-2005-0011743 | 1/2005 |
| TW | 501080 | 9/2002 |
| TW | 522366 | 3/2003 |
| TW | 1224300 | 3/2003 |
| TW | 563081 | 11/2003 |

OTHER PUBLICATIONS

U.S. Appl. No. 11/270,569, filed Nov. 10, 2005 in the name of Satoru Kodaira et al.
U.S. Appl. No. 11/270,546, filed Nov. 10, 2005 in the name of Satoru Kodaira et al.
U.S. Appl. No. 11/270,552, filed Nov. 10, 2005 in the name of Satoru Kodaira et al.
U.S. Appl. No. 11/270,694, filed Nov. 10, 2005 in the name of Satoru Kodaira et al.
U.S. Appl. No. 11/270,749, filed Nov. 10, 2005 in the name of Satoru Kodaira et al.
U.S. Appl. No. 11/270,551, filed Nov. 10, 2005 in the name of Takashi Kumagai et al.
U.S. Appl. No. 11/270,779, filed Nov. 10, 2005 in the name of Takashi Kumagai et al.
U.S. Appl. No. 11/270,585, filed Nov. 10, 2005 in the name of Takashi Kumagai et al.
U.S. Appl. No. 11/270,747, filed Nov. 10, 2005 in the name of Takashi Kumagai et al.
U.S. Appl. No. 11/270,632, filed Nov. 10, 2005 in the name of Takashi Kumagai et al.
U.S. Appl. No. 11/270,553, filed Nov. 10, 2005 in the name of Takashi Kumagai et al.
U.S. Appl. No. 11/270,631, filed Nov. 10, 2005 in the name of Takashi Kumagai et al.
U.S. Appl. No. 11/270,665, filed Nov. 10, 2005 in the name of Takashi Kumagai et al.
U.S. Appl. No. 11/270,549, filed Nov. 10, 2005 in the name of Satoru Kodaira et al.
U.S. Appl. No. 11/270,666, filed Nov. 10, 2005 in the name of Satoru Kodaira et al.
U.S. Appl. No. 11/270,630, filed Nov. 10, 2005 in the name of Satoru Kodaira et al.
U.S. Appl. No. 11/270,586, filed Nov. 10, 2005 in the name of Satoru Kodaira et al.
U.S. Appl. No. 11/270,547, filed Nov. 10, 2005 in the name of Satoru Kodaira et al.
U.S. Appl. No. 11/477,646, filed Jun. 30, 2006 in the name of Satoru Ito et al.
U.S. Appl. No. 11/477,642, filed Jun. 30, 2006 in the name of Satoru Ito et al.
U.S. Appl. No. 11/477,718, filed Jun. 30, 2006 in the name of Satoru Ito et al.
U.S. Appl. No. 11/477,714, filed Jun. 30, 2006 in the name of Takayuki Saiki et al.
U.S. Appl. No. 11/477,670, filed Jun. 30, 2006 in the name of Satoru Ito et al.
U.S. Appl. No. 11/477,715, filed Jun. 30, 2006 in the name of Takashi Kumagai et al.
U.S. Appl. No. 11/477,741, filed Jun. 30, 2006 in the name of Takashi Kumagai et al.
U.S. Appl. No. 11/477,782, filed Jun. 30, 2006 in the name of Takashi Kumagai et al.
U.S. Appl. No. 11/477,720, filed Jun. 30, 2006 in the name of Takashi Kumagai et al.
U.S. Appl. No. 11/477,716, filed Jun. 30, 2006 in the name of Satoru Kodaira et al.
U.S. Appl. No. 11/477,647, filed Jun. 30, 2006 in the name of Satoru Kodaira et al.
U.S. Appl. No. 11/477,669, filed Jun. 30, 2006 in the name of Satoru Kodaira et al.

* cited by examiner

INTEGRATED CIRCUIT DEVICE AND ELECTRONIC INSTRUMENT

Japanese Patent Application No. 2005-192685 filed on Jun. 30, 2005, Japanese Patent Application No. 2006-34500 filed on Feb. 10, 2006, and Japanese Patent Application No. 2006-34516 filed on Feb. 10, 2006, are hereby incorporated by reference in their entirety.

BACKGROUND OF THE INVENTION

The present invention relates to an integrated circuit device and an electronic instrument.

In recent years, an increase in resolution of a display panel provided in an electronic instrument has been demanded accompanying a widespread use of electronic instruments. Therefore, a driver circuit which drives a display panel is required to exhibit high performance. However, since many types of circuits are necessary for a high-performance driver circuit, the circuit scale and the circuit complexity tend to be increased in proportion to an increase in resolution of a display panel. Therefore, since it is difficult to reduce the chip area of the driver circuit while maintaining the high performance or providing another function, manufacturing cost cannot be reduced.

A high-resolution display panel is also provided in a small electronic instrument, and high performance is demanded for its driver circuit. However, the circuit scale cannot be increased to a large extent since a small electronic instrument is limited in space. Therefore, since it is difficult to reduce the chip area while providing high performance, a reduction in manufacturing cost or provision of another function is difficult.

JP-A-2001-222276 discloses a RAM integrated liquid crystal display driver, but does not teach a reduction in size of the liquid crystal display driver.

SUMMARY

One aspect of the invention relates to an integrated circuit device comprising:

a RAM block including a plurality of wordlines, a plurality of bitlines, a plurality of memory cells, and a data read control circuit; and a data line driver block which drives a plurality of data line groups of a display panel based on data supplied from the RAM block, wherein the data read control circuit reads data for pixels corresponding to data lines of each of the data line groups from the RAM block by N-time reading (N is an integer larger than one);

wherein the data line driver block includes first to N-th divided data line driver blocks, each of the first to N-th divided data line driver blocks driving a different data line group of the data line groups; and wherein each of the first to N-th divided data line driver blocks is disposed along a first direction in which the bitlines extend;

wherein, when data supplied from the RAM block is M bits (M is an integer larger than 1) and grayscale of a pixel corresponding to a data line is G bits, each of the first to N-th divided data line driver blocks includes (M/G) data line driver cells which drive (M/G) data lines; and wherein, when the display panel is a color display panel, (M/G) is a multiple of three, and the (M/G) data line driver cells include (M/3G) R data line driver cells each of which drives a data line corresponding to an R pixel, (M/3G) G data line driver cells each of which drives a data line corresponding to a G pixel, and (M/3G) B data line driver cells each of which drives a data line corresponding to a B pixel.

DETAILED DESCRIPTION OF THE EMBODIMENT

Figure 1A:
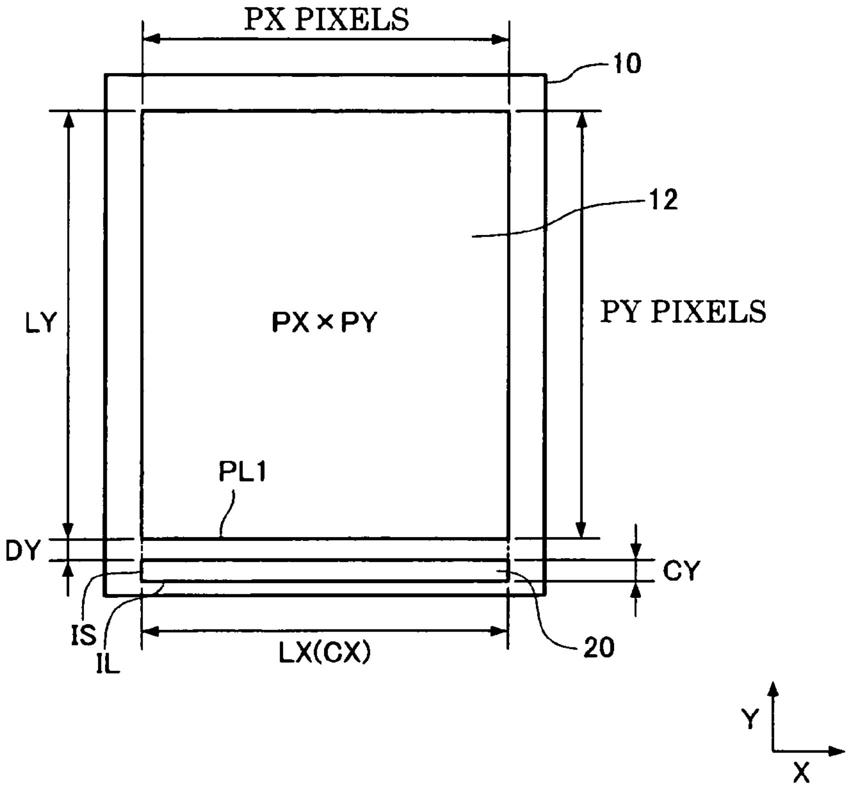
FIGS. 1A and 1B are diagrams showing an integrated circuit device according to one embodiment of the invention.

The invention may provide an integrated circuit device which allows a flexible circuit arrangement to enable an efficient layout, and an electronic instrument including the same.

An embodiment of the invention provides an integrated circuit device comprising:

a RAM block including a plurality of wordlines, a plurality of bitlines, a plurality of memory cells, and a data read control circuit; and a data line driver block which drives a plurality of data line groups of a display panel based on data supplied from the RAM block, wherein the data read control circuit reads data for pixels corresponding to data lines of each of the data line groups from the RAM block by N-time reading (N is an integer larger than one);

wherein the data line driver block includes first to N-th divided data line driver blocks, each of the first to N-th divided data line driver blocks driving a different data line group of the data line groups; and wherein each of the first to N-th divided data line driver blocks is disposed along a first direction in which the bitlines extend;

wherein, when data supplied from the RAM block is M bits (M is an integer larger than 1) and grayscale of a pixel corresponding to a data line is G bits, each of the first to N-th divided data line driver blocks includes (M/G) data line driver cells which drive (M/G) data lines; and wherein, when the display panel is a color display panel, (M/G) is a multiple of three, and the (M/G) data line driver cells include (M/3G) R data line driver cells each of which drives a data line corresponding to an R pixel, (M/3G) G data line driver cells each of which drives a data line corresponding to a G pixel, and (M/3G) B data line driver cells each of which drives a data line corresponding to a B pixel.

Since data stored in the memory cells can be read by N times reading in one horizontal scan period, the degrees of freedom of the layout of the display memory can be increased. Specifically, when reading data from the display memory only once in one horizontal scan period as in a related-art integrated circuit device, since the number of memory cells connected with one wordline must be equal to the number of grayscale bits of the pixels corresponding to all the data lines of the display panel, the degrees of freedom of the layout are decreased. In the embodiment, since data is read N times in one horizontal scan period, the number of memory cells connected with one wordline can be reduced by 1/N. Therefore, the aspect (height/width) ratio of the memory cell can be changed by changing the number of readings N, for example.

According to the embodiment, since the data line driver block includes N divided data line driver blocks disposed along the first direction, the data line driver block can be flexibly arranged. As the resolution of the display panel is increased, the number of data lines is increased. In the embodiment, since the data line driver block can be configured by the N divided data line driver blocks, the data line driver block can be efficiently arranged in the integrated circuit device even when driving a high-resolution display panel. Therefore, the chip area of the integrated circuit device can be reduced. Specifically, cost is reduced. Moreover, since the width of the data line driver block can be adjusted to the width of the RAM block in the direction in which the wordlines extend, the data line driver block and the RAM block can be efficiently arranged in the integrated circuit device, whereby cost can be reduced.

In this integrated circuit device, even if the number of readings N in one horizontal scan period is not a multiple of three, the R, G, and B driver cells can be disposed in each of the first to N-th divided driver blocks.

In this integrated circuit device, a first subdivided driver in which the (M/3G) R data line driver cells included in the first to N-th divided driver blocks are arranged in a second direction in which the wordlines extend, a second subdivided driver in which the (M/3G) G data line driver cells are arranged in the second direction, and a third subdivided driver in which the (M/3G) B data line driver cells are arranged in the second direction may be disposed at different positions in the first direction.

This allows the R, G, and B driver cell of the subdivided driver to be arranged in color units in each of the first to N-th divided driver blocks along the second direction. Therefore, the arrangement of the driver cells for driving the data lines arranged in the display panel in the order of R, G, and B can be optimized.

With this integrated circuit device, the data read control circuit may include a wordline control circuit, and the wordline control circuit may select N different wordlines from the wordlines in one horizontal scan period, and may not select the identical wordline a plurality of times in one vertical scan period of the display panel.

Although data may be read N times in one horizontal scan period in various ways, the number of memory cells connected with one wordline is reduced by 1/N by the above-described control. The data in the number of grayscale bits of the pixels corresponding to all the data lines of the display panel can be read by selecting N wordlines in one horizontal scan period.

With this integrated circuit device, first to N-th latch signals may be respectively supplied to the first to N-th divided data line driver blocks, and the first to N-th divided data line driver blocks may latch the data supplied from the RAM block based on the first to N-th latch signals.

According to the embodiment, since the first to N-th divided data line driver blocks can latch the data supplied from the RAM block based on the first to N-th latch signals, data read from the RAM block by N times reading can be latched by the N divided data line driver blocks. This enables the data line driver block to drive the data line groups based on the data supplied from the RAM block.

With this integrated circuit device, when the data has been read from the RAM block K ($1 \leqq K \leqq N$, K is an integer) times in one horizontal scan period, the K-th latch signal may be set to active so that the data supplied from the RAM block by the K-th read operation is latched by the K-th divided data line driver block.

This enables the data supplied from the RAM block by the K-th read operation to be latched by the K-th divided data line driver block corresponding to N read operations in one horizontal scan period.

With this integrated circuit device, the RAM block may include a sense amplifier circuit which outputs M-bit data by one read operation, at least M memory cells may be arranged in the RAM block along a second direction in which the wordlines extend, and M-bit data may be supplied to the sense amplifier circuit by one read operation.

This enables the number of memory cells arranged in the RAM block along the second direction in which the wordlines extend to be set at M, whereby M-bit data output from the M memory cells by one read operation can be output through the sense amplifier circuit.

With the integrated circuit device, an identical latch signal of the first to third latch signals may be supplied to each of the first to third subdivided data line drivers.

This enables the subdivided data line drivers to be disposed along the first direction without complicating the control.

With this integrated circuit device, the wordlines may be formed parallel to a direction in which the data lines of the display panel extend.

This enables the length of the wordline to be reduced in the integrated circuit device according to the embodiment without providing a special circuit, in comparison with the case where the wordline is formed perpendicularly to the data line. In the embodiment, a host may select one of the RAM blocks and control the wordline of the selected RAM block. Since the length of the wordline to be controlled can be reduced as described above, the integrated circuit device according to the embodiment can reduce power consumption during write control from the host.

Another embodiment of the invention provides an electronic instrument comprising any of the above integrated circuit devices, and a display panel.

With this electronic instrument, the integrated circuit device may be mounted on a substrate which forms the display panel.

These embodiments of the invention will be described in detail below, with reference to the drawings. Note that the embodiments described below do not in any way limit the scope of the invention laid out in the claims herein. In addition, not all of the elements of the embodiments described below should be taken as essential requirements of the invention. In the drawings, components denoted by the same reference numbers have the same meanings.

1. Display Driver

FIG. 1A shows a display panel 10 on which a display driver 20 (integrated circuit device in a broad sense) is mounted. In the embodiment, the display driver 20 or the display panel 10 on which the display driver 20 is mounted may be provided in a small electronic instrument (not shown). As examples of the small electronic instrument, a portable telephone, a PDA, a digital music player including a display panel, and the like can be given. In the display panel 10, a plurality of display pixels are formed on a glass substrate, for example. A plurality of data lines (not shown) extending in a direction Y and a plurality of scan lines (not shown) extending in a direction X are formed in the display panel 10 corresponding to the display pixels. The display pixel formed in the display panel 10 of the embodiment is a liquid crystal element. However, the display pixel is not limited to the liquid crystal element. The display pixel may be a light-emitting element such as an electroluminescence (EL) element. The display pixel may be either an active type including a transistor or the like or a passive type which does not include a transistor or the like. When the active type display pixel is applied to a display region 12, the liquid crystal pixel may be an amorphous TFT or a low-temperature polysilicon TFT.

The display panel 10 includes the display region 12 having PX pixels in the direction X and PY pixels in the direction Y, for example. When the display panel 10 supports a QVGA display, PX=240 and PY=320 so that the display region 12 is displayed in 240×320 pixels. The number of pixels PX of the display panel 10 in the direction X coincides with the number of data lines in the case of a black and white display. In the case of a color display, one pixel is formed by three subpixels including an R subpixel, a G subpixel, and a B subpixel. Therefore, the number of data lines is (3×PX) in the case of a color display. Accordingly, the "number of pixels corresponding to the data lines" means the "number of subpixels in the direction X" in the case of a color display. The number of bits of each subpixel is determined corresponding to the grayscale. When the grayscale values of three subpixels are respectively G bits, the grayscale value of one pixel is 3G. When each subpixel represents 64 grayscales (six bits), the amount of data for one pixel is 6×3=18 bits.

The relationship between the number of pixels PX and the number of pixels PY may be PX>PY, PX<PY, or PX=PY.

The display driver 20 has a dimension CX in the direction X and a dimension CY in the direction Y. A long side IL of the display driver 20 having the dimension CX is parallel to a side PL1 of the display region 12 on the side of the display driver

20. Specifically, the display driver 20 is mounted on the display panel 10 so that the long side IL is parallel to the side PL1 of the display region 12.

Figure 1B:
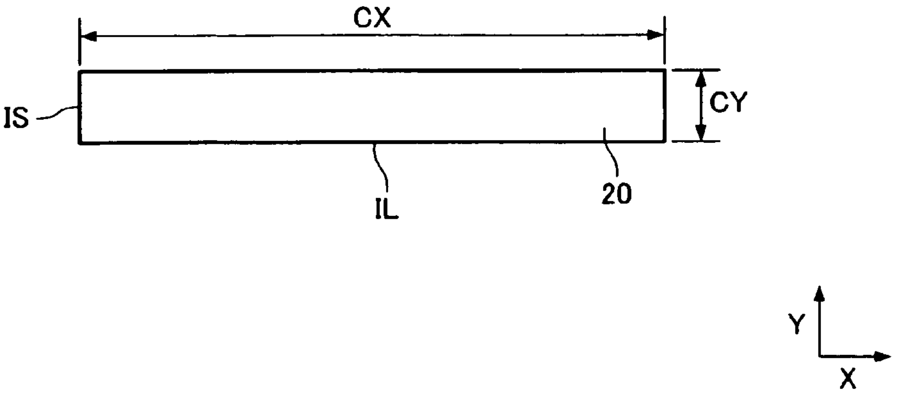

FIG. 1B is a diagram showing the size of the display driver 20. The ratio of a short side IS of the display driver 20 having the dimension CY to the long side IL of the display driver 20 is set at 1:10, for example. Specifically, the short side IS of the display driver 20 is set to be much shorter than the long side IL. The chip size of the display driver 20 in the direction Y can be minimized by forming such a narrow display driver 20.

The above-mentioned ratio "1:10" is merely an example. The ratio is not limited thereto. For example, the ratio may be 1:11 or 1:9.

FIG. 1A illustrates the dimension LX in the direction X and the dimension LY in the direction Y of the display region 12. The aspect (height/width) ratio of the display region 12 is not limited to that shown in FIG. 1A. The dimension LY of the display region 12 may be shorter than the dimension LX, for example.

In FIG. 1A, the dimension LX of the display region 12 in the direction X is equal to the dimension CX of the display driver 20 in the direction X. It is preferable that the dimension LX and the dimension CX be equal as shown in FIG. 1A, although not limited to FIG. 1A. The reason is shown in FIG. 2A.

Figure 2A:
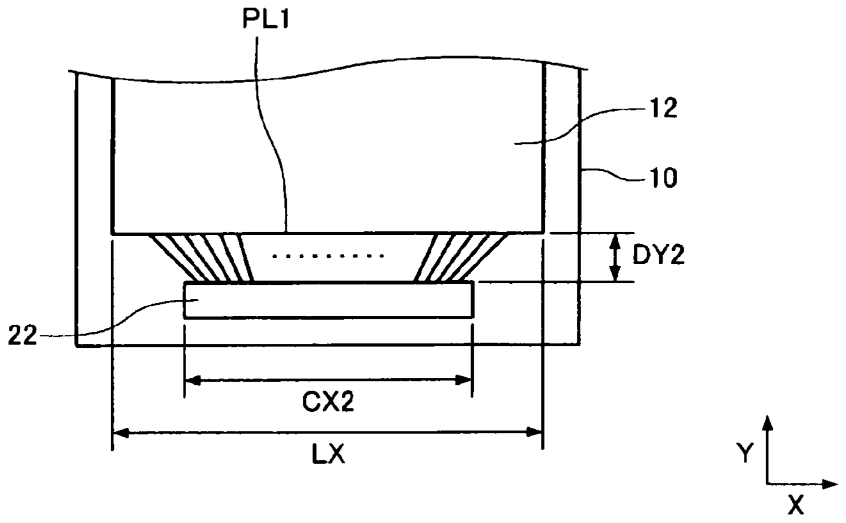
FIG. 2A is a diagram showing a part of a comparative example for the embodiment.

In a display driver 22 shown in FIG. 2A, the dimension in the direction X is set at CX2. Since the dimension CX2 is shorter than the dimension LX of the side PL1 of the display region 12, a plurality of interconnects which connect the display driver 22 with the display region 12 cannot be provided parallel to the direction Y, as shown in FIG. 2A. Therefore, it is necessary to increase a distance DY2 between the display region 12 and the display driver 22. As a result, since the size of the glass substrate of the display panel 10 must be increased, a reduction in cost is hindered. Moreover, when providing the display panel 10 in a smaller electronic instrument, the area other than the display region 12 is increased, whereby a reduction in size of the electronic instrument is hindered.

Figure 2B:
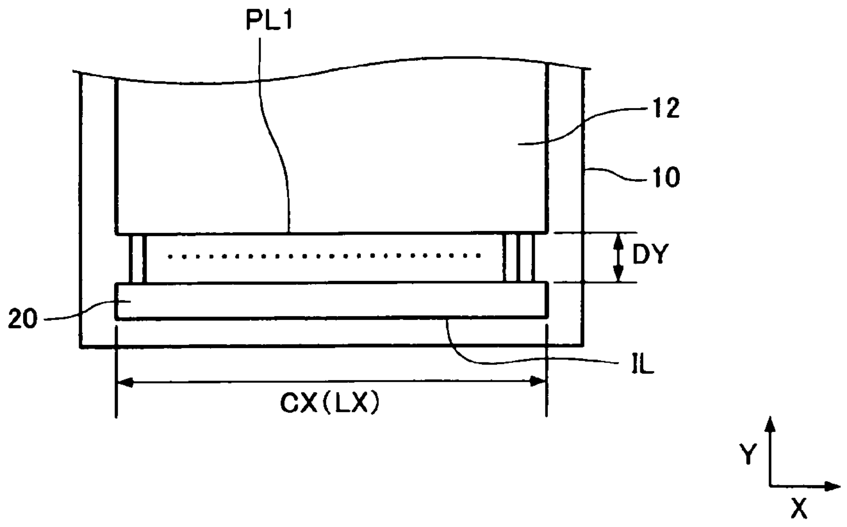
FIG. 2B is a diagram showing a part of the integrated circuit device according to the embodiment.

On the other hand, since the display driver 20 of the embodiment is formed so that the dimension CX of the long side IL is equal to the dimension LX of the side PL1 of the display region 12 as shown in FIG. 2B, the interconnects between the display driver 20 and the display region 12 can be provided parallel to the direction Y. This enables a distance DY between the display driver 20 and the display region 12 to be reduced in comparison with FIG. 2A. Moreover, since the dimension IS of the display driver 20 in the direction Y is short, the size of the glass substrate of the display panel 10 in the direction Y is reduced, whereby the size of an electronic instrument can be reduced.

In the embodiment, the display driver 20 is formed so that the dimension CX of the long side IL is equal to the dimension LX of the side PL1 of the display region 12. However, the invention is not limited thereto.

The distance DY can be reduced while achieving a reduction in the chip size by setting the dimension of the long side IL of the display driver 20 to be equal to the dimension LX of the side PL1 of the display region 12 and reducing the dimension of the short side IS. Therefore, manufacturing cost of the display driver 20 and manufacturing cost of the display panel 10 can be reduced.

Figure 3A:
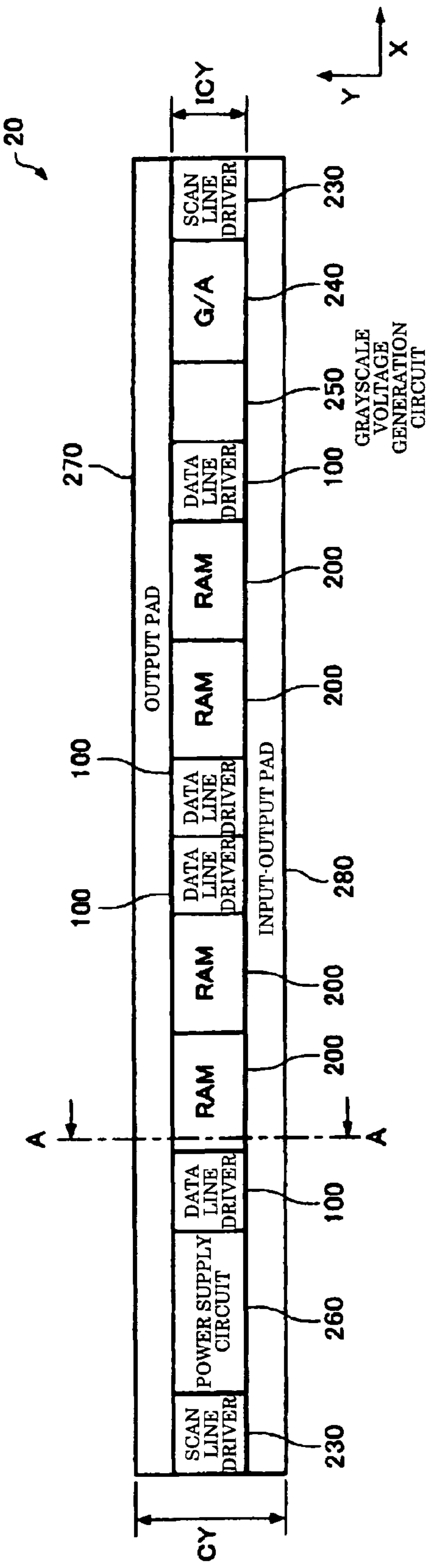
FIGS. 3A and 3B are diagrams showing a configuration example of the integrated circuit device according to the embodiment.
Figure 3B:
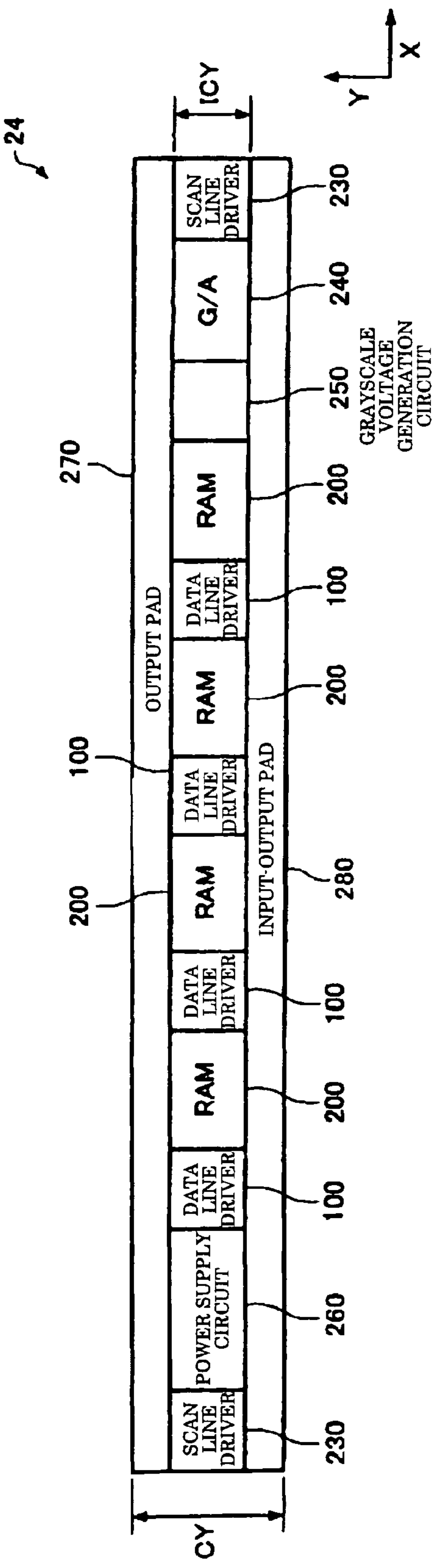

FIGS. 3A and 3B are diagrams showing a layout configuration example of the display driver 20 of the embodiment. As shown in FIG. 3A, the display driver 20 includes a data line driver 100 (data line driver block in a broad sense), a RAM 200 (integrated circuit device or RAM block in a broad sense), a scan line driver 230, a G/A circuit 240 (gate array circuit; automatic routing circuit in a broad sense), a grayscale voltage generation circuit 250, and a power supply circuit 260 disposed along the direction X. These circuits are disposed within a block width ICY of the display driver 20. An output PAD 270 and an input-output PAD 280 are provided in the display driver 20 with these circuits interposed therebetween. The output PAD 270 and the input-output PAD 280 are formed along the direction X. The output PAD 270 is provided on the side of the display region 12. A signal line for supplying control information from a host (e.g. MPU, baseband engine (BBE), MGE, or CPU), a power supply line, and the like are connected with the input-output PAD 280, for example.

The data lines of the display panel 10 are divided into a plurality of (e.g. four) blocks, and one data line driver 100 drives the data lines for one block.

It is possible to flexibly meet the user's needs by providing the block width ICY and disposing each circuit within the block width ICY. In more detail, since the number of data lines which drive the pixels is changed when the number of pixels PX of the drive target display panel 10 in the direction X is changed, it is necessary to design the data line driver 100 and the RAM 200 corresponding to such a change in the number of data lines. In a display driver for a low-temperature polysilicon (LTPS) TFT panel, since the scan driver 230 can be formed on the glass substrate, the scan line driver 230 may not be provided in the display driver 20.

In the embodiment, the display driver 20 can be designed merely by changing the data line driver 100 and the RAM 200 or removing the scan line driver 230. Therefore, since it is unnecessary to newly design the display driver 20 by utilizing the original layout, design cost can be reduced.

In FIG. 3A, two RAMs 200 are disposed adjacent to each other. This enables a part of the circuits used for the RAM 200 to be used in common, whereby the area of the RAM 200 can be reduced. The detailed effects are described later. In the embodiment, the display driver is not limited to the display driver 20 shown in FIG. 3A. For example, the data line driver 100 and the RAM 200 may be adjacent to each other and two RAMs 200 may not be disposed adjacent to each other, as in a display driver 24 shown in FIG. 3B.

In FIGS. 3A and 3B, four data line drivers 100 and four RAMs 200 are provided as an example. The number of data lines driven in one horizontal scan period (also called "1H period") can be divided into four by providing four data line drivers 100 and four RAMs 200 (4BANK) in the display driver 20. When the number of pixels PX is 240, it is necessary to drive 720 data lines in the 1H period taking the R subpixel, G subpixel, and B subpixel into consideration, for example. In the embodiment, it suffices that each data line driver 100 drive 180 data lines which are ¼ of the 720 data lines. The number of data lines driven by each data line driver 100 can be reduced by increasing the number of BANKs. The number of BANKs is defined as the number of RAMs 200 provided in the display driver 20. The total storage area of the RAMs 200 is defined as the storage area of a display memory. The display memory may store at least data for displaying an image for one frame of the display panel 10.

Figure 4:
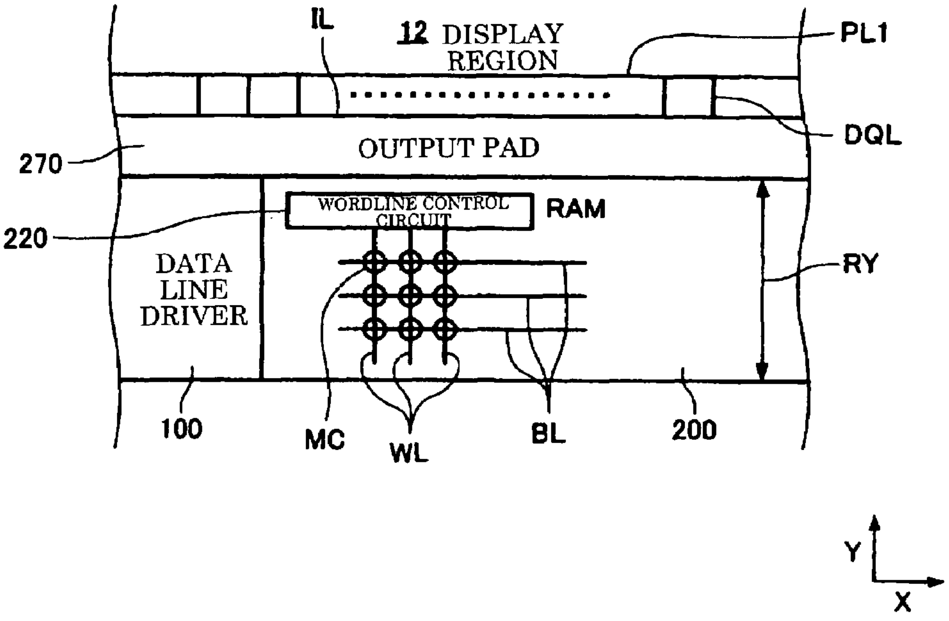
FIG. 4 is a configuration example of a display memory according to the embodiment.

FIG. 4 is an enlarged diagram of a part of the display panel 10 on which the display driver 20 is mounted. The display region 12 is connected with the output PAD 270 of the display driver 20 through interconnects DQL. The interconnect may be an interconnect provided on the glass substrate, or may be an interconnect formed on a flexible substrate or the like and connects the output PAD 270 with the display region 12.

The dimension of the RAM 200 in the direction Y is set at RY. In the embodiment, the dimension RY is set to be equal to the block width ICY shown in FIG. 3A. However, the invention is not limited thereto. For example, the dimension RY may be set to be equal to or less than the block width ICY.

The RAM 200 having the dimension RY includes a plurality of wordlines WL and a wordline control circuit 220 which controls the wordlines WL. The RAM 200 includes a plurality of bitlines BL, a plurality of memory cells MC, and a control circuit (not shown) which controls the bitlines BL and the memory cells MC. The bitlines BL of the RAM 200 are provided parallel to the direction X (bitline direction). Specifically, the bitlines BL are provided parallel to the side PL1 of the display region 12. The wordlines WL of the RAM 200 are provided parallel to the direction Y (wordline direction). Specifically, the wordlines WL are provided parallel to the interconnects DQL.

Data is read from the memory cell MC of the RAM 200 by controlling the wordline WL, and the data read from the memory cell MC is supplied to the data line driver 100. Specifically, when the wordline WL is selected, data stored in the memory cells MC arranged along the direction Y is supplied to the data line driver 100.

Figure 5:
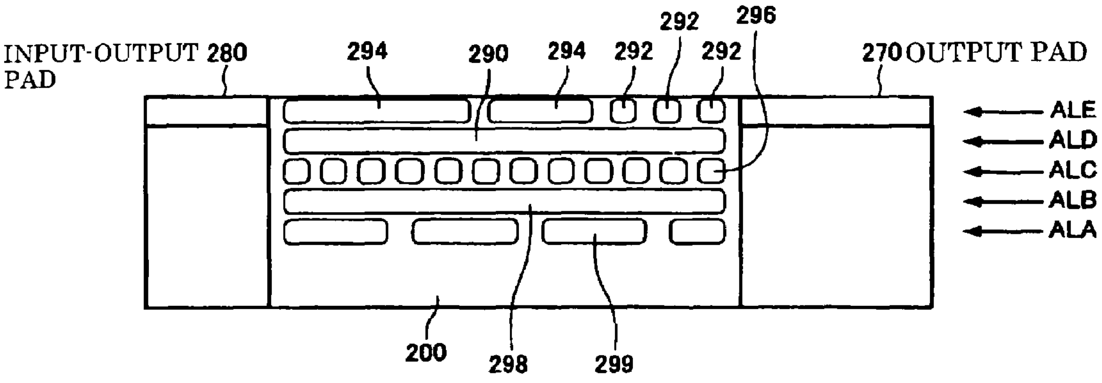
FIG. 5 is a cross-sectional diagram of the integrated circuit device according to the embodiment.

FIG. 5 is a cross-sectional diagram showing the cross section A-A shown in FIG. 3A. The cross section A-A is the cross section in the region in which the memory cells MC of the RAM 200 are arranged. For example, five metal interconnect layers are provided in the region in which the RAM 200 is formed. A first metal interconnect layer ALA, a second metal interconnect layer ALB, a third metal interconnect layer ALC, a fourth metal interconnect layer ALD, and a fifth metal interconnect layer ALE are illustrated in FIG. 5. A grayscale voltage interconnect 292 to which a grayscale voltage is supplied from the grayscale voltage generation circuit 250 is formed in the fifth metal interconnect layer ALE, for example. A power supply interconnect 294 for supplying a voltage supplied from the power supply circuit 260, a voltage supplied from the outside through the input-output PAD 280, or the like is also formed in the fifth metal interconnect layer ALE. The RAM 200 of the embodiment may be formed without using the fifth metal interconnect layer ALE, for example. Therefore, various interconnects can be formed in the fifth metal interconnect layer ALE as described above.

A shield layer 290 is formed in the fourth metal interconnect layer ALD. This enables effects exerted on the memory cells MC of the RAM 200 to be reduced even if various interconnects are formed in the fifth metal interconnect layer ALE in the upper layer of the memory cells MC of the RAM 200. A signal interconnect for controlling the control circuit for the RAM 200, such as the wordline control circuit 220, may be formed in the fourth metal interconnect layer ALD in the region in which the control circuit is formed.

An interconnect 296 formed in the third metal interconnect layer ALC may be used as the bitline BL or a voltage VSS interconnect, for example. An interconnect 298 formed in the second metal interconnect layer ALB may be used as the wordline WL or a voltage VDD interconnect, for example. An interconnect 299 formed in the first metal interconnect layer ALA may be used to connect with each node formed in a semiconductor layer of the RAM 200.

The wordline interconnect may be formed in the third metal interconnect layer ALC, and the bitline interconnect may be formed in the second metal interconnect layer ALB, differing from the above-described configuration.

As described above, since various interconnects can be formed in the fifth metal interconnect layer ALE of the RAM 200, various types of circuit blocks can be arranged along the direction X as shown in FIGS. 3A and 3B.

2. Data Line Driver 2.1 Configuration of Data Line Driver

Figure 6A:
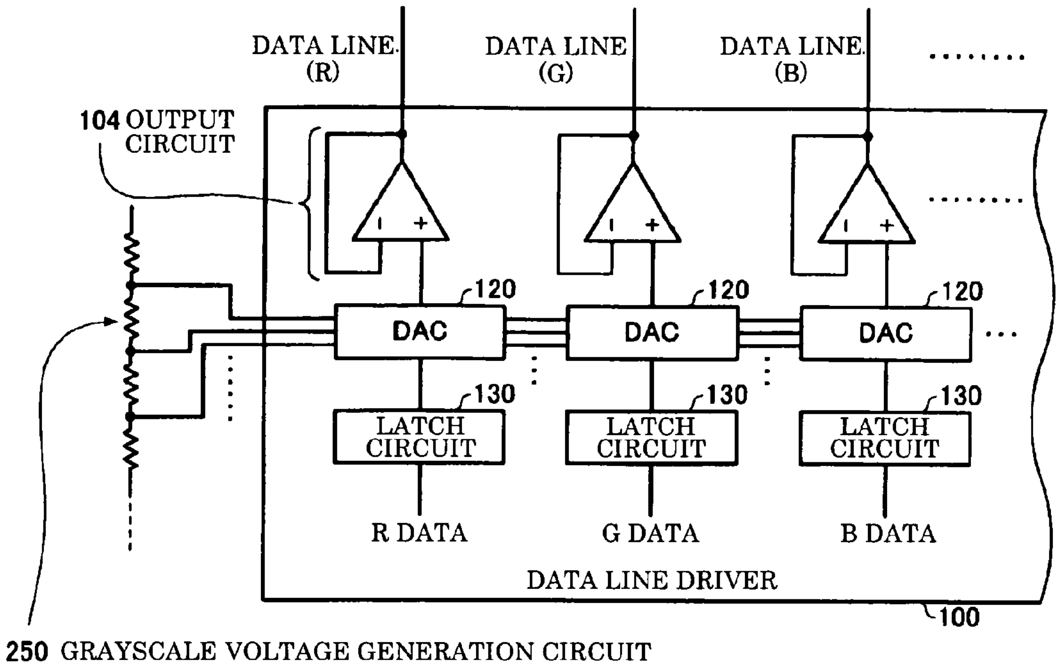
FIGS. 6A and 6B are diagrams showing a configuration example of a data line driver.

FIG. 6A is a diagram showing the data line driver 100. The data line driver 100 includes an output circuit 104, a DAC 120, and a latch circuit 130. The DAC 120 supplies the grayscale voltage to the output circuit 104 based on data latched by the latch circuit 130. The data supplied from the RAM 200 is stored in the latch circuit 130, for example. When the grayscale is set at G bits, G-bit data is stored in each latch circuit 130, for example. A plurality of grayscale voltages are generated according to the grayscale, and supplied to the data line driver 100 from the grayscale voltage generation circuit 250. For example, the grayscale voltages supplied to the data line driver 100 are supplied to the DAC 120. The DAC 120 selects the corresponding grayscale voltage from the grayscale voltages supplied from the grayscale voltage generation circuit 250 based on the G-bit data latched by the latch circuit 130, and outputs the selected grayscale voltage to the output circuit 104.

Figure 6B:
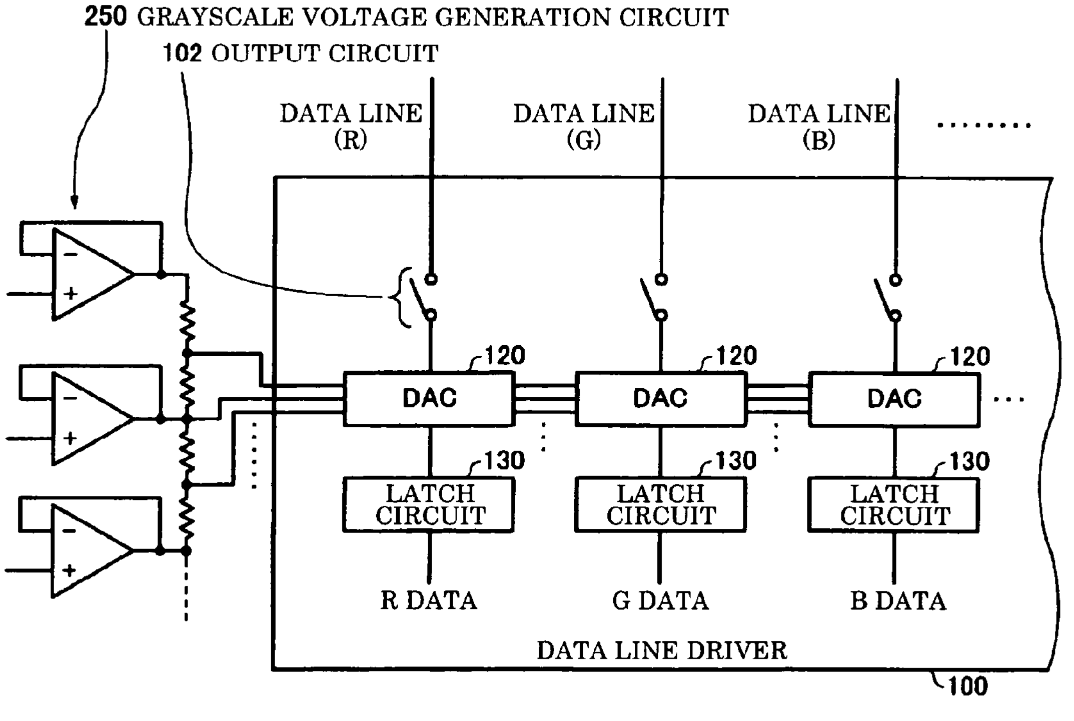

The output circuit 104 is formed by an operational amplifier, for example. However, the invention is not limited thereto. As shown in FIG. 6B, an output circuit 102 may be provided in the data line driver 100 instead of the output circuit 104. In this case, a plurality of operational amplifiers are provided in the grayscale voltage generation circuit 250.

Figure 7:
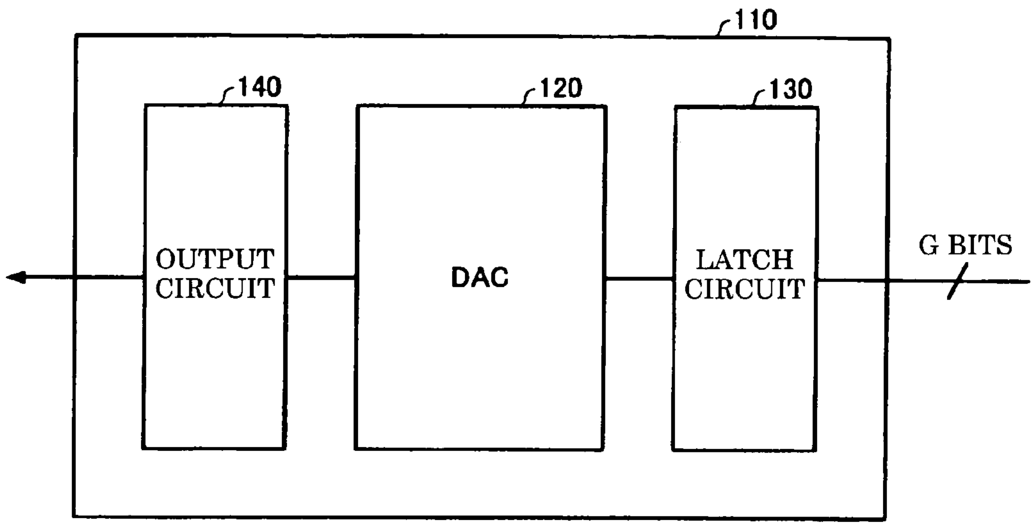
FIG. 7 is a configuration example of a data line driver cell according to the embodiment.

FIG. 7 is a diagram showing a plurality of data line driver cells 110 provided in the data line driver 100. The data line driver 100 drives the data lines, and the data line driver cell 110 drives one of the data lines. For example, the data line driver cell 110 drives one of the R subpixel, the G subpixel, and the B subpixel which make up one pixel. Specifically, when the number of pixels PX in the direction X is 240, 720 (=240×3) data line driver cells 110 in total are provided in the display driver 20. In the 4BANK configuration, 180 data line driver cells 110 are provided in each data line driver 100.

The data line driver cell 110 includes an output circuit 140, the DAC 120, and the latch circuit 130, for example. However, the invention is not limited thereto. For example, the output circuit 140 may be provided outside the data line driver cell 110. The output circuit 140 may be either the output circuit 104 shown in FIG. 6A or the output circuit 102 shown in FIG. 6B.

When the grayscale data indicating the grayscales of the R subpixel, the G subpixel, and the B subpixel is set at G bits, G-bit data is supplied to the data line driver cell 110 from the RAM 200. The latch circuit 130 latches the G-bit data. The DAC 120 outputs the grayscale voltage through the output circuit 140 based on the output from the latch circuit 130. This enables the data line provided in the display panel 10 to be driven.

2.2 Plurality of Readings in One Horizontal Scan Period

Figure 8:
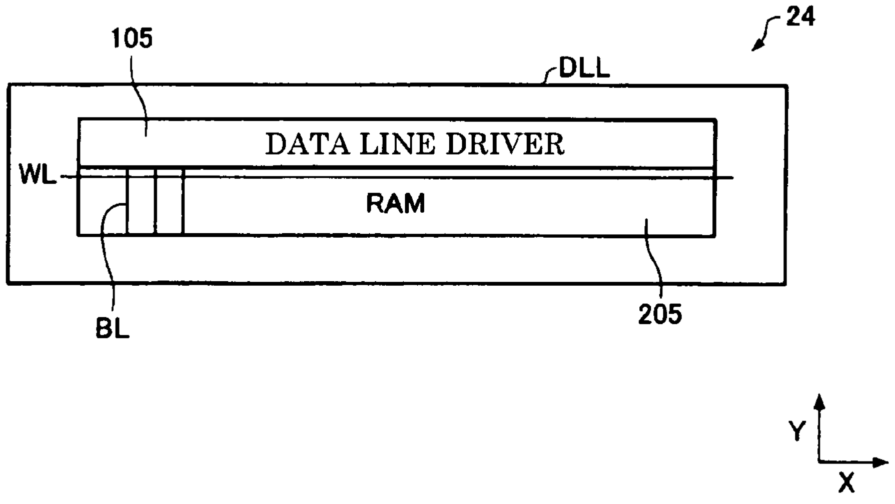
FIG. 8 is a diagram showing a comparative example according to the embodiment.

FIG. 8 shows a display driver 24 of a comparative example according to the embodiment. The display driver 24 is mounted so that a side DLL of the display driver 24 faces the side PL1 of the display panel 10 on the side of the display region 12. The display driver 24 includes a RAM 205 and a data line driver 105 of which the dimension in the direction X is greater than the dimension in the direction Y. The dimensions of the RAM 205 and the data line driver 105 in the direction X are increased as the number of pixels PX of the display panels 10 is increased. The RAM 205 includes a plurality of wordlines WL and a plurality of bitlines BL. The wordline WL of the RAM 205 is formed to extend along the direction X, and the bitline BL is formed to extend along the direction Y. Specifically, the wordline WL is formed to be significantly longer than the bitline BL. Since the bitline BL is formed to extend along the direction Y, the bitline BL is parallel to the data line of the display panel 10 and intersects the side PL1 of the display panel 10 at right angles.

The display driver 24 selects the wordline WL once in the 1H period. The data line driver 105 latches data output from the RAM 205 upon selection of the wordline WL, and drives the data lines. In the display driver 24, since the wordline WL is significantly longer than the bitline BL as shown in FIG. 8, the data line driver 100 and the RAM 205 are longer in the direction X, so that it is difficult to secure space for disposing other circuits in the display driver 24. This hinders a reduction in the chip area of the display driver 24. Moreover, since the design time for securing the space and the like is necessary, a reduction in design cost is made difficult.

Figure 9A:
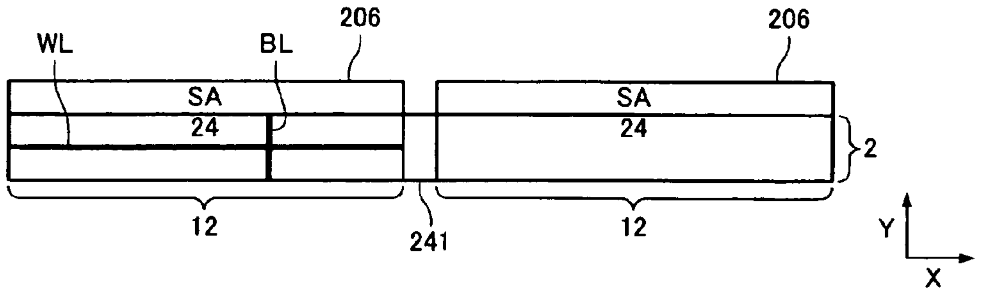
FIGS. 9A to 9D are diagrams illustrative of the effect of a RAM block according to the embodiment.

The RAM 205 shown in FIG. 8 is disposed as shown in FIG. 9A, for example. In FIG. 9A, the RAM 205 is divided into two blocks. The dimension of one of the divided blocks in the direction X is "12", and the dimension in the direction Y is "2", for example. Therefore, the area of the RAM 205 may be indicated by "48". These values indicate an example of the ratio which indicates the size of the RAM 205. The actual size is not limited to these values. In FIGS. 9A to 9D, reference numerals 241 to 244 indicate wordline control circuits, and reference numerals 206 to 209 indicate sense amplifiers.

Figure 9B:
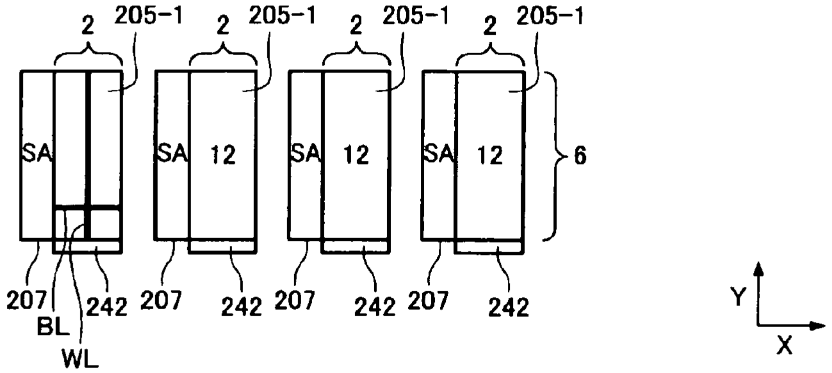

In the embodiment, the RAM 205 may be divided into a plurality of blocks and disposed in a state in which the divided blocks are rotated at 90 degrees. For example, the RAM 205 may be divided into four blocks and disposed in a state in which the divided blocks are rotated at 90 degrees, as shown in FIG. 9B. A RAM 205-1, which is one of the four divided blocks, includes a sense amplifier 207 and the wordline control circuit 242. The dimension of the RAM 205-1 in the direction Y is "6", and the dimension in the direction X is "2". Therefore, the area of the RAM 205-1 is "12" so that the total area of the four blocks is "48". However, since it is desired to reduce the dimension CY of the display driver 20 in the direction Y, the state shown in FIG. 9B is inconvenient.

Figure 9C:
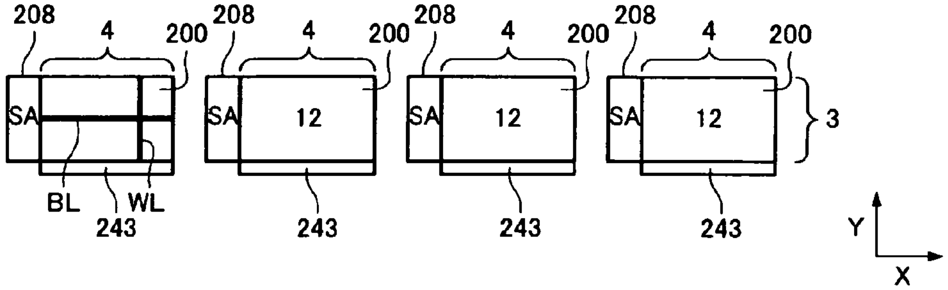
Figure 9D:
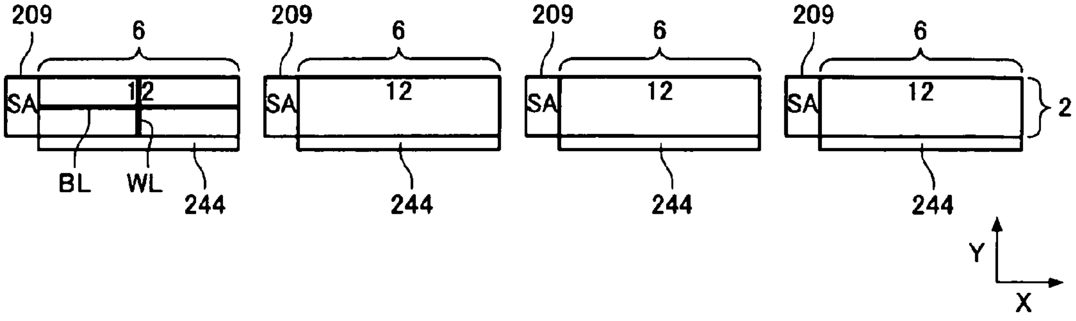

In the embodiment, the dimension RY of the RAM 200 in the direction Y can be reduced by reading data a plurality of times in the 1H period, as shown in FIGS. 9C and 9D. FIG. 9C shows an example of reading data twice in the 1H period. In this case, since the wordline WL is selected twice in the 1H period, the number of memory cells MC arranged in the direction Y can be halved, for example. This enables the dimension of the RAM 200 in the direction Y to be reduced to "3", as shown in FIG. 9C. The dimension of the RAM 200 in the direction X is increased to "4". Specifically, the total area of the RAM 200 becomes "48", so that the RAM 200 becomes equal to the RAM 205 shown in FIG. 9A as to the area of the region in which the memory cells MC are arranged. Since the RAM 200 can be freely disposed as shown in FIGS. 3A and 3B, a very flexible layout becomes possible, whereby an efficient layout can be achieved.

FIG. 9D shows an example of reading data three times. In this case, the dimension "6" of the RAM 205-1 shown in FIG. 9B in the direction Y can be reduced by ⅓. Specifically, the dimension CY of the display driver 20 in the direction Y can be reduced by adjusting the number of readings in the 1H period.

Figure 10:
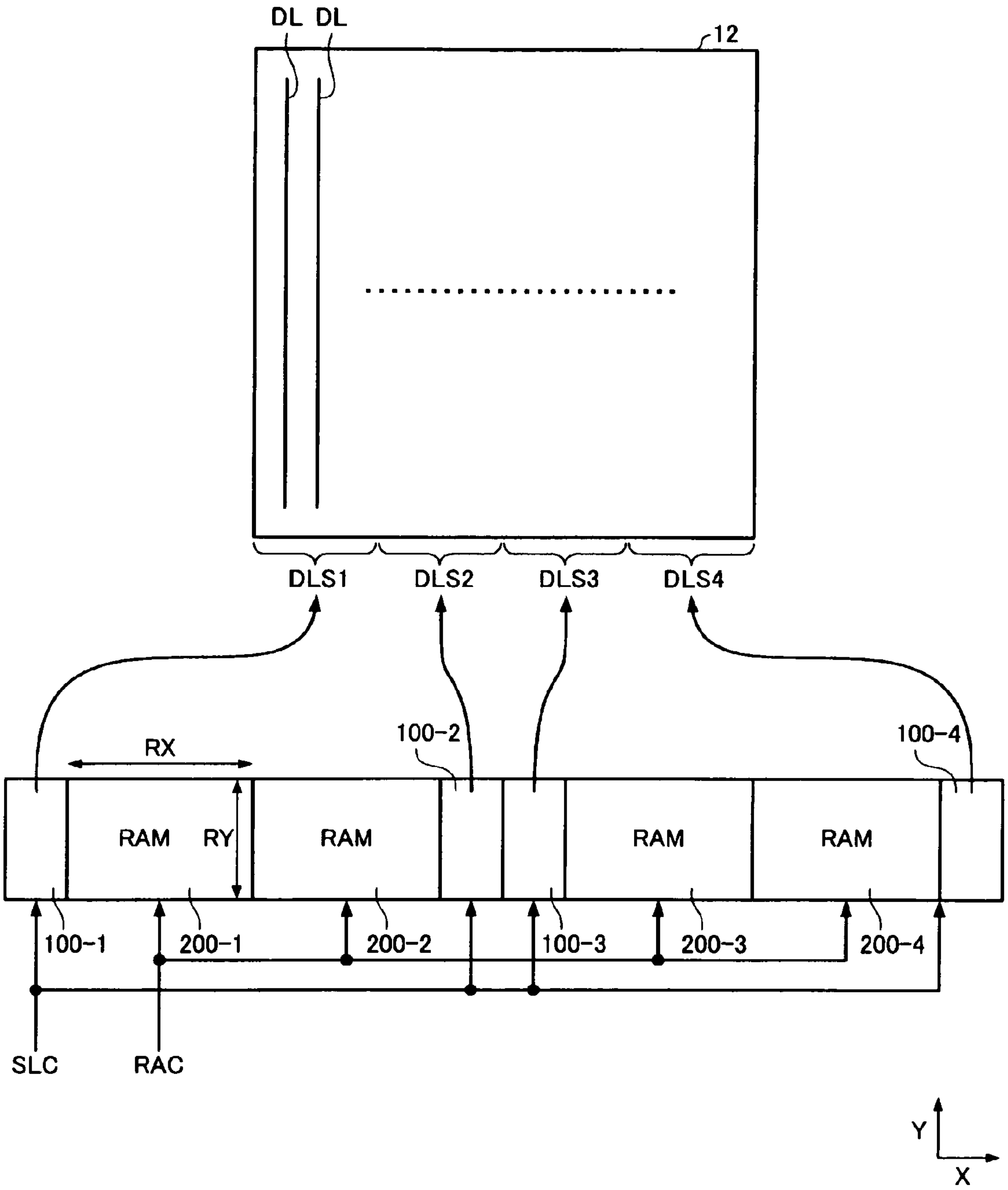
FIG. 10 is a diagram showing the relationship of the RAM blocks according to the embodiment.

In the embodiment, the RAM 200 divided into blocks can be provided in the display driver 20 as described above. In the embodiment, the 4BANK RAMs 200 can be provided in the display driver 20, for example. In this case, data line drivers 100-1 to 100-4 corresponding to each RAM 200 drive the corresponding data lines DL as shown in FIG. 10.

In more detail, the data line driver 100-1 drives a data line group DLS1, the data line driver 100-2 drives a data line group DLS2, the data line driver 100-3 drives a data line group DLS3, and the data line driver 100-4 drives a data line group DLS4. Each of the data line groups DLS1 to DLS4 is one of four blocks into which the data lines DL provided in the display region 12 of the display panel 10 are divided, for example. The data lines of the display panel 10 can be driven by providing four data line drivers 100-1 to 100-4 corresponding to the 4BANK RAM 200 and causing the data line drivers 100-1 to 100-4 to drive the corresponding data lines.

2.3 Divided Structure of Data Line Driver

Figure 11A:
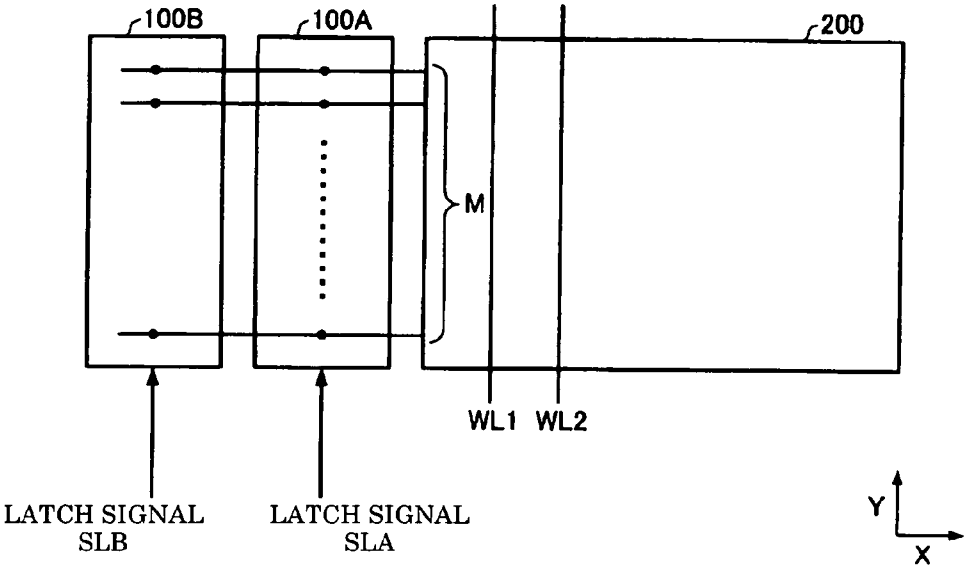
FIGS. 11A and 11B are diagrams illustrative of reading of data from the RAM block.

The dimension RY of the RAM 200 shown in FIG. 4 in the direction Y may depend not only on the number of memory cells MC arranged in the direction Y, but also on the dimension of the data line driver 100 in the direction Y In the embodiment, on the premise that data is read a plurality of times (e.g. twice) in one horizontal scan period in order to reduce the dimension RY of the RAM 200 shown in FIG. 4, the data line driver 100 is formed to have a divided structure consisting of a first data line driver 100A (first divided data line driver in a broad sense) and a second data line driver 100B (second divided data line driver in a broad sense), as shown in FIG. 11A. A reference character "M" shown in FIG. 11A indicates the number of bits of data read from the RAM 200 by one wordline selection.

A plurality of data line driver cells 110 are provided in each of the data line drivers 100A and 100B, as described later with reference to FIGS. 13, 14, 16, 22, and 28. In more detail, M/G data line driver cells 110 are provided in the data line drivers 100A and 100B. When performing a color display, M/3G R data line driver cells 110, M/3G G data line driver cells 110, and M/3G G data line driver cells 110 are provided in each of the data line drivers 100A and 100B.

For example, when the number of pixels PX is 240, the grayscale of the pixel is 18 bits, and the number of BANKs of the RAM 200 is four (4BANK), 1080 (=240×18÷4) bits of data must be output from each RAM 200 when reading data only once in the 1H period.

However, it is desired to reduce the dimension RY of the RAM 200 in order to reduce the chip area of the display driver 100. Therefore, as shown in FIG. 11A, the data line driver 100 is divided into the data line drivers 100A and 100B in the direction X on the premise that data is read twice in the 1H period, for example. This enables M to be set at 540 (=1080÷2) so that the dimension RY of the RAM 200 can be approximately halved.

The data line driver 100A drives a part of the data lines of the display panel 10. The data line driver 100B drives a part of the data lines of the display panel 10 other than the data lines driven by the data line driver 100A. As described above, the data line drivers 100A and 100B cooperate to drive the data lines of the display panel 10.

Figure 11B:
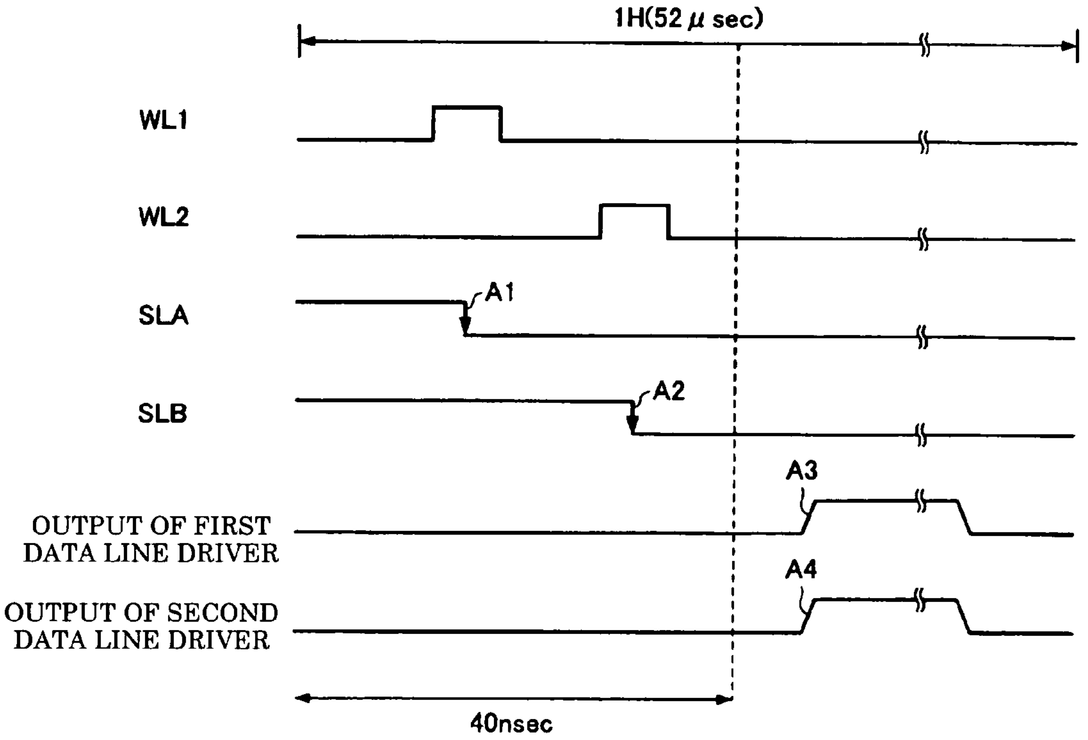

In more detail, the wordlines WL1 and WL2 are selected in the 1H period as shown in FIG. 11B, for example. Specifically, the wordlines are selected twice in the 1H period. A latch signal SLA falls at a timing A1. The latch signal SLA is supplied to the data line driver 100A, for example. The data line driver 100A latches M-bit data supplied from the RAM 200 in response to the falling edge of the latch signal SLA, for example.

A latch signal SLB falls at a timing A2. The latch signal SLB is supplied to the data line driver 100B, for example. The data line driver 100B latches M-bit data supplied from the RAM 200 in response to the falling edge of the latch signal SLB, for example.

Figure 12:
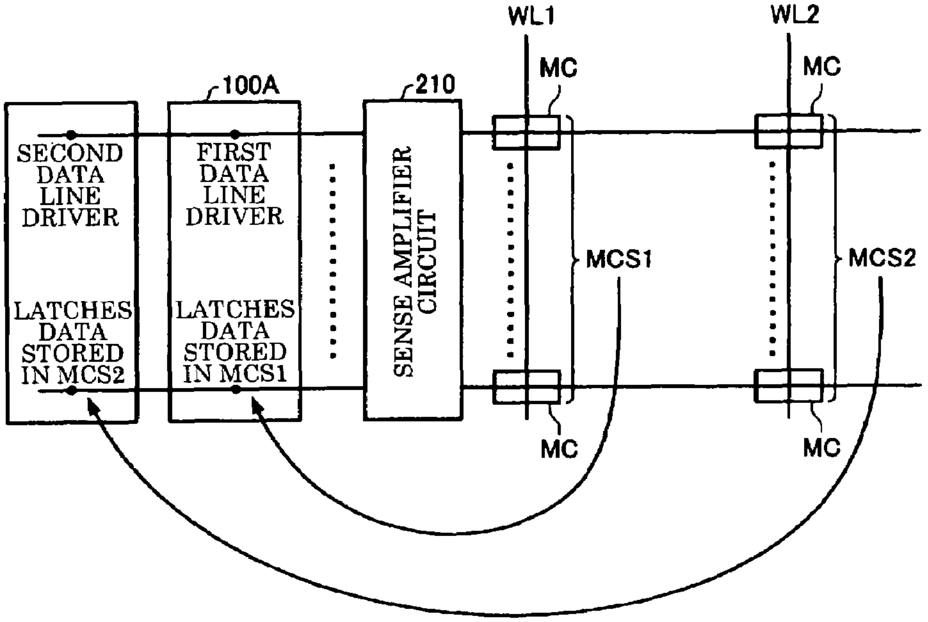
FIG. 12 is a diagram illustrative of data latching of a divided data line driver block according to the embodiment.

In more detail, data stored in a memory cell group MCS1 (M memory cells) is supplied to the data line drivers 100A and 100B through a sense amplifier circuit 210 upon selection of the wordline WL1, as shown in FIG. 12. However, since the latch signal SLA falls in response to the selection of the wordline WL1, the data stored in the memory cell group MCS1 (M memory cells) is latched by the data line driver 100A.

Upon selection of the wordline WL2, data stored in a memory cell group MCS2 (M memory cells) is supplied to the data line drivers 100A and 100B through the sense amplifier circuit 210. The latch signal SLB falls in response to the selection of the wordline WL2. Therefore, the data stored in the memory cell group MCS2 (M memory cells) is latched by the data line driver 100B.

For example, when M is set at 540 bits, M=540 bits of data is latched by each of the data line drivers 100A and 100B, since the data is read twice in the 1H period. Specifically, 1080 bits of data in total is latched by the data line driver 100 so that 1080 bits necessary for the above-described example can be latched in the 1H period. Therefore, the amount of data necessary in the 1H period can be latched, and the dimension RY of the RAM 200 can be approximately halved. This enables the block width ICY of the display driver 20 to be reduced, whereby the manufacturing cost of the display driver 20 can be reduced.

FIGS. 11A and 11B illustrate an example of reading data twice in the 1H period. However, the invention is not limited thereto. For example, data may be read four or more times in the 1H period. When reading data four times, the data line driver 100 may be divided into four blocks so that the dimension RY of the RAM 200 can be further reduced. In this case, M may be set at 270 in the above-described example, and 270-bit data is latched by each of the four divided data line drivers. Specifically, 1080 bits of data necessary in the 1H period can be supplied while reducing the dimension RY of the RAM 200 by approximately ¼.

The outputs of the data line drivers 100A and 100B may be caused to rise based on control by using a data line enable signal (not shown) or the like as indicated by A3 and A4 shown in FIG. 11B, or the data latched by the data line drivers 100A and 100B at the timings A1 and A2 may be directly output to the data lines. An additional latch circuit may be provided to each of the data line drivers 100A and 100B, and voltages based on the data latched at the timings A1 and A2 may be output in the next 1H period. This enables the number of readings in the 1H period to be increased without causing the image quality to deteriorate.

When the number of pixels PY is 320 (the number of scan lines of the display panel 10 is 320) and 60 frames are displayed within one second, the 1H period is about 52 μs as shown in FIG. 11B. The 1H period is calculated as indicated by "1 sec÷60 frames÷320≈52 μs". As shown in FIG. 11B, the wordlines are selected within about 40 nsec. Specifically, since the wordlines are selected (data is read from the RAM 200) a plurality of times within a period sufficiently shorter than the 1H period, deterioration of the image quality of the display panel 10 does not occur.

The value M can be obtained by using the following equation, when BNK denotes the number of BANKs, N denotes the number of readings in the 1H period, and "the number of pixels PX×3" means the number of pixels (or the number of subpixels in the embodiment) corresponding to the data lines of the display panel 10 and coincides with the number of data lines DLN:

$$M = \frac{PX \times 3 \times G}{BNK \times N}$$

In the embodiment, the sense amplifier circuit 210 has a latch function. However, the invention is not limited thereto. For example, the sense amplifier circuit 210 need not have a latch function.

2.4 Subdivision of Data Line Driver

Figure 13:
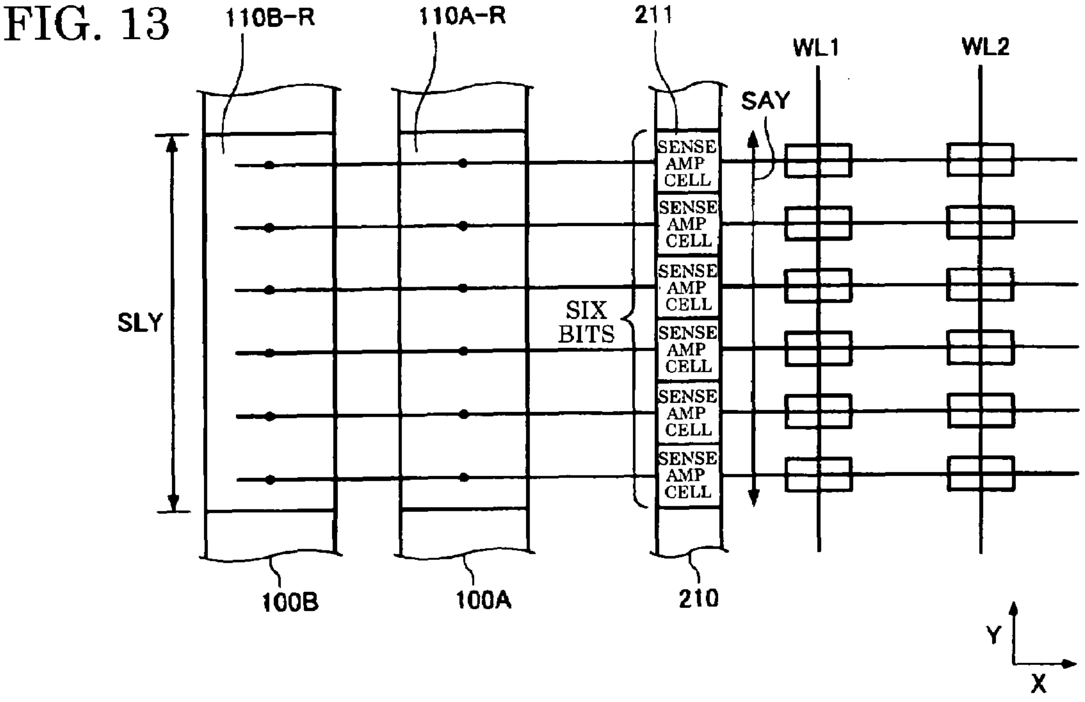
FIG. 13 is a diagram showing the relationship between the data line driver cells and sense amplifiers according to the embodiment.

FIG. 13 is a diagram illustrative of the relationship between the RAM 200 and the data line driver 100 for the R subpixel among the subpixels which make up one pixel as an example.

When the grayscale G bits of each subpixel are set at six bits (64 grayscales), 6-bit data is supplied from the RAM 200 to data line driver cells 110A-R and 110B-R for the R subpixel. In order to supply the 6-bit data, six sense amplifier cells 211 among the sense amplifier cells 211 included in the sense amplifier circuit 210 of the RAM 200 correspond to each data line driver cell 110, for example.

For example, it is necessary that a dimension SCY of the data line driver cell 110A-R in the direction Y be within a dimension SAY of the six sense amplifier cells 211 in the direction Y. Likewise, it is necessary that the dimension of each data line driver cell in the direction Y be within the dimension SAY of the six sense amplifier cells 211. When the dimension SCY cannot be set within the dimension SAY of the six sense amplifier cells 211, the dimension of the data line driver 100 in the direction Y becomes greater than the dimension RY of the RAM 200, whereby the layout efficiency is decreased.

The size of the RAM 200 has been reduced in view of the process, and the sense amplifier cell 211 is also small. As shown in FIG. 7, a plurality of circuits are provided in the data line driver cell 110. In particular, it is difficult to design the DAC 120 and the latch circuit 130 to have a small circuit size. Moreover, the size of the DAC 120 and the latch circuit 130 is increased as the number of bits input is increased. Specifically, it may be difficult to set the dimension SCY within the total dimension SAY of the six sense amplifier cells 211.

Figure 14:
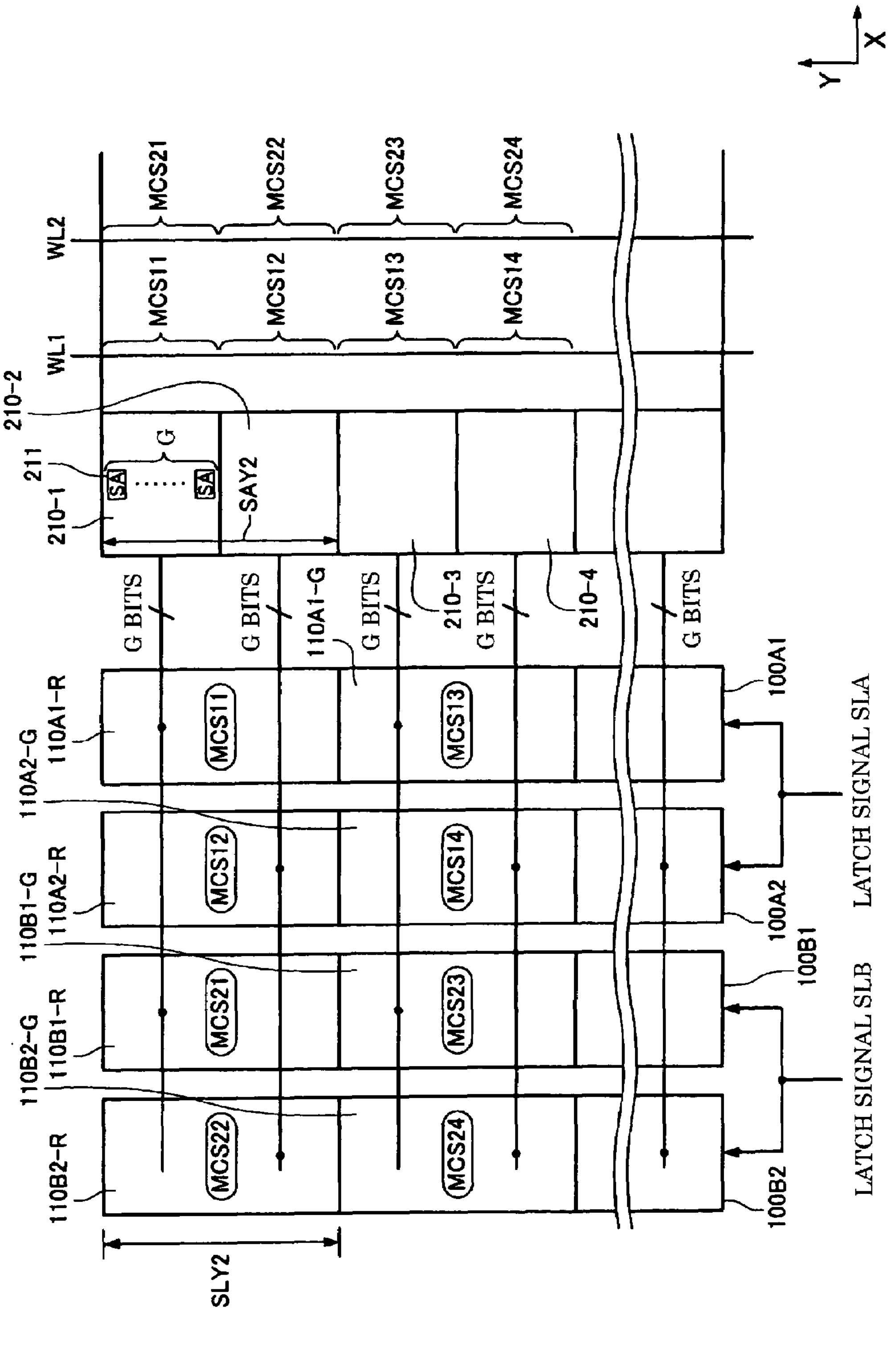
FIG. 14 is another configuration example of the divided data line driver blocks according to the embodiment.

In the embodiment, the data line drivers 100A and 100B divided by the number of readings N in the 1H period may be further divided into k (k is an integer larger than 1) blocks and stacked in the direction X. FIG. 14 shows a configuration example in which each of the data line drivers 100A and 100B is divided into two (k=2) blocks and stacked in the RAM 200 set to read data twice (N=2) in the 1H period. FIG. 14 shows the configuration example of the RAM 200 set to read data twice. However, the invention is not limited to the configuration example shown in FIG. 14. When the RAM 200 is set to read data four times (N=4), the data line driver is divided into eight (N×k=4×2=8) blocks in the direction X, for example.

As shown in FIG. 14, the data line drivers 100A and 100B shown in FIG. 13 are respectively divided into data line drivers 100A1 and 100A2 and data line drivers 100B1 and 100B2. The dimension of a data line driver cell 110A1-R or the like in the direction Y is set at SCY2. In FIG. 14, the dimension SCY2 is set within a dimension SAY2 in the direction Y when G×2 sense amplifier cells 211 are arranged. Specifically, since the acceptable dimension in the direction Y is increased in comparison with FIG. 13 when forming each data line driver cell 110, efficient design in view of layout can be achieved.

The operation of the configuration shown in FIG. 14 is described below. When the wordline WL1 is selected, M-bit data in total is supplied to at least one of the data line drivers

100A1, 100A2, 100B1, and 100B2 through the sense amplifier blocks 210-1, 210-2, 210-3, and 210-4, for example. G-bit data output from the sense amplifier block 210-1 is supplied to the data line driver cells 110A1-R and 100-B1-R, for example. G-bit data output from the sense amplifier block 210-2 is supplied to the data line driver cells 110A2-R and 110-B2-R, for example. In this case, M/(G×S) data line driver cells 110 are provided in each of the subdivided data line drivers 100A1, 100A2, 100B1, and 100B2.

The latch signal SLA (first latch signal in a broad sense) falls in response to the selection of the wordline WL1 in the same manner as in the timing chart shown in FIG. 11B. The latch signal SLA is supplied to the data line driver 100A1 including the data line driver cell 110A1-R and the data line driver 100A2 including the data line driver cell 110A2-R. Therefore, G-bit data (data stored in the memory cell group MCS11) output from the sense amplifier block 210-1 in response to the selection of the wordline WL1 is latched by the data line driver cell 110A1-R. Likewise, G-bit data (data stored in the memory cell group MCS12) output from the sense amplifier block 210-2 in response to the selection of the wordline WL1 is latched by the data line driver cell 110A2-R.

The above description also applies to the sense amplifier blocks 210-3 and 210-4. Specifically, data stored in the memory cell group MCS13 is latched by the data line driver cell 110A1-G, and data stored in the memory cell group MCS14 is latched by the data line driver cell 110A2-G.

When the wordline WL2 is selected, the latch signal SLB (the N-th latch signal in a broad sense) falls in response to the selection of the wordline WL2. The latch signal SLB is supplied to the data line driver 100B1 including the data line driver cell 110B1-R and the data line driver 100B2 including the data line driver cell 110B2-R. Therefore, G-bit data (data stored in the memory cell group MCS21) output from the sense amplifier block 210-1 in response to the selection of the wordline WL2 is latched by the data line driver cell 110B1-R. Likewise, G-bit data (data stored in the memory cell group MCS22) output from the sense amplifier block 210-2 in response to the selection of the wordline WL2 is latched by the data line driver cell 110B2-R.

The above description also applies to the sense amplifier blocks 210-3 and 210-4 when the wordline WL2 is selected. Specifically, data stored in the memory cell group MCS23 is latched by the data line driver cell 110B1-C and data stored in the memory cell group MCS24 is latched by the data line driver cell 110B2-G. A data line driver cell 110A1-B is a B data line driver cell which latches B subpixel data.

The R data line driver cell, the G data line driver cell, and the B data line driver cell are arranged in each of the data line drivers 100A and 100B along the direction Y (second direction in a broad sense).

Figure 15A:
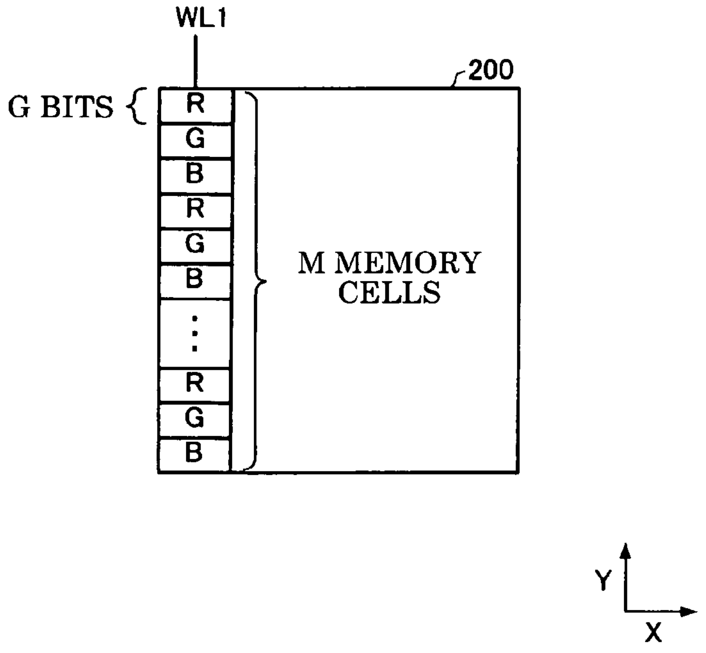
FIGS. 15A and 15B are diagrams illustrative of an arrangement of data stored in the RAM block.
Figure 15B:
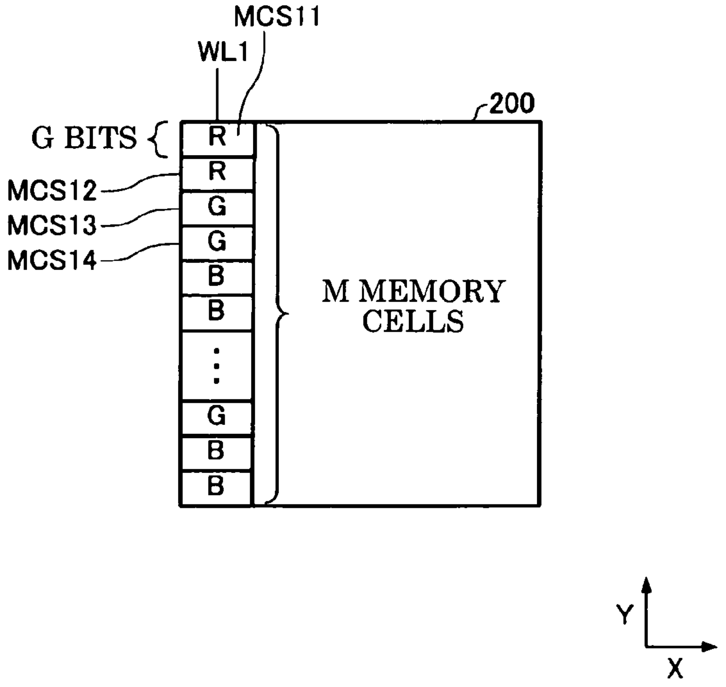

FIG. 15B shows data stored in the RAM 200 when the data line drivers 100A and 100B are divided as described above. As shown in FIG. 15B, data in the sequence R subpixel data, R subpixel data, G subpixel data, G subpixel data, B subpixel data, B subpixel data, . . . is stored in the RAM 200 along the direction Y. In the configuration as shown in FIG. 13, data in the sequence R subpixel data, G subpixel data, B subpixel data, R subpixel data, . . . is stored in the RAM 200 along the direction Y, as shown in FIG. 15A.

In FIG. 13, the dimension SAY is illustrated as the dimension of the six sense amplifier cells 211. However, the invention is not limited thereto. For example, the dimension SAY corresponds to the dimension of eight sense amplifier cells 211 when the grayscale is eight bits.

Figure 16:
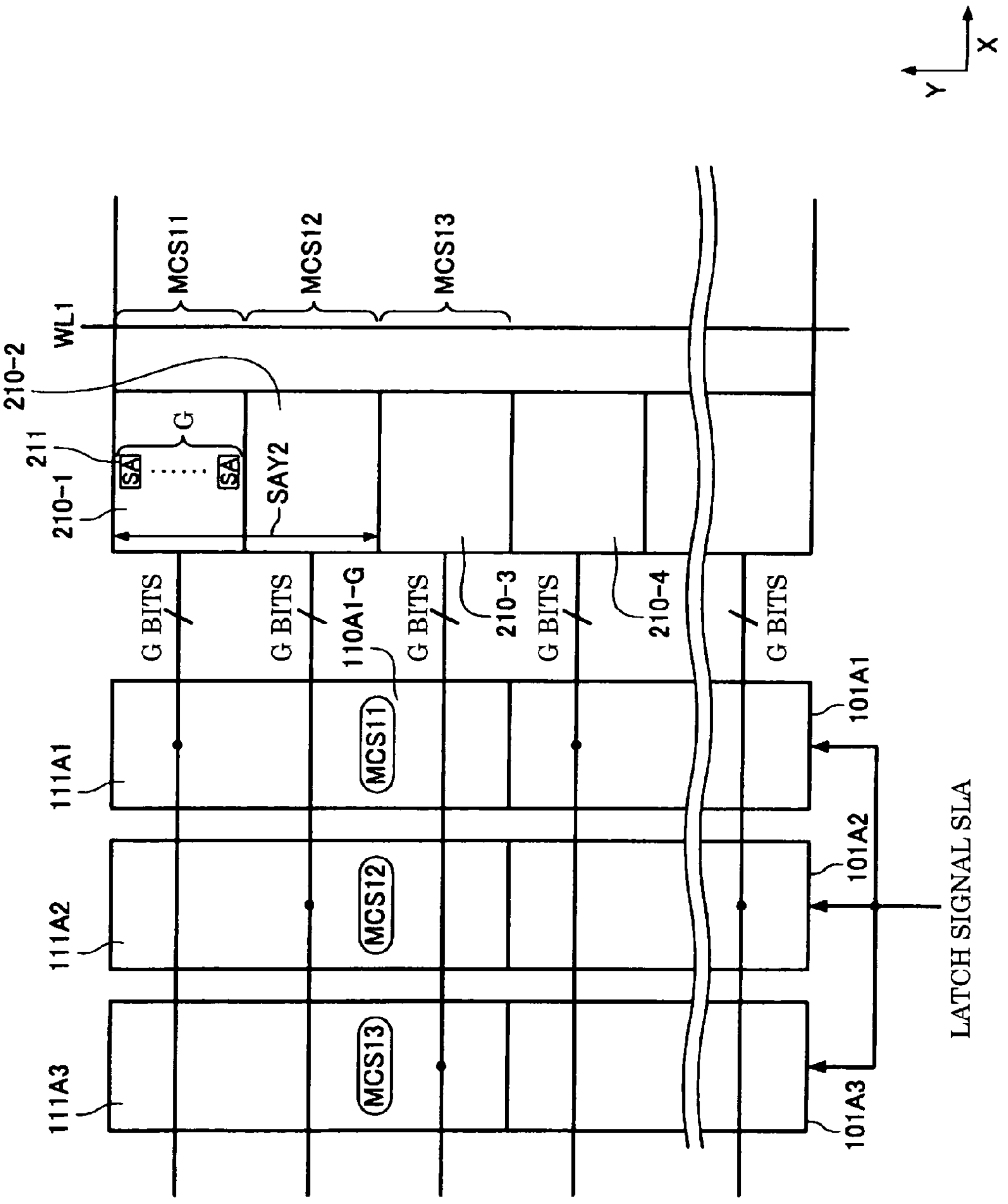
FIG. 16 is another configuration example of the divided data line driver blocks according to the embodiment.

FIG. 14 illustrates the configuration in which the data line drivers 100A and 100B are divided into two (k=2) blocks as an example. However, the invention is not limited thereto. For example, the data line drivers 100A and 100B may be divided into three (k=3) blocks or four (k=4) blocks. When the data line driver 100A is divided into three (k=3) blocks, the same latch signal SLA may be supplied to the three divided blocks, for example. As a modification of the number of divisions k equal to the number of readings in the 1H period, when the data line driver is divided into three (k=3) blocks, the divided blocks may be respectively used as an R subpixel data driver, G subpixel data driver, and B subpixel data driver. This configuration is shown in FIG. 16. FIG. 16 shows three divided data line drivers 101A1 (first subdivided data line driver in a broad sense), 100A2 (second subdivided data line driver in a broad sense), and 101A3. The data line driver 101A1 includes a data line driver cell 111A1 (third or Sth subdivided data line driver in a broad sense), the data line driver 101A2 includes a data line driver cell 111A2, and the data line driver 101A3 includes a data line driver cell 111A3.

The latch signal SLA falls in response to selection of the wordline WL1. The latch signal SLA is supplied to the data line drivers 101A1, 101A2, and 101A3 in the same manner as described above.

According to this configuration, data stored in the memory cell group MCS11 is stored in the data line driver cell 111A1 as R subpixel data upon selection of the wordline WL1, for example. Likewise, data stored in the memory cell group MCS12 is stored in the data line driver cell 111A2 as G subpixel data, and data stored in the memory cell group MCS13 is stored in the data line driver cell 111A3 as B subpixel data, for example.

Therefore, the data written into the RAM 200 can be arranged in the order of R subpixel data, G subpixel data, and B subpixel data along the direction Y, as shown in FIG. 15A. In this case, the data line drivers 101A1, 101A2, and 101A3 may be further divided into k blocks.

3. RAM 3.1 Configuration of Memory Cell

Figure 17A:
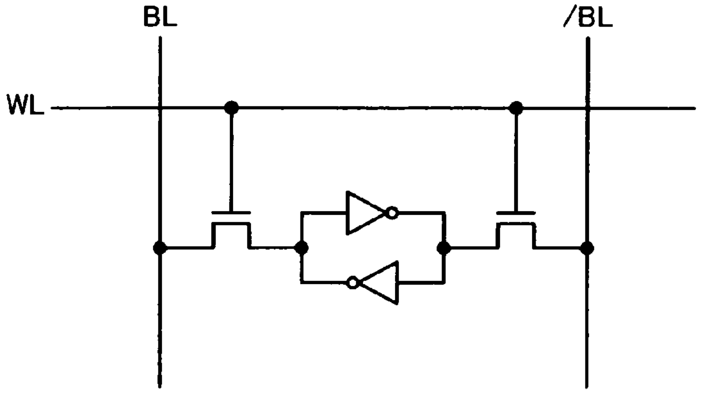
FIGS. 17A to 17C are diagrams showing a configuration of a memory cell according to the embodiment.
Figure 17B:
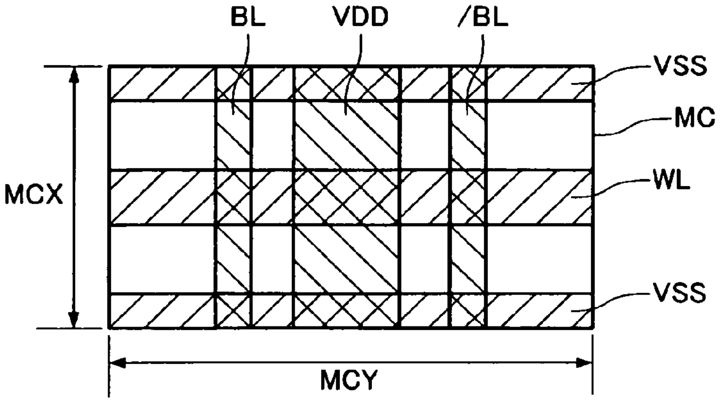
Figure 17C:
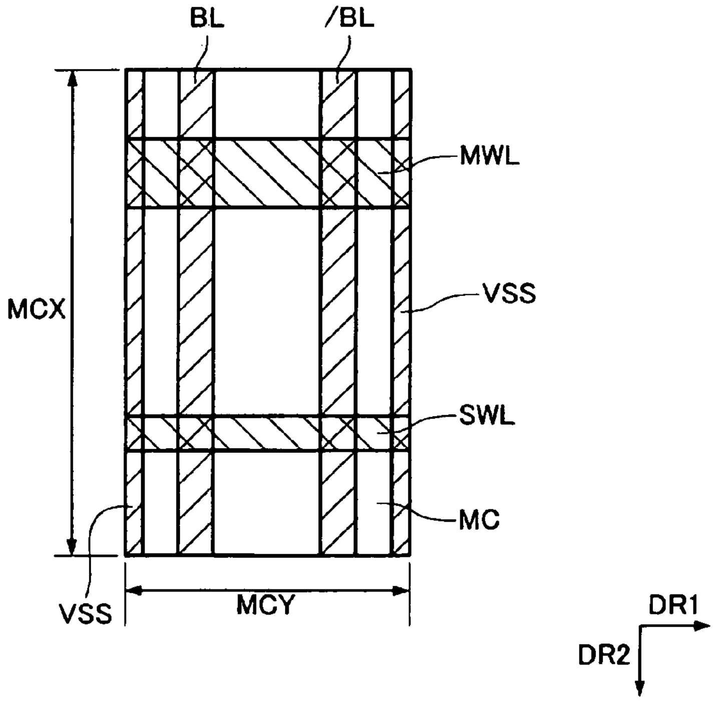

Each memory cell MC may be formed by a static random access memory (SRAM), for example. FIG. 17A shows an example of a circuit of the memory cell MC. FIGS. 17B and 17C show examples of the layout of the memory cell MC.

FIG. 17B shows a layout example of a horizontal cell, and FIG. 17C shows a layout example of a vertical cell. As shown in FIG. 17B, the horizontal cell is a cell in which a length MCY of the wordline WL is greater than lengths MCX of the bitlines BL and /BL in each memory cell MC. As shown in FIG. 17C, the vertical cell is a cell in which the lengths MCX of the bitlines BL and /BL are greater than the length MCY of the wordline WL in each memory cell MC. FIG. 17C shows a sub-wordline SWL formed by a polysilicon layer and a main-wordline MWL formed by a metal layer. The main-wordline MWL is used as backing.

Figure 18:
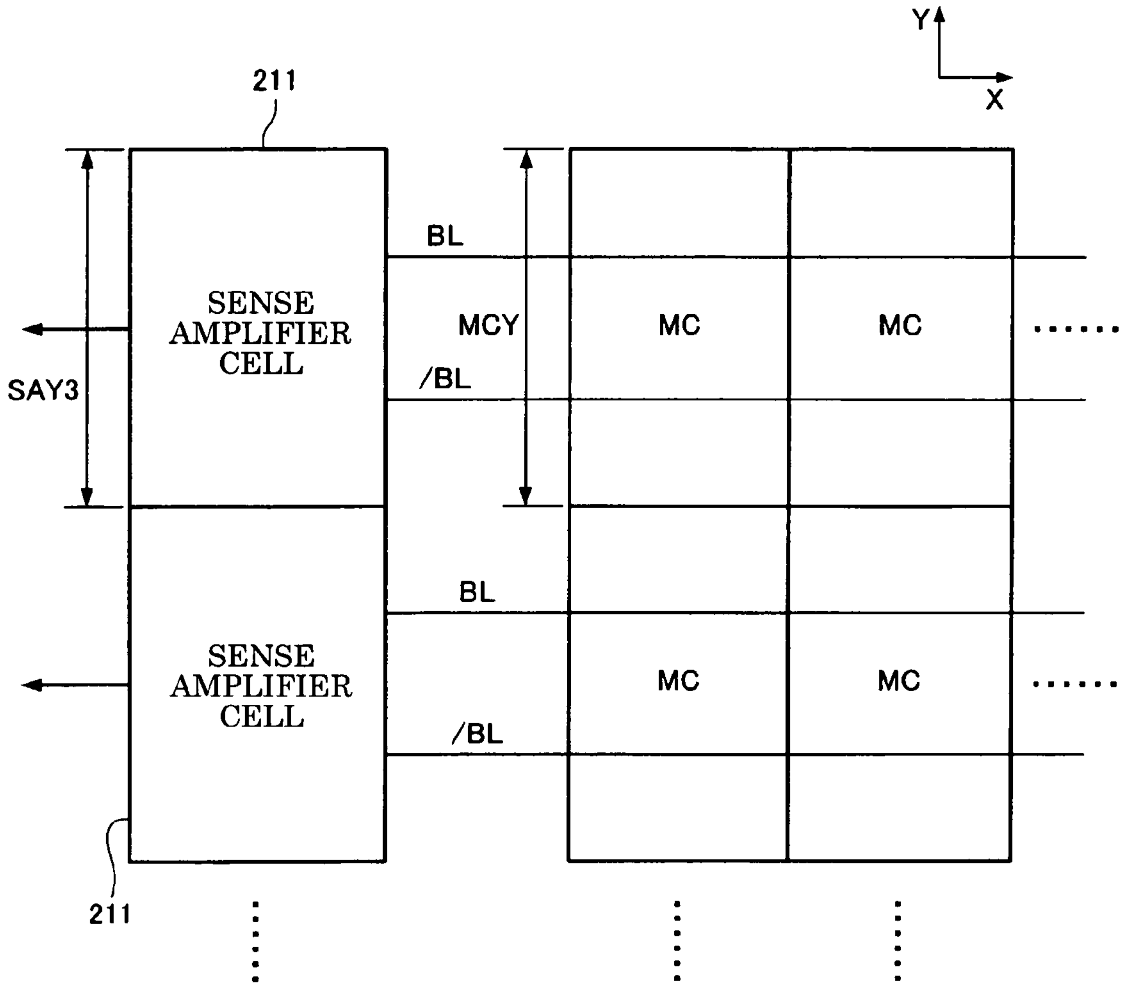
FIG. 18 is a diagram showing the relationship between horizontal cells shown in FIG. 17B and the sense amplifiers.
Figure 19:
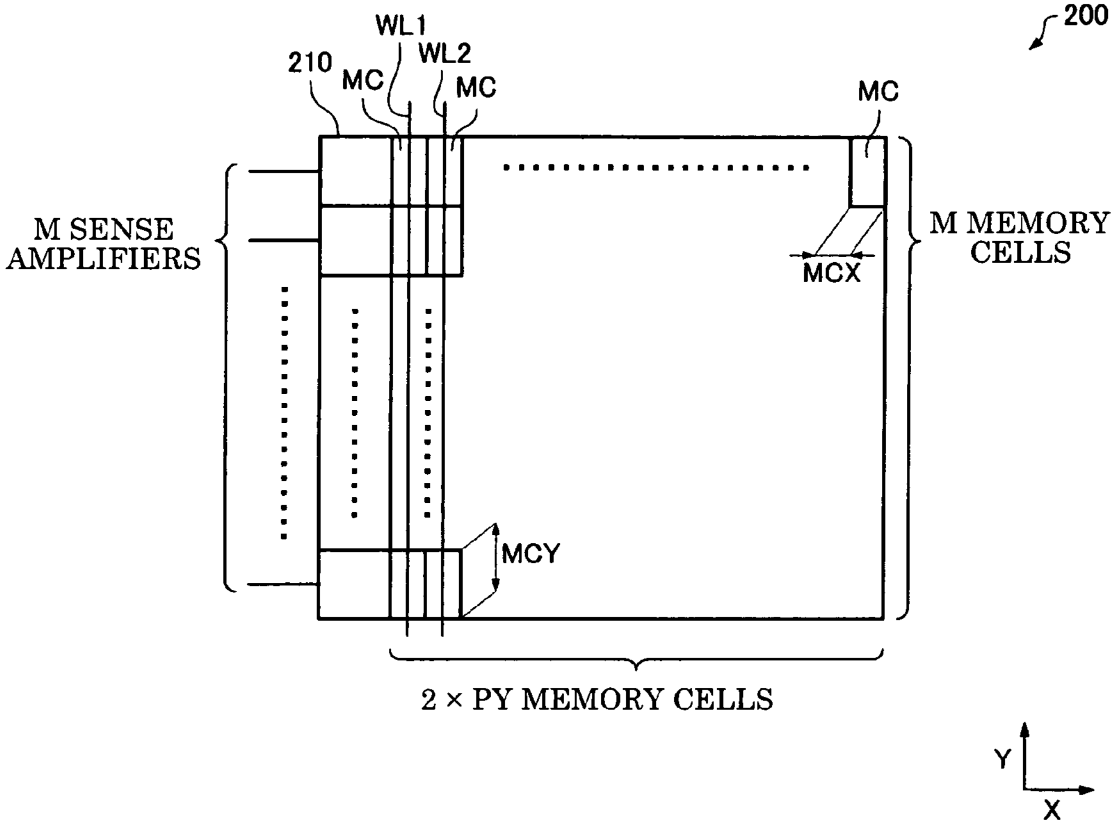
FIG. 19 is a diagram showing the relationship between a memory cell array using the horizontal cells shown in FIG. 17B and the sense amplifiers.

FIG. 18 shows the relationship between the horizontal cell MC and the sense amplifier cell 211. In the horizontal cell MC shown in FIG. 17B, a pair of bitlines BL and/BL is arranged along the direction X as shown in FIG. 18. Therefore, the dimension MCY of the long side of the horizontal cell MC is the dimension in the direction Y. The sense amplifier cell 211 requires a predetermined dimension SAY3 in the direction Y in view of the circuit layout, as shown in FIG. 18. Therefore, the horizontal memory cells MC for one bit (PY memory cells in the direction X) are easily disposed for one sense amplifier cell 211, as shown in FIG. 18. Therefore, when the total number of bits read from each RAM 200 in the 1H period is set at M as described by using the above equation, M memory cells MC may be arranged in the RAM 200 in the direction Y, as shown in FIG. 19. The example in which the RAM 200 includes M memory cells MC and M sense amplifier cells 211 in the direction Y in FIGS. 13 to 16 may be applied when using the horizontal cells. When the horizontal cell as shown in FIG. 19 is used and data is read by selecting different wordlines WL twice in the 1H period, the number of memory cells MC arranged in the RAM 200 in the direction X is "number of pixels PY×number of readings(2)". However, since the dimension MCX of the horizontal memory cell MC in the direction X is relatively small, the size of the RAM 200 in the direction X is not increased even if the number of memory cells MC arranged in the direction X is increased.

As an advantage of using the horizontal cell, an increase in the degrees of freedom of the dimension MCY of the RAM 200 in the direction Y can be given. Since the dimension of the horizontal cell in the direction Y can be adjusted, a cell layout having a ratio of the dimension in the direction Y to the dimension in the direction X of 2:1 or 1.5:1 may be provided. In this case, when the number of horizontal cells arranged in the direction Y is set at 100, the dimension MCY of the RAM 200 in the direction Y can be designed in various ways by using the above-mentioned ratio. On the other hand, when using the vertical cell shown in FIG. 17C, the dimension MCY of the RAM 200 in the direction Y is determined by the number of sense amplifier cells 211 in the direction Y so that the degrees of freedom are small.

3.2 Common Use of Sense Amplifier for Vertical Cells

Figure 21A:
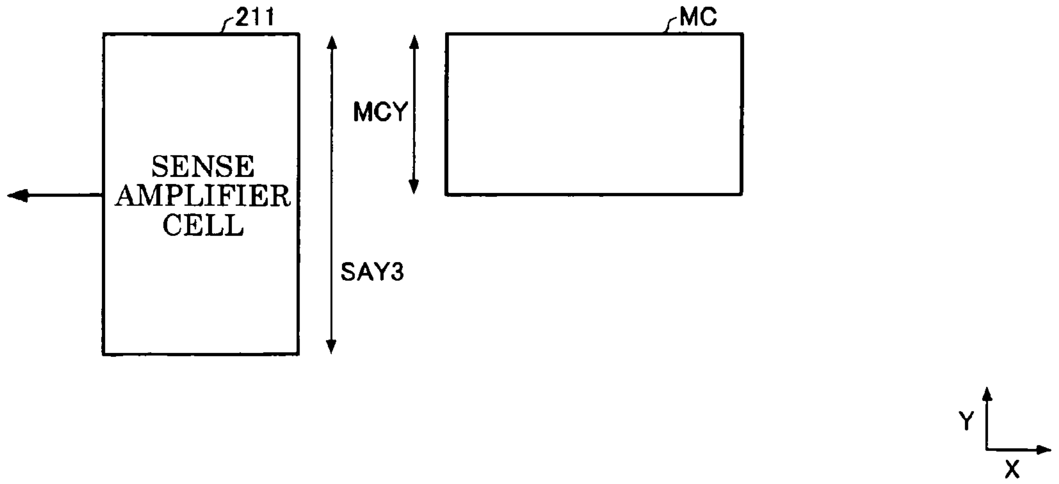
FIG. 21A is a diagram showing the relationship between the sense amplifier and a vertical memory cell according to the embodiment.

As shown in FIG. 21A, the dimension SAY3 of the sense amplifier cell 211 in the direction Y is sufficiently greater than the dimension MCY of the vertical memory cell MC. Therefore, the layout in which the memory cell MC for one bit is associated with one sense amplifier cell 211 when selecting the wordline WL is inefficient.

Figure 21B:
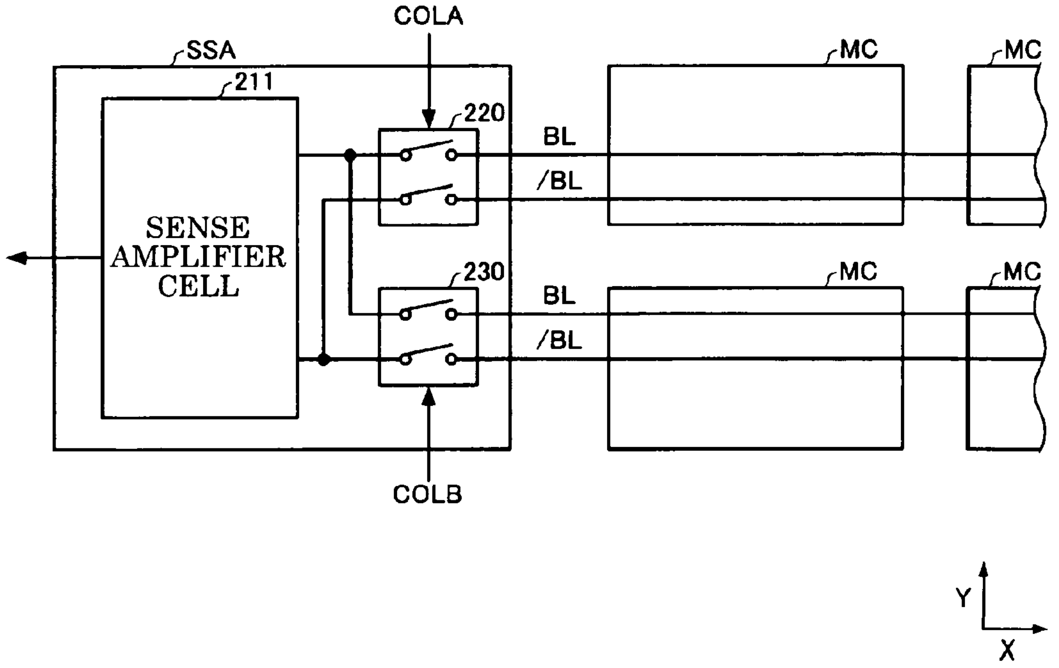
FIG. 21B is a diagram showing a selective sense amplifier SSA according to the embodiment.

To deal with this problem, the memory cells MC for a plurality of bits (e.g. two bits) are associated with one sense amplifier cell 211 when selecting the wordline WL, as shown in FIG. 21B. This enables the memory cells MC to be efficiently arranged in the RAM 200 irrespective of the difference between the dimension SAY3 of the sense amplifier cell 211 and the dimension MCY of the memory cell MC.

In FIG. 21B, a selective sense amplifier SSA includes the sense amplifier cell 211, a switch circuit 220, and a switch circuit 230. The selective sense amplifier SSA is connected with two pairs of bitlines BL and /BL, for example.

The switch circuit 220 connects one pair of bitlines BL and /BL with the sense amplifier cell 211 based on a select signal COLA (sense amplifier select signal in a broad sense). The switch circuit 230 connects the other pair of bitlines BL and /BL with the sense amplifier cell 211 based on a select signal COLB. The signal levels of the select signals COLA and COLB are controlled exclusively, for example. In more detail, when the select signal COLA is set as a signal which sets the switch circuit 220 to active, the select signal COLB is set as a signal which sets the switch circuit 230 to inactive. Specifically, the selective sense amplifier SSA selects 1-bit data from 2-bit (N-bit in a broad sense) supplied through the two pairs of bitlines BL and /BL, and outputs the corresponding data, for example.

Figure 22:
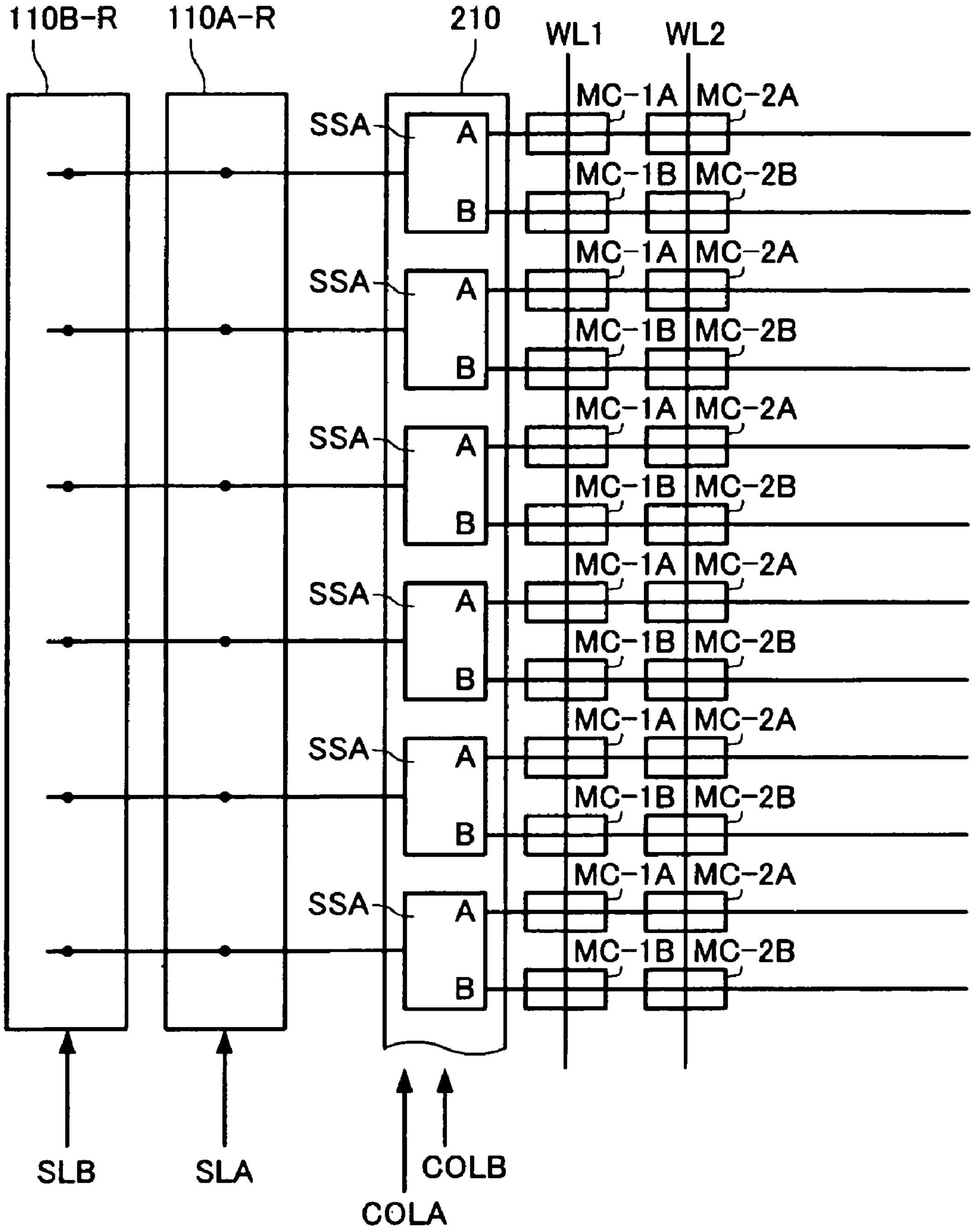
FIG. 22 is a diagram showing the divided data line driver blocks and the selective sense amplifiers according to the embodiment.
Figure 23:
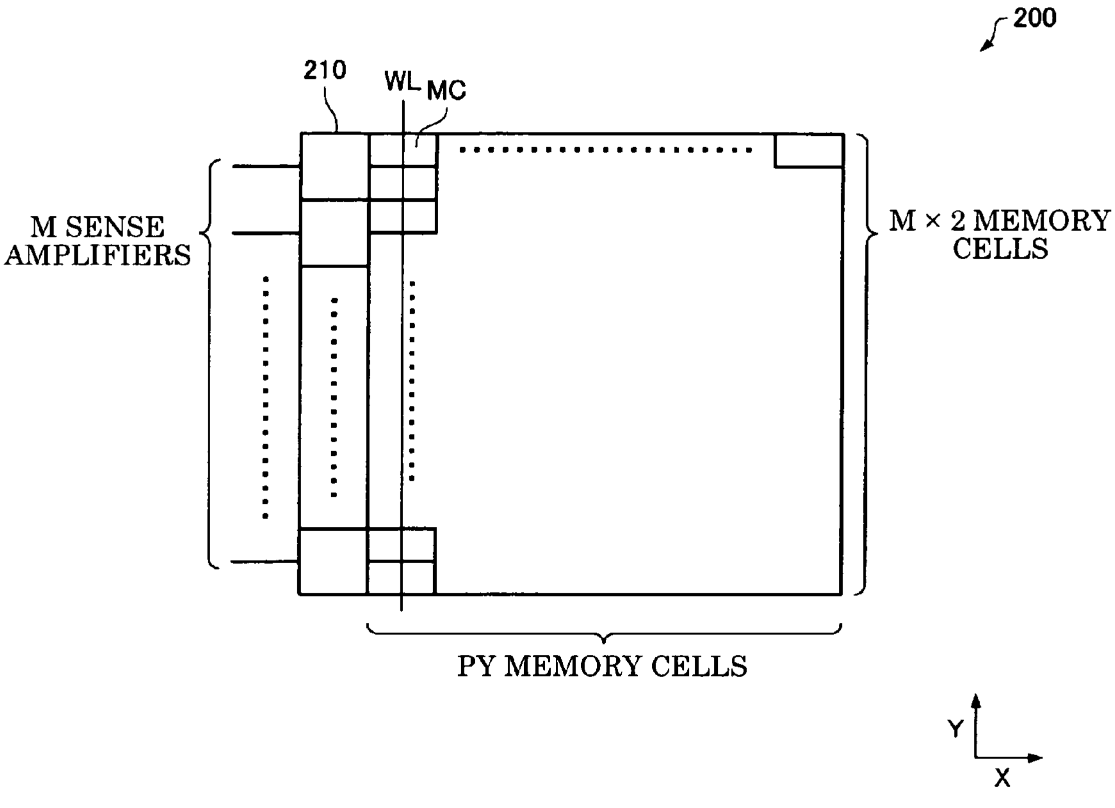
FIG. 23 is an arrangement example of the memory cells according to the embodiment.

FIG. 22 shows the RAM 200 including the selective sense amplifier SSA. FIG. 22 shows a configuration in which data is read twice (N times in a broad sense) in the 1H period and the grayscale G bits are six bits as an example. In this case, M selective sense amplifiers SSA are provided in the RAM 200 as shown in FIG. 23. Therefore, data supplied to the data line driver 100 by one wordline selection is M bits in total. On the other hand, M×2 memory cells MC are arranged in the RAM 200 shown in FIG. 23 in the direction Y. The memory cells MC in the same number as the number of pixels PY are arranged in the direction X, differing from FIG. 19. In the RAM 200 shown in FIG. 23, since the two pairs of bitlines BL and /BL are connected with the selective sense amplifier SSA, it suffices that the number of memory cells MC arranged in the RAM 200 in the direction X be the same as the number of pixels PY As a result, when using the vertical cell in which the dimension MCX of the memory cell MC is greater than the dimension MCY, an increase in the size of the RAM 200 in the direction X can be prevented by reducing the number of memory cells MC arranged in the direction X.

3.3 Read Operation from Vertical Memory Cell

The operation of the RAM 200 in which the vertical memory cells shown in FIG. 22 are arranged is described below. As the read control method for the RAM 200, two methods can be given, for example. One of the two methods is described below using timing charts shown in FIGS. 24A and 24B.

Figure 24A:
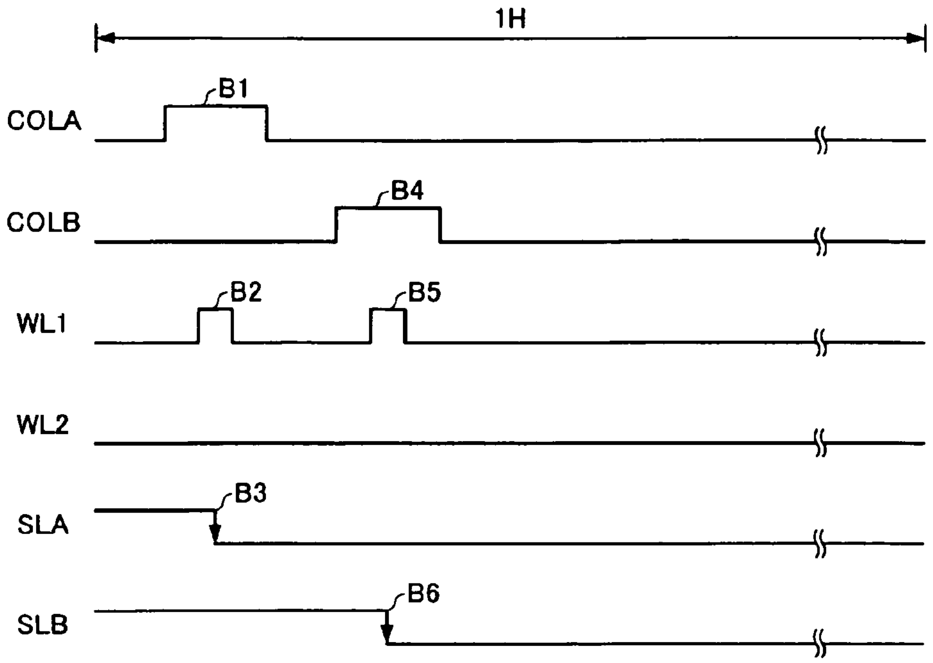
FIGS. 24A and 24B are timing charts showing the operation of the integrated circuit device according to the embodiment.

The select signal COLA is set to active at a timing B1 shown in FIG. 24A, and the wordline WL1 is selected at a timing B2. In this case, since the select signal COLA is active, the selective sense amplifier SSA detects and outputs data stored in the A-side memory cell MC, that is, the memory cell MC-1A. When the latch signal SLA falls at a timing B3, the data line driver cell 110A-R latches the data stored in the memory cell MC-1A.

The select signal COLB is set to active at a timing B4, and the wordline WL1 is selected at a timing B5. In this case, since the select signal COLB is active, the selective sense amplifier SSA detects and outputs data stored in the B-side memory cell MC, that is, the memory cell MC-1B. When the latch signal SLB falls at a timing B6, the data line driver cell 110B-R latches the data stored in the memory cell MC-1B. In FIG. 24A, the wordline WL1 is selected when reading data twice.

The data latch operation of the data line driver 100 by reading data twice in the 1H period is completed in this manner.

Figure 24B:
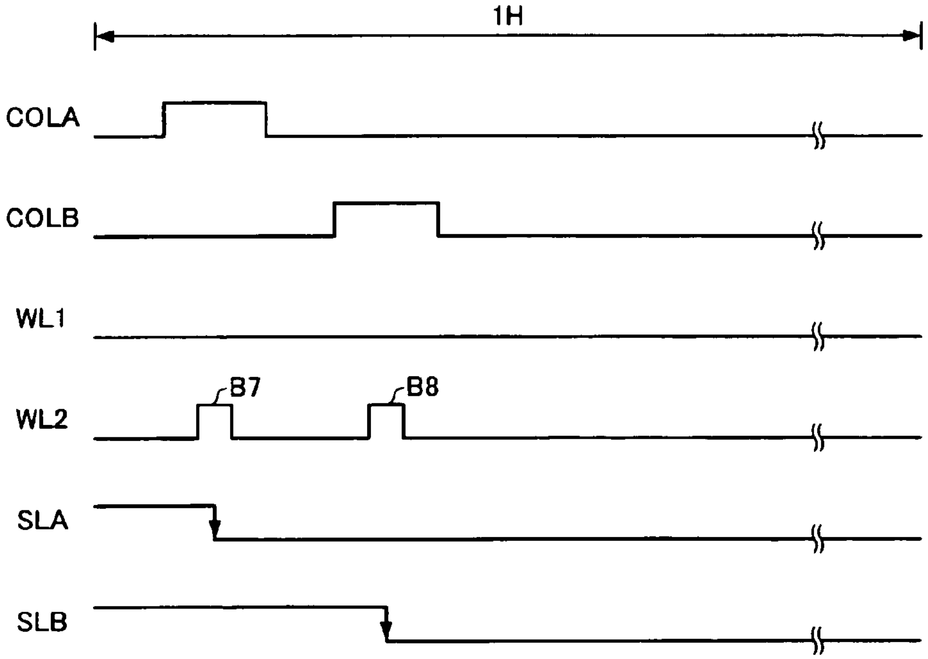

FIG. 24B shows a timing chart when the wordline WL2 is selected. The operation is similar to the above-described operation. As a result, when the wordline WL2 is selected as indicated by B7 and B8, data stored in the memory cell MC-2A is latched by the data line driver cell 110A-R, and data stored in the memory cell MC-2B is latched by the data line driver cell 110B-R.

The data latch operation of the data line driver 100 by reading data twice in the 1H period differing from the 1H period shown in FIG. 24A is completed in this manner.

Figure 25:
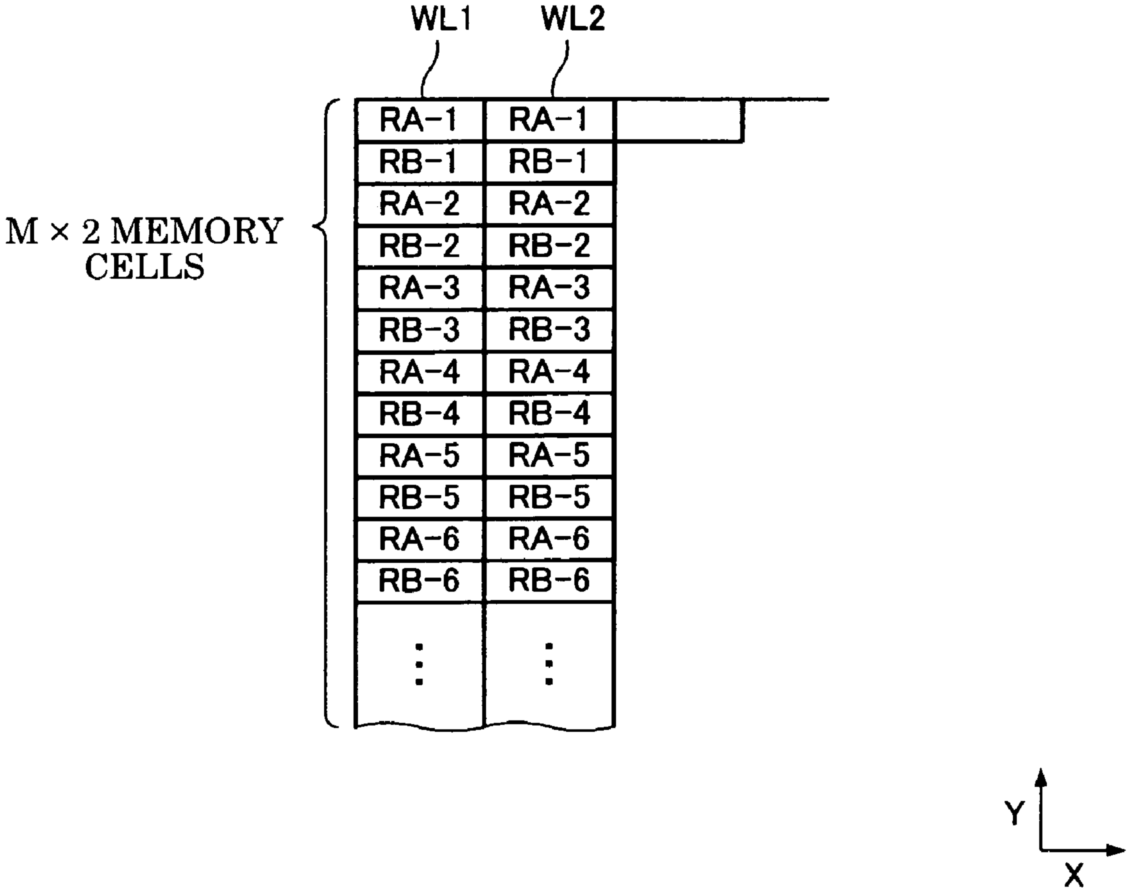
FIG. 25 is another arrangement example of data stored in the RAM block according to the embodiment.

According to such a read method, data is stored in each memory cell MC of the RAM 200 as shown in FIG. 25. For example, data RA-1 to RA-6 is 6-bit R pixel data to be supplied to the data line driver cell 110A-R, and data RB-1 to RB-6 is 6-bit R pixel data to be supplied to the data line driver cell 110B-R.

As shown in FIG. 25, the data RA-1 (data latched by the data line driver 100A), the data RB-1 (data latched by the data line driver 100B), the data RA-2 (data latched by the data line driver 100A), the data RB-2 (data latched by the data line driver 100B), the data RA-3 (data latched by the data line driver 100A), the data RB-3 (data latched by the data line driver 100B), . . . are sequentially stored in the memory cells MC corresponding to the wordline WL1 along the direction Y, for example. Specifically, (data latched by the data line driver 100A) and (data latched by the data line driver 100B) are alternately stored in the RAM 200 along the direction Y.

In the read method shown in FIGS. 24A and 24B, data is read twice in the 1H period, and the same wordline is selected in the 1H period.

The above description discloses that each selective sense amplifier SSA receives data from two of the memory cells MC selected by one wordline selection. However, the invention is not limited thereto. For example, each selective sense amplifier SSA may receive N-bit data from N memory cells MC of the memory cells MC selected by one wordline selection. In this case, the selective sense amplifier SSA selects 1-bit data received from a first memory cell MC of first to N-th memory cells MC (N memory cells MC) upon first selection of a single wordline. The selective sense amplifier SSA selects 1-bit data received from the K-th memory cell MC upon K-th ($1 \leqq K \leqq N$) selection of the wordline.

As a modification of FIGS. 24A and 24B, J (J is an integer larger than 1) wordlines WL each selected N times in the 1H period may be selected so that the number of times data is read from the RAM 200 in the 1H period is N×J. Specifically, when N=2 and J=2, the four wordline selections shown in FIGS. 24A and 24B are performed in a single horizontal scan period 1H. Specifically, data is read four (N=4) times by selecting the wordline WL1 twice and selecting the wordline WL2 twice in the 1H period.

In this case, each RAM block 200 outputs M-bit (M is an integer larger than 1) data upon one wordline selection. When the number of data lines DL of the display panel 10 is denoted by DLN, the number of grayscale bits of each pixel corresponding to each data line is denoted by G, and the number of RAM blocks 200 is denoted by BNK, the value M is given by the following equation.

$$M = \frac{DLN \times G}{BNK \times N \times J}$$

The other control method is described below with reference to FIGS. 26A and 26B.

Figure 26A:
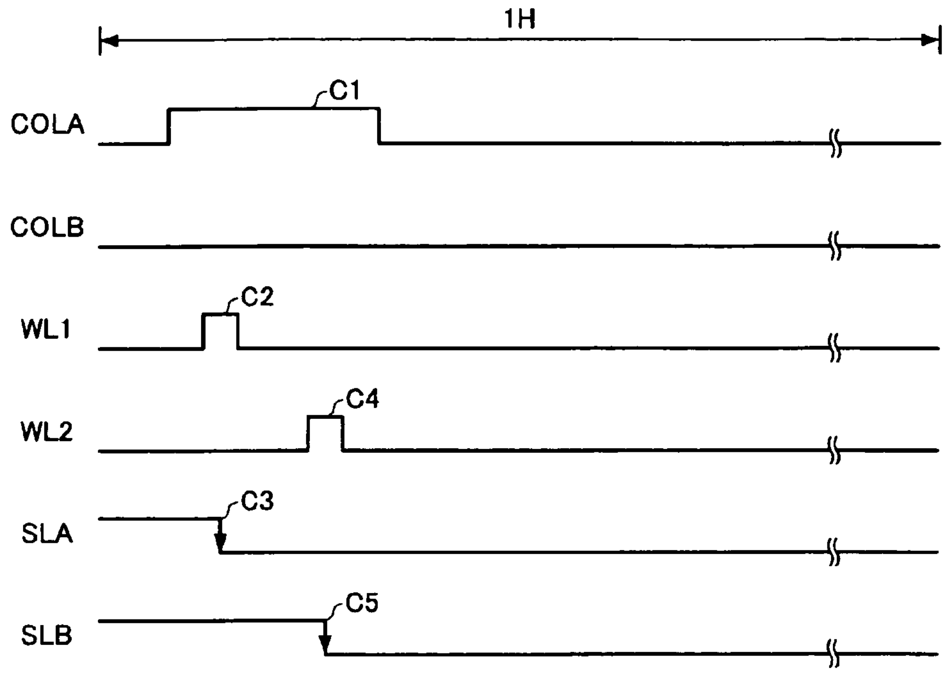
FIGS. 26A and 26B are timing charts showing another operation of the integrated circuit device according to the embodiment.

The select signal COLA is set to active at a timing C1 shown in FIG. 26A, and the wordline WL1 is selected at a timing C2. This causes the memory cells MC-1A and MC-1B shown in FIG. 22 to be selected. In this case, since the select signal COLA is active, the selective sense amplifier SSA detects and outputs data stored in the A-side memory cell MC (first memory cell in a broad sense), that is, the memory cell MC-1A. When the latch signal SLA falls at a timing C3, the data line driver cell 110A-R latches the data stored in the memory cell MC-1A.

The wordline WL2 is selected at a timing C4 so that the memory cells MC-2A and MC-2B are selected. In this case, since the select signal COLA is active, the selective sense amplifier SSA detects and outputs data stored in the A-side memory cell MC, that is, the memory cell MC-2A. When the latch signal SLB falls at a timing C5, the data line driver cell 110B-R latches the data stored in the memory cell MC-2A.

The data latch operation of the data line driver 100 by reading data twice in the 1H period is completed in this manner.

The read operation in the 1H period differing from the 1H period shown in FIG. 26A is described below with reference to FIG. 26B. The select signal COLB is set to active at a timing C6 shown in FIG. 26B, and the wordline WL1 is selected at a timing C7. This causes the memory cells MC-1A and MC-1B shown in FIG. 22 to be selected. In this case, since the select signal COLB is active, the selective sense amplifier SSA detects and outputs data stored in the B-side memory cell MC (one of the first to N-th memory cells differing from the first memory cell in a broad sense), that is, the memory cell MC-1B. When the latch signal SLA falls at a timing C8, the data line driver cell 110A-R latches the data stored in the memory cell MC-1B.

The wordline WL2 is selected at a timing C9 so that the memory cells MC-2A and MC-2B are selected. In this case, since the select signal COLB is active, the selective sense amplifier SSA detects and outputs data stored in the B-side memory cell MC, that is, the memory cell MC-2B. When the latch signal SLB falls at a timing C10, the data line driver cell 110B-R latches the data stored in the memory cell MC-2B.

The data latch operation of the data line driver 100 by reading data twice in the 1H period differing from the 1H period shown in FIG. 26A is completed in this manner.

Figure 26B:
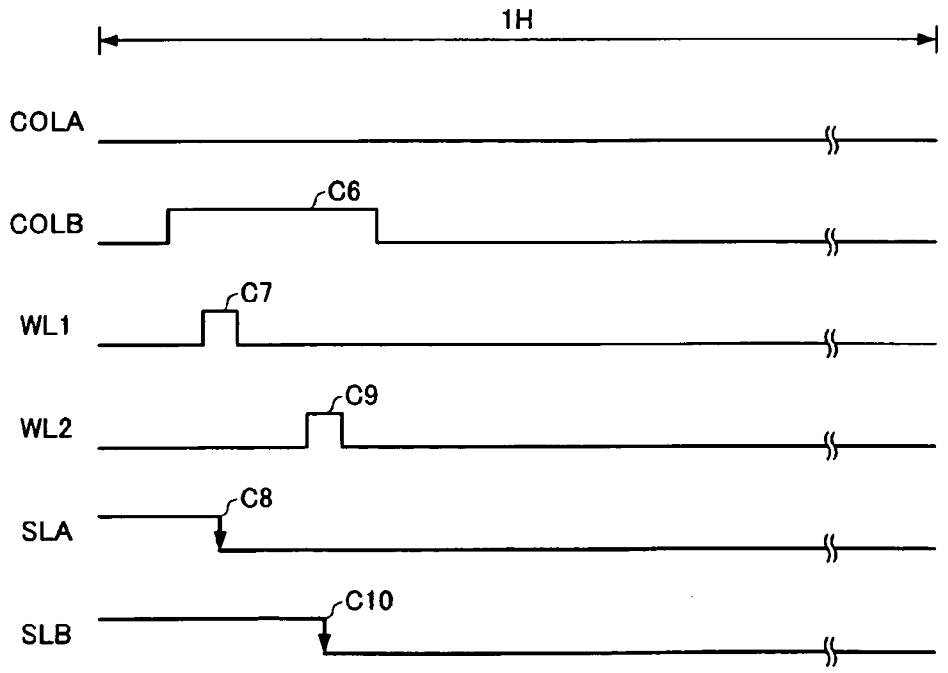
Figure 27:
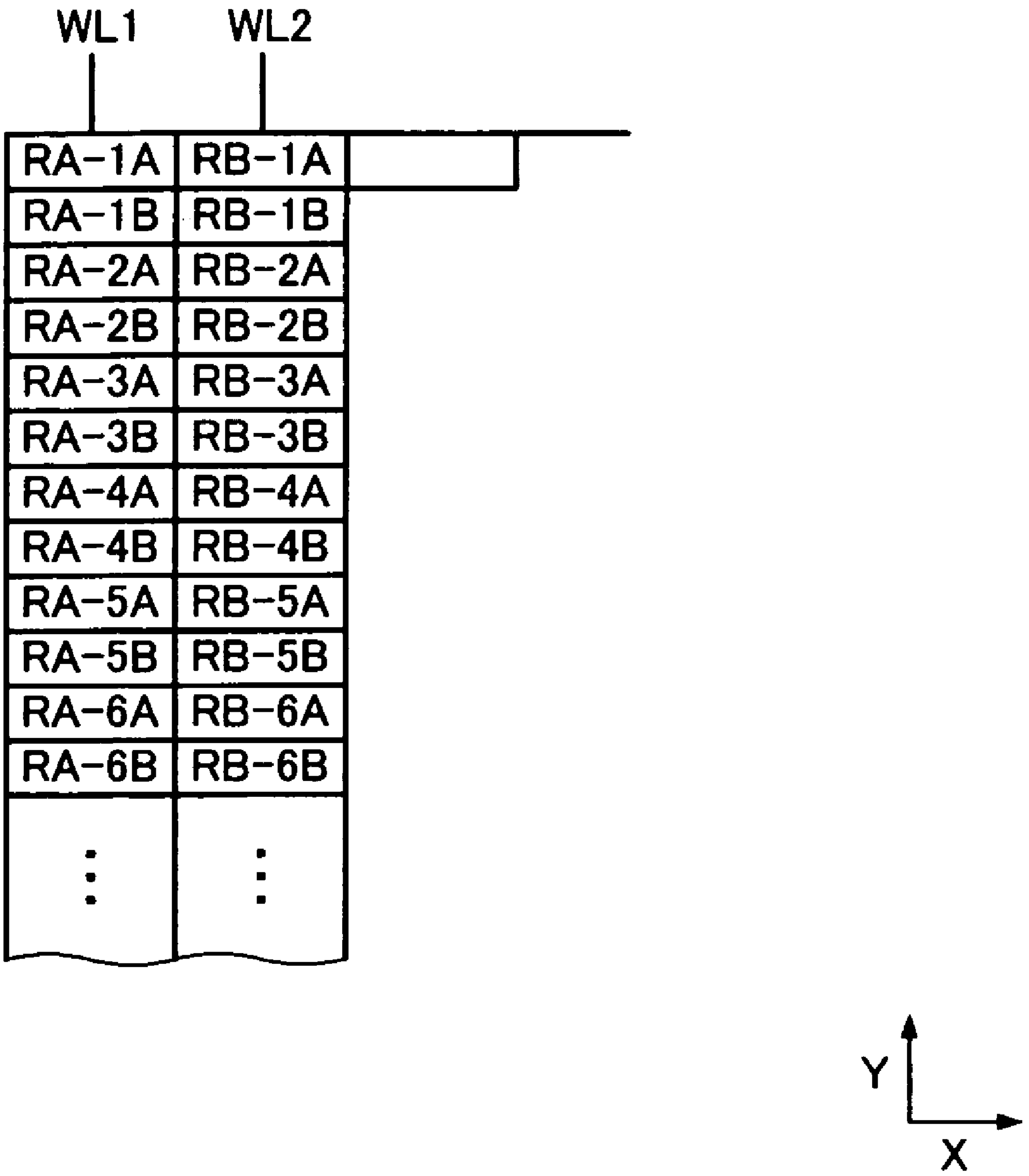
FIG. 27 is still another arrangement example of data stored in the RAM block according to the embodiment.

According to such a read method, data is stored in each memory cell MC of the RAM 200 as shown in FIG. 27. Data RA-1A to RA-6A and data RA-1B to RA-6B are 6-bit R subpixel data to be supplied to the data line driver cell 110A-R, for example. The data RA-1A to RA-6A is R subpixel data in the 1H period shown in FIG. 26A, and the data RA-1B to RA-6B is R subpixel data in the 1H period shown in FIG. 26B.

Data RB-1A to RB-6A and data RB-1B to RB-6B are 6-bit R subpixel data to be supplied to the data line driver cell 110B-R. The data RB-1A to RB-6A is R subpixel data in the 1H period shown in FIG. 26A, and the data RB-1B to RB-6B is R subpixel data in the 1H period shown in FIG. 26B.

As shown in FIG. 27, the data RA-1A (data latched by the data line driver 100A) and the data RB-1A (data latched by the data line driver 100B) are stored in the RAM 200 in that order along the direction X.

The data RA-1A (data latched by the data line driver 100A in the 1H period shown in FIG. 26A), the data RA-1B (data latched by the data line driver 100A in the 1H period shown in FIG. 26A), the data RA-2A (data latched by the data line driver 100A in the 1H period shown in FIG. 26A), the data RA-2B (data latched by the data line driver 100A in the 1H period shown in FIG. 26A), . . . are stored in the RAM 200 in that order along the direction Y. Specifically, the data latched by the data line driver 100A in one 1H period and the data latched by the data line driver 100A in another 1H period are alternately stored in the RAM 200 along the direction Y.

In the read method shown in FIGS. 26A and 26B, data is read twice in the 1H period, and different wordlines are selected in the 1H period. A single wordline is selected twice in one vertical period (i.e. one frame period). This is because the two pairs of bitlines BL and /BL are connected with the selective sense amplifier SSA. Therefore, when three or more pairs of bitlines BL and /BL are connected with the selective sense amplifier SSA, a single wordline is selected three or more times in one vertical period.

In the embodiment, the wordline WL is controlled by the wordline control circuit 220 shown in FIG. 4, for example.

3.4 Arrangement of Data Read Control Circuit

Figure 20:
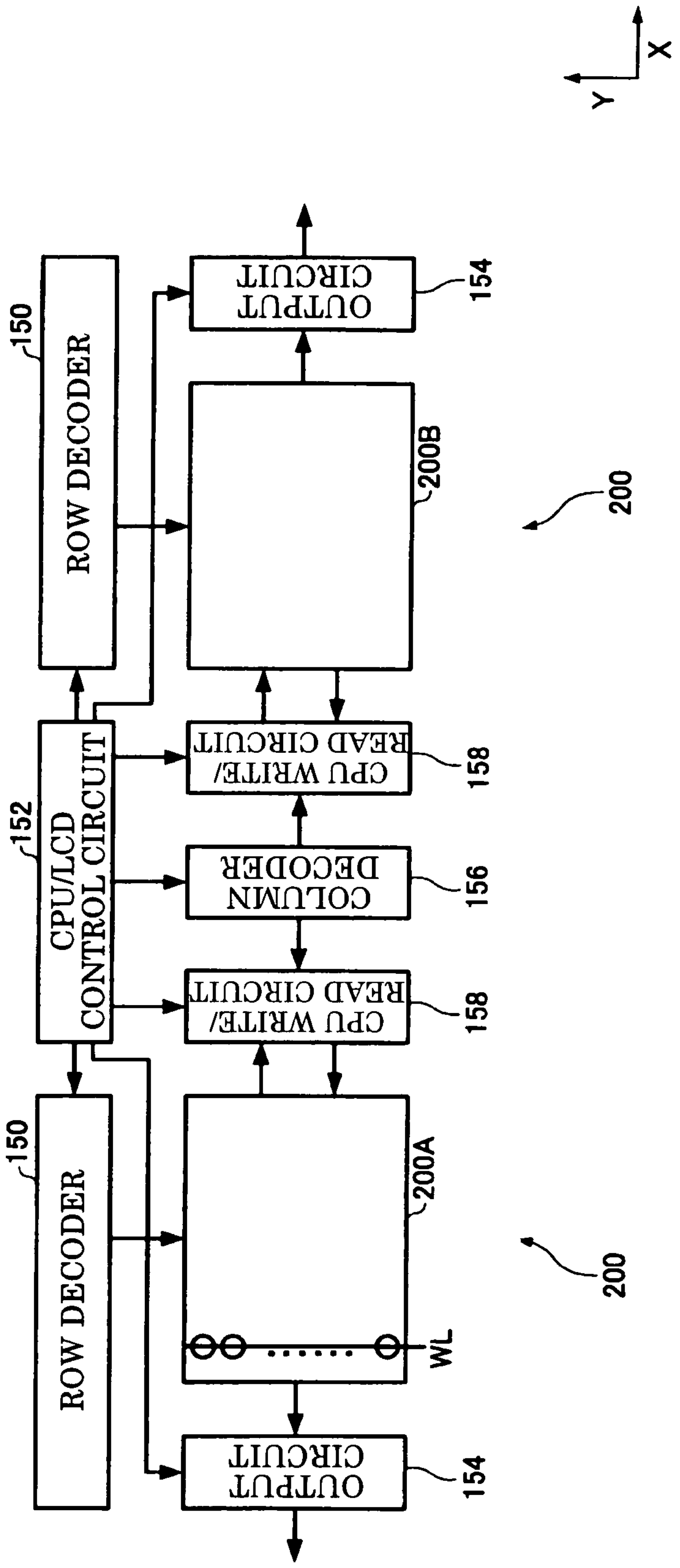
FIG. 20 is a block diagram showing memory cell arrays and peripheral circuits in an example in which two RAMs are adjacent to each other as shown in FIG. 3A.

FIG. 20 shows two memory cell arrays 200A and 200B and peripheral circuits provided in two RAMs 200 formed by using the horizontal cells shown in FIG. 17B.

FIG. 20 is a block diagram showing an example in which two RAMs 200 are adjacent to each other as shown in FIG. 3A. A row decoder (wordline control circuit in a broad sense) 150, an output circuit 154, and a CPU write/read circuit 158 are provided for each of the two memory cell arrays 200A and 200B as dedicated circuits. A CPU/LCD control circuit 152 and a column decoder 156 are provided as circuits common to the two memory cell arrays 200A and 200B.

The row decoders 150 control the wordlines WL of the RAMs 200A and 200B based on signals from the CPU/LCD control circuit 152. Since data read control from each of the two memory cell arrays 200A and 200B to the LCD is performed by the row decoder 150 and the CPU/LCD control circuit 152, the row decoder 150 and the CPU/LCD control circuit 152 serve as a data read control circuit in a broad sense. The CPU/LCD control circuit 152 controls the two row decoders 150, two output circuits 154, two CPU write/read circuits 158, and one column decoder 156 based on control by an external host, for example.

The two CPU write/read circuits 158 write data from the host into the memory cell arrays 200A and 220B, or read data stored in the memory cell arrays 200A and 220B and output the data to the host based on signals from the CPU/LCD control circuit 152. The column decoder 156 controls selection of the bitlines BL and /BL of the memory cell arrays 200A and 200B based on signals from the CPU/LCD control circuit 152.

The output circuit 154 includes a plurality of sense amplifier cells 211 to which 1-bit data is respectively input as described above, and outputs M-bit data output from each of the memory cell arrays 200A and 200B upon selection of two different wordlines WL in the 1H period to the data line driver 100, for example. When four RAMs 200 are provided as shown in FIG. 3A, two CPU/LCD control circuits 152 control four column decoders 156 based on a single wordline control signal RAC shown in FIG. 10, so that the wordlines WL having the same column address are selected at the same time in the four memory cell arrays.

Since the number of bits M read at one reading is reduced by reading data from each of the memory cell arrays 200A and 200B twice in the 1H period, the size of the column decoder 156 and the CPU write/read circuit 158 is halved. When two RAMs 200 are adjacent to each other as shown in FIG. 3A, since the CPU/LCD control circuit 152 and the column decoder 156 can be used in common for the two memory cell arrays 200A and 200B, the size of the RAM 200 can be reduced.

When using the horizontal cells shown in FIG. 17B, since the number of memory cells MC connected with each of the wordlines WL1 and WL2 is as small as M as shown in FIG. 19, the interconnect capacitance of the wordline is relatively small. Therefore, it is unnecessary to hierarchize the wordline by using a main-wordline and a sub-wordline.

4. Modification

Figure 28:
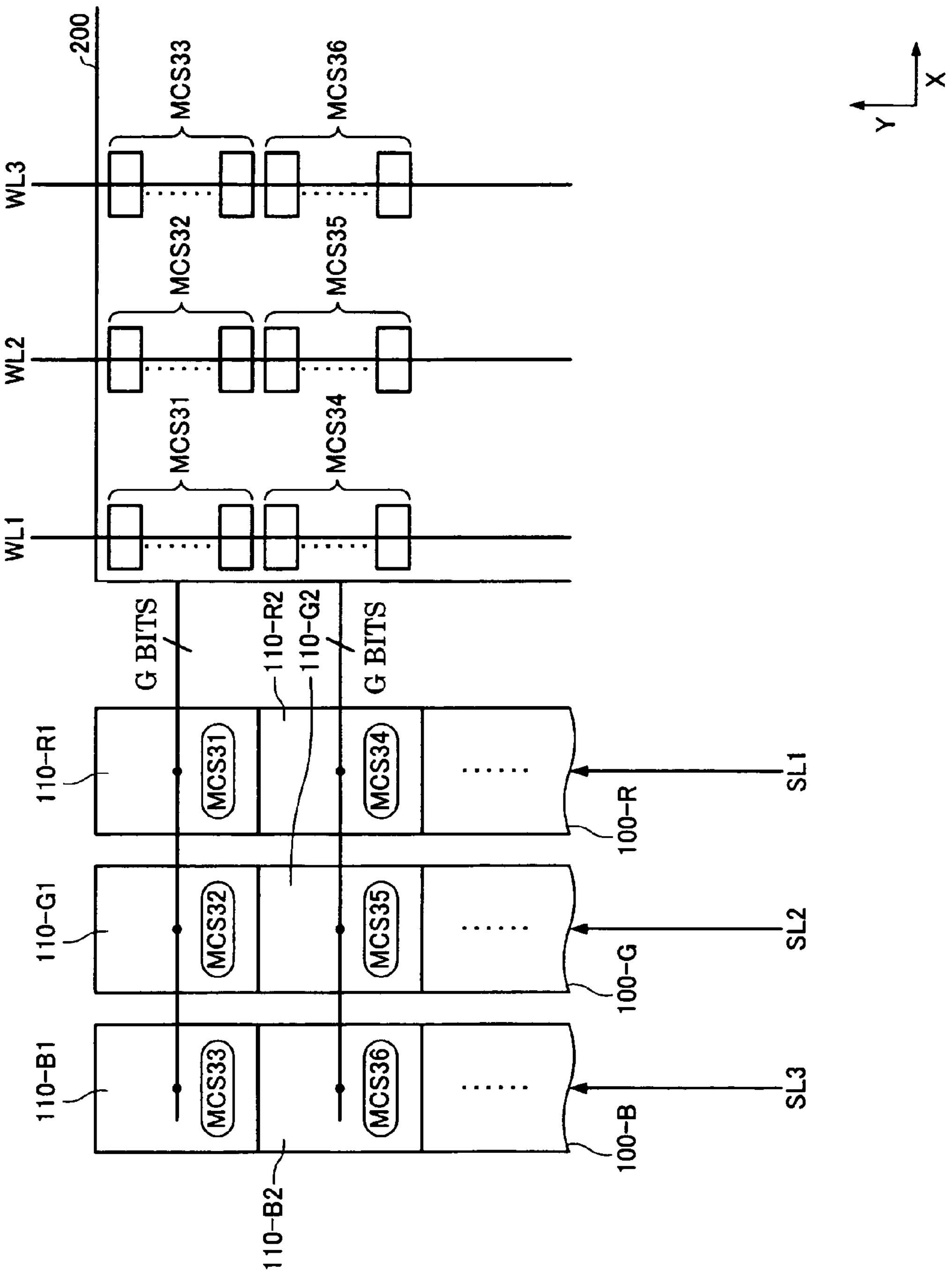
FIG. 28 is a diagram showing a modification according to the embodiment.

FIG. 28 shows a modification according to the embodiment. In FIG. 11A, the data line driver 100 is divided into the data line drivers 100A and 100B in the direction X, for example. The R subpixel data line driver cell, the G subpixel data line driver cell, and the B subpixel data line driver cell are provided in each of the data line drivers 100A and 100B when displaying a color image.

In the modification shown in FIG. 28, the data line driver is divided into three data line drivers 100-R (first divided data line driver in a broad sense), 100-C, and 100-B (third divided data line driver in a broad sense) in the direction X. A plurality of R subpixel data line driver cells 110-R1, 110-R2, . . . (R data line driver cell in a broad sense) are provided in the data line driver 100-R, and a plurality of G subpixel data line driver cells 110-G1, 110-G2, . . . (G data line driver cell in a broad sense) are provided in the data line driver 100-G. Likewise, a plurality of B subpixel data line driver cells 110-B1, 110-B2, . . . (B data line driver cell in a broad sense) are provided in the data line driver 100-B.

In the modification shown in FIG. 28, data is read three times in the 1H period. For example, when the wordline WL1 is selected, the data line driver 100-R latches data output from the RAM 200 in response to the selection of the wordline WL1. This causes data stored in the memory cell group MCS31 to be latched by the data line driver 100-R1, for example.

When the wordline WL2 is selected, the data line driver 100-G latches data output from the RAM 200 in response to the selection of the wordline WL2. This causes data stored in the memory cell group MCS32 to be latched by the data line driver 100-G1, for example.

When the wordline WL3 is selected, the data line driver 100-B latches data output from the RAM 200 in response to the selection of the wordline WL3. This causes data stored in the memory cell group MCS33 to be latched by the data line driver 100-B1, for example.

The above description also applies to the memory cell groups MCS34, MCS35, and MCS36. Data stored in the memory cell groups MCS34, MCS35, and MCS36 is respectively stored in the data line driver cells 110-R2110-G2, and 110-B2, as shown in FIG. 28.

Figure 29:
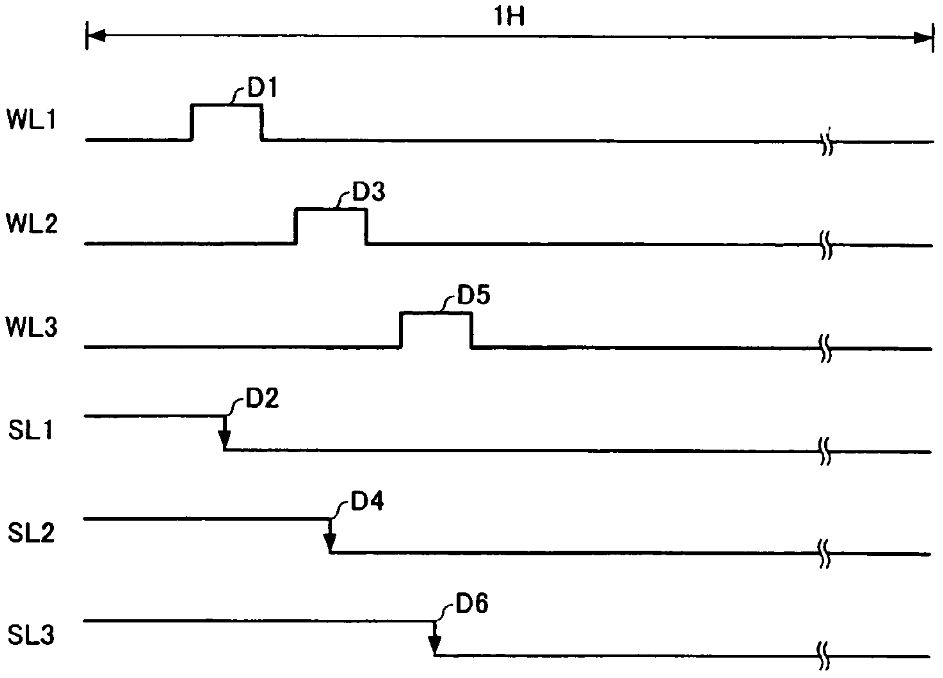
FIG. 29 is a timing chart illustrative of the operation of the modification according to the embodiment.

FIG. 29 is a diagram showing a timing chart of this three-stage read operation. The wordline WL1 is selected at a timing D1 shown in FIG. 29, and the data line driver 100-R latches data from the RAM 200 at a timing D2. This causes data output by the selection of the wordline WL1 to be latched by the data line driver 100-R.

The wordline WL2 is selected at a timing D3, and the data line driver 100-G latches data from the RAM 200 at a timing D4. This causes data output by the selection of the wordline WL2 to be latched by the data line driver 100-G The wordline WL3 is selected at a timing D5, and the data line driver 100-B latches data from the RAM 200 at a timing D6. This causes data output by the selection of the wordline WL3 to be latched by the data line driver 100-B.

Figure 30:
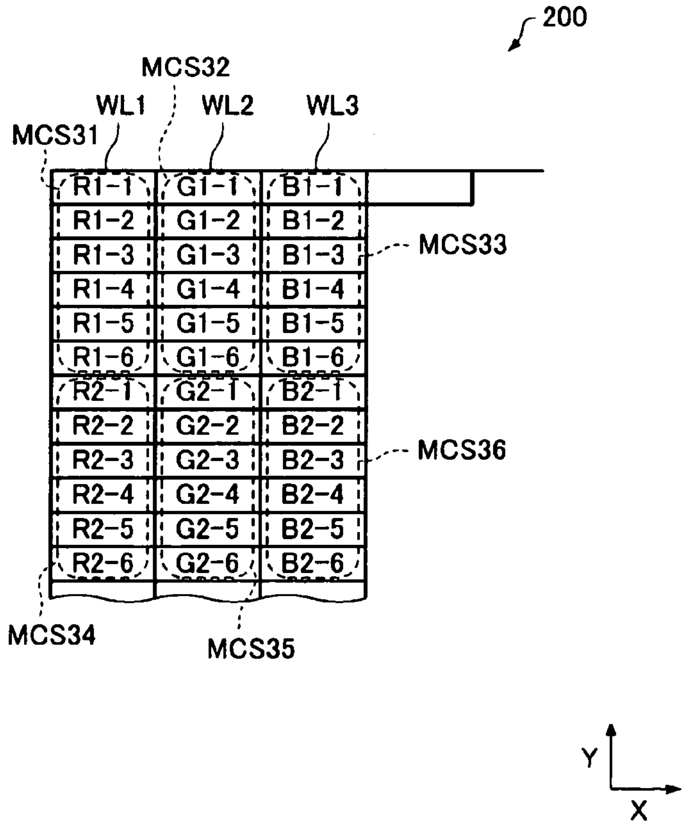
FIG. 30 is an arrangement example of data stored in the RAM block in the modification according to the embodiment.

According to the above-described operation, data is stored in the memory cells MC of the RAM 200 as shown in FIG. 30. For example, data R1-1 shown in FIG. 30 indicates 1-bit data when the R subpixel has a 6-bit grayscale, and is stored in one memory cell MC.

For example, the data R1-1 to R1-6 is stored in the memory cell group MCS31 shown in FIG. 28, the data G0-1 to G1-6 is stored in the memory cell group MCS32, and the data B1-1 to B1-6 is stored in the memory cell group MCS33. Likewise, the data R2-1 to R2-6, G2-1 to G2-6, and B2-1 to B2-6 is respectively stored in the memory cell groups MCS34 to MCS36, as shown in FIG. 30.

For example, the data stored in the memory cell groups MCS31 to MCS33 may be considered to be data for one pixel, and is data for driving the data lines differing from the data lines corresponding to the data stored in the memory cell groups MCS34 to MSC36. Therefore, data in pixel units can be sequentially written into the RAM 200 along the direction Y Among the data lines provided in the display panel 10, the data line corresponding to the R subpixel is driven, the data line corresponding to the G subpixel is then driven, and the data line corresponding to the B subpixel is then driven. Therefore, since all the data lines corresponding to the R subpixels have been driven even if a delay occurs in each reading when reading data three times in the 1H period, for example, the area of the region in which an image is not displayed due to the delay is reduced. Therefore, deterioration of display such as a flicker can be reduced.

The modification illustrates the division into three blocks as an example. Note that the invention is not limited thereto. When N is the multiple of three, ⅓ of the N divided data line drivers correspond to the first divided data line driver group, other ⅓ of the N divided data line drivers correspond to the second divided data line driver group, and the remaining ⅓ of the N divided data line drivers correspond to the third divided data line driver group.

5. Effect of Embodiment

Suppose that the length of the RAM 200 in the direction Y is set at RY when providing the RAM 200 in the display driver 20 shown in FIG. 1A. In this case, the RAM 200 outputs M-bit data upon one wordline selection. Suppose that the length of the data line driver 100 in the direction Y is set at DDY1 as shown in FIG. 31A when designing the data line driver 100 in order to latch M-bit data. In this case, since the length DDY1 of the data line driver 100 is greater than the length RY of the RAM 200, the data line driver 100 cannot be provided within the length ICY shown in FIG. 3A.

If the number of bits M is increased along with an increase in resolution of the display panel, the length DDY1 of the data line driver 100 is further increased.

Figure 45A:
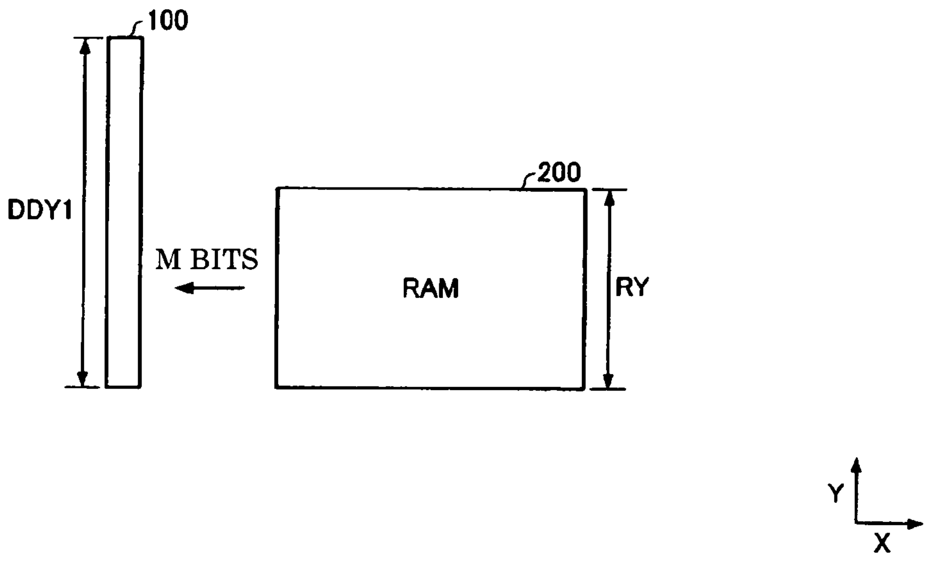
FIGS. 45A and 45B are a diagram illustrative of effects of the data line driver block according to the embodiment.
Figure 45B:
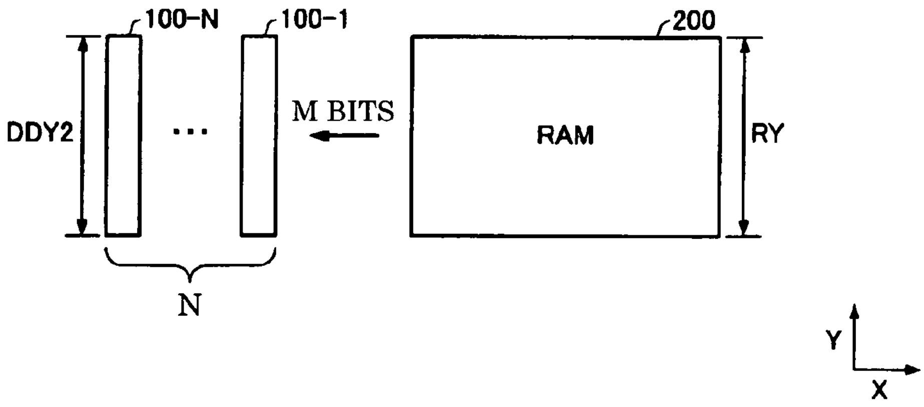

In the embodiment, the data line driver 100 can be divided into N divided data line drivers 100-1 to 100-N as shown in FIG. 45B. This enables the data line driver 100 to be provided within the width ICY of the display driver 20 shown in FIG. 3A, even if the number of bits M is increased. Specifically, since the layout of the data line driver 100 can be flexibly performed, the data line driver 100 can be efficiently arranged in the display driver 20 or the like.

In the embodiment, data is read from the RAM 200 a plurality of times in the 1H period, as described above. Therefore, the number of memory cells MC connected with one wordline can be reduced, or the data line driver 100 can be divided. For example, since the number of memory cells MC corresponding to one wordline can be adjusted by changing the number of readings in the 1H period, the dimension RX in the direction X and the dimension RY in the direction Y of the RAM 200 can be appropriately adjusted. Moreover, the number of divisions of the data line driver 100 can be changed by adjusting the number of readings in the 1H period.

Moreover, the number of blocks of the data line driver 100 and the RAM 200 can be easily changed or the layout size of the data line driver 100 and the RAM 200 can be easily changed corresponding to the number of data lines provided in the display region 12 of the drive target display panel 10. Therefore, the display driver 20 can be designed while taking other circuits provided to the display driver 20 into consideration, whereby design cost of the display driver 20 can be reduced. For example, when only the number of data lines is changed corresponding to the design change in the drive target display panel 10, the major design change target may be the data line driver 100 and the RAM 200. In this case, since the layout size of the data line driver 100 and the RAM 200 can be flexibly designed in the embodiment, a known library may be used for other circuits. Therefore, the embodiment enables effective utilization of the limited space, whereby design cost of the display driver 20 can be reduced.

In the display driver 24 of the comparative example shown in FIG. 8, since the wordline WL is very long, a certain amount of electric power is required so that a variation due to a data read delay from the RAM 205 does not occur. Moreover, since the wordline WL is very long, the number of memory cells connected with one wordline WL1 is increased, whereby the parasitic capacitance of the wordline WL is increased. An increase in the parasitic capacitance may be dealt with by dividing the wordlines WL and controlling the divided wordlines. However, it is necessary to provide an additional circuit.

In the embodiment, the wordlines WL1 and WL2 and the like are formed to extend along the direction Y as shown in FIG. 11A, and the length of each wordline is sufficiently small in comparison with the wordline WL of the comparative example. Therefore, the amount of electric power required to select the wordline WL1 is reduced. This prevents an increase in power consumption even when reading data a plurality of times in the 1H period.

When the 4BANK RAMs 200 are provided as shown in FIG. 3A, the wordline select signal and the latch signals SLA and SLB are controlled in the RAM 200 as shown in FIG. 11B. These signals may be used in common for each of the 4BANK RAMs 200, for example.

In more detail, the same data line control signal SLC (data line driver control signal) is supplied to the data line drivers 100-1 to 100-4, and the same wordline control signal RAC (RAM control signal) is supplied to the RAMs 200-1 to 200-4, as shown in FIG. 10. The data line control signal SLC includes the latch signals SLA and SLB shown in FIG. 11B, and the RAM control signal RAC includes the wordline select signal shown in FIG. 11B, for example.

Therefore, the wordline of the RAM 200 is selected similarly in each BANK, and the latch signals SLA and SLB supplied to the data line driver 100 fall similarly. Specifically, the wordline of one RAM 200 and the wordline of another RAM 200 are selected at the same time in the 1H period. This enables the data line drivers 100 to drive the data lines normally.

6. Specific Example of Source Driver and RAM Block

Figure 31:
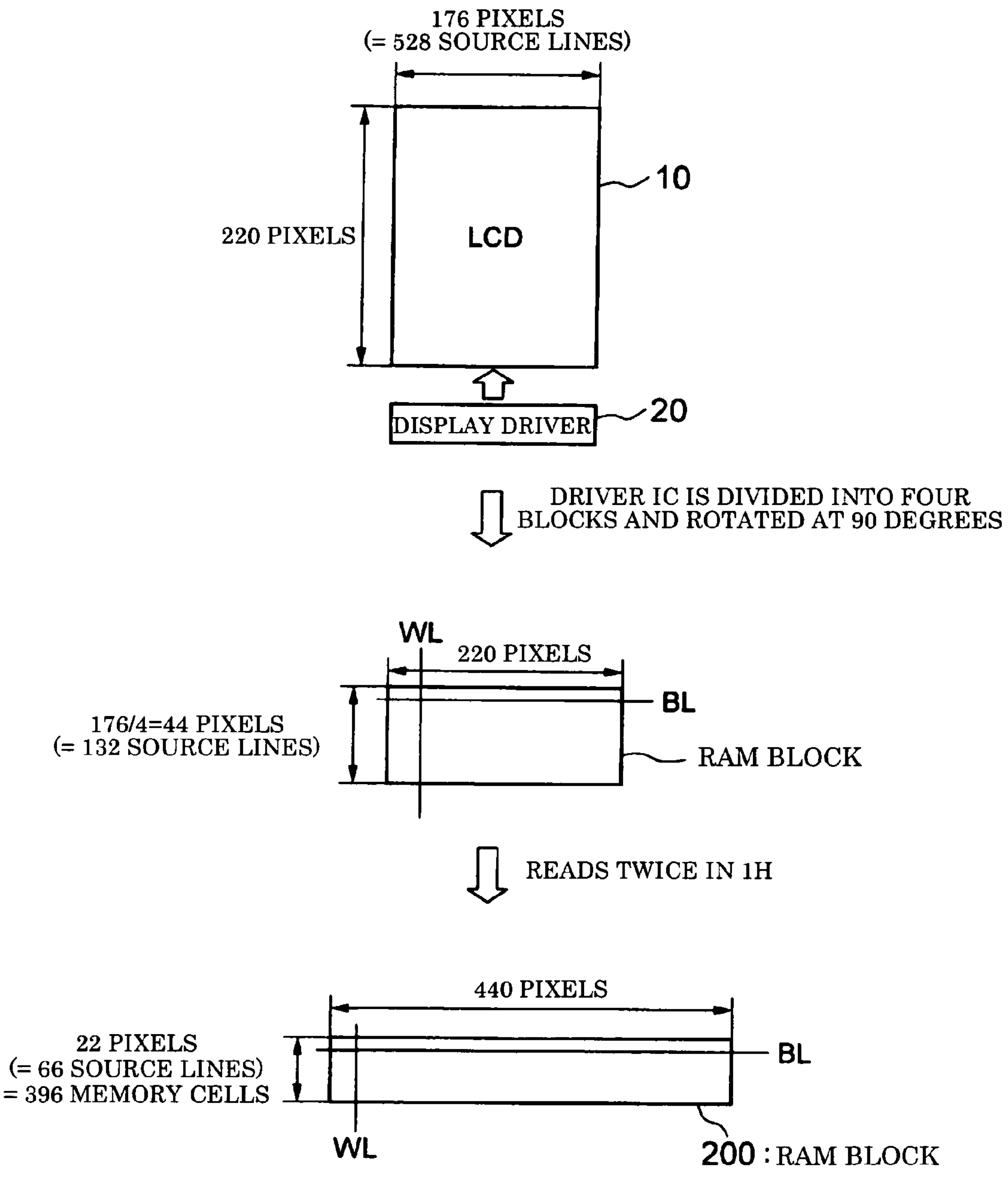
FIG. 31 is a diagram illustrative of a RAM block used in the embodiment for reading data twice in one horizontal scan period, which is divided into four blocks and rotated at 90 degrees.

The data driver 100 and the RAM block 200 which allow the display driver 10 used for the 176×220-pixel QCIF color liquid crystal display panel 10 to be divided into four blocks and rotated at 90 degrees and allow data to be read twice in one horizontal scan period, as shown in FIG. 31, are described below in detail.

6.1 RAM Integrated Data Driver Block

Figure 32:
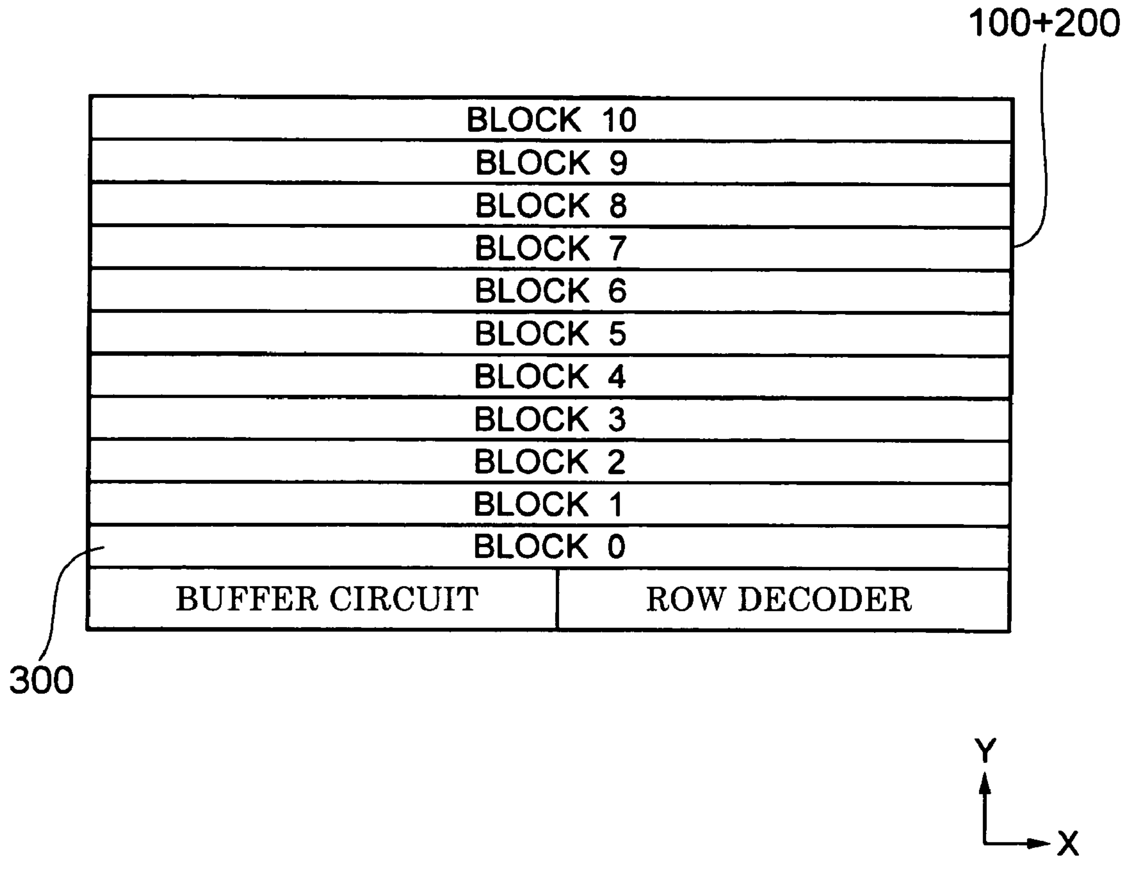
FIG. 32 is a diagram showing block division of a RAM and a source driver.

FIG. 32 shows a block of the source driver 100 and the RAM block 200. This block is divided into eleven RAM integrated data driver blocks 300 in the direction Y in which the wordline extends. Since the RAM block 200 stores data of 22 pixels in the direction Y, as shown in FIG. 31, the RAM integrated data driver block 300 obtained by dividing the RAM block 200 into eleven blocks stores data of two pixels in the direction Y.

Figure 33:
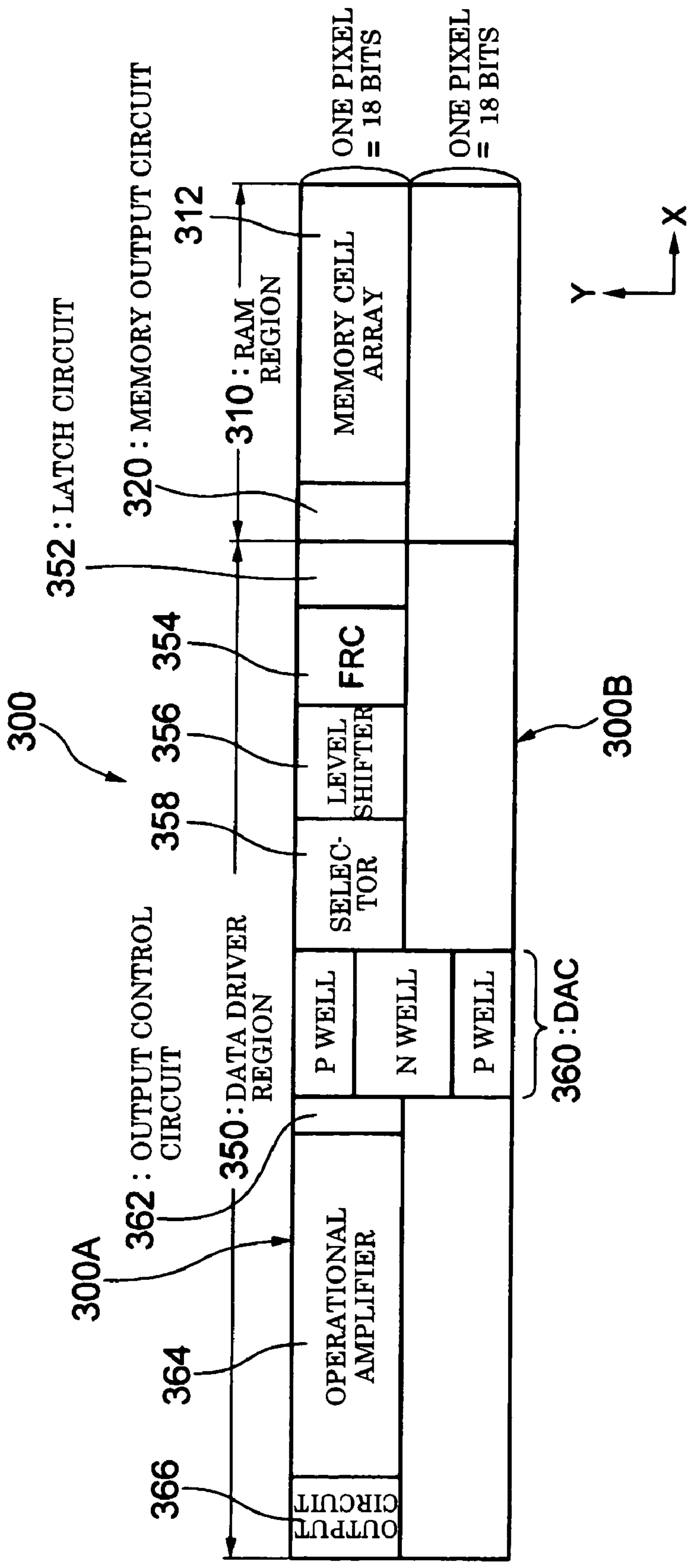
FIG. 33 is a schematic diagram illustrative of a RAM integrated data driver block formed by dividing the RAM block into eleven blocks as shown in FIG. 32.

As shown in FIG. 33, the RAM integrated data block 300 is roughly divided into a RAM region 310 and a data driver region 350 in the direction X. A memory cell array 312 and a memory output circuit 320 are provided in the RAM region 310. The data driver region 350 includes a latch circuit 352, a frame rate controller (FRC) 354, a level shifter 356, a selector 358, a digital-analog converter (DAC) 360, an output control circuit 362, an operational amplifier 364, and an output circuit 366. The RAM integrated data driver block 300 which outputs data of two pixels is divided into subblocks 300A and 300B in pixel data units. The circuits of the subblocks 300A and 300B are disposed in a mirror image across the boundary between the subblocks 300A and 300B. As shown in FIG. 33, a P-well/N-well structure in a one-pixel conversion region in which data of one pixel is digital-analog converted is disposed in a mirror image in the region of the DAC 360 across the boundary between the subblocks 300A and 330B. This is because N-type and P-type transistors forming switches necessary for the DAC can be arranged on a straight line in the direction Y. Therefore, since the N-type well can be used in common by the subblocks 300A and 330B, the number of well isolation regions is reduced, whereby the dimension in the direction Y can be reduced. Specifically, the dimension RY shown in FIG. 10 can be reduced.

Figure 34:
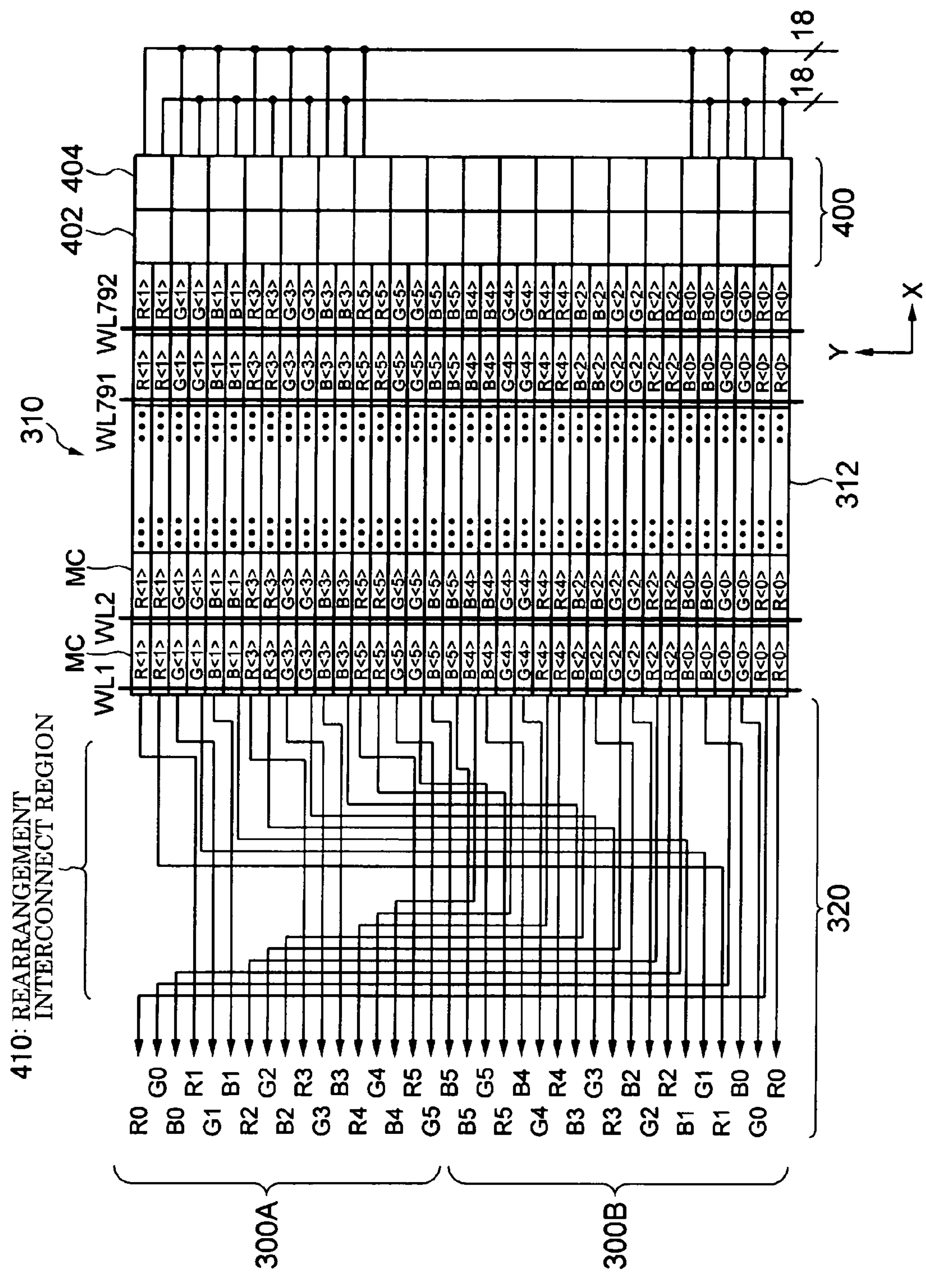
FIG. 34 is a diagram illustrative of a state in which the data read order in a memory cell array corresponding to the arrangement of bitlines differs from the data output order from a memory output circuit.

FIG. 34 shows the RAM region 310 of the RAM integrated data driver block 300 shown in FIG. 33. In the RAM region 310, 36 memory cells MC of two pixels (i.e. 2 (pixel)×3 (RGB)×6 (number of grayscale bits)=36 bits) are arranged in the direction Y. As shown in FIG. 34, the memory cell MC used in the embodiment is in the shape of a rectangle having a long side parallel to the direction X (bitline direction) and a short side parallel to the direction Y (wordline direction). This allows the height in the direction Y to be reduced when arranging the 36 memory cells MC in the direction Y, whereby the height of the RAM block 200 shown in FIG. 10 can be reduced.

Since the subblocks 300A and 300B of the RAM integrated data driver block 300 are disposed in a mirror image as described with reference to FIG. 33, the inputs to the data driver regions 350 of the subblocks 300A and 300B must be symmetrical across the boundary between the subblocks 300A and 300B, as shown on the left end in FIG. 34.

When the subpixels R, G and B forming one pixel are respectively six bits, the total number of bits of one pixel is 18. The 18-bit data of one pixel is indicated as R0, B0, G0, . . . , R5, B5, and G5. As shown on the left end in FIG. 34, the output arrangement to the data driver region 350 in the sub-block 300A is in the order of R0, G0, B0, R1, . . . , R5, G5, and B5 from the top side. The output arrangement to the data driver region 350 in the subblock 300B is in the order of R0, G0, B0, R1, . . . , R5, G5, and B5 from the bottom side for the above-described reason. In other words, the data of two pixels is symmetrical across the boundary between the subblocks 300A and 300B.

On the other hand, the RGB storage order (i.e. data read order) the shown in FIG. 34 is used in the memory cell array 312 in the RAM region 310 of the RAM integrated data driver block 300, which does not coincide with the data output order to the data driver region 350. Therefore, a rearrangement interconnect region 410 is provided in the region of the memory output circuit 320, as shown in FIG. 34. The rearrangement interconnect region 410 rearranges bit data input from the bitlines in the data read order using interconnects, and outputs the bit data in the bit output order of the memory output circuit 320.

The rearrangement interconnect region 410 is described later. The memory cell array 312 is described below. As shown in FIG. 34, a data read/write circuit 400 which receives and outputs data from and to a host device (not shown) which controls reading and writing of data from and into the RAM block 200 is provided on the right of the memory cell array 312. 18-bit data is input to or output from the data read/write circuit 400 by one access. Specifically, two accesses are necessary in order to read or write 36-bit data of two pixels from or into the RAM integrated data driver block 300.

As shown in FIG. 34, the data read/write circuit 400 includes eighteen write driver cells 402 arranged in the direction Y and eighteen sense amplifier cells 404 arranged in the direction Y. When a specific number (two in this embodiment) of memory cells adjacent in the direction Y (wordline direction) is referred to as one memory cell group, each write driver cell 402 has a height equal to the height of two memory cells MC forming one memory cell group in the direction Y. In other words, one write driver cell 402 is used for two adjacent memory cells MC. Similarly, each sense amplifier cell 404 has a height equal to the height of two adjacent memory cells MC in the direction Y. In other words, one sense amplifier cell 404 is used for two adjacent memory cells MC.

An example in which the host device writes data of one pixel into the memory cell array 312 is described below. For example, the wordline WL1 shown in FIG. 34 is selected, and data R0, B0, G0, . . . , R5, B5, and G5 of one pixel is written into even-numbered eighteen memory cells MC among the 36 memory cells MC arranged in the direction Y through 18 write driver cells 402. Then, the wordline WL1 is selected, and data R0, B0, G0, . . . , R5, B5, and G5 of the subsequent pixel is written into odd-numbered eighteen memory cells MC among the 36 memory cells MC arranged in the direction Y through 18 write driver cells 402.

This allows the data of two pixels to be written into the 36 memory cells MC arranged in the direction Y shown in FIG. 34. When reading data into the host device, data is read twice in the same manner as in the write operation using the sense amplifier cells 404 instead of the write driver cells 402.

As described above, two pieces of data (e.g. R0 and R0) of the same color and having the same grayscale bit number of the six bits in total are input to two memory cells MC adjacent in the direction Y in FIG. 34 due to limitations to access from the host device. Therefore, the order of data stored in the 36 memory cells MC (two pixels) arranged in the direction Y in FIG. 34 does not coincide with the data output order illustrated on the left end in FIG. 34. The order of data stored in the 36 memory cells MC arranged in the direction Y in FIG. 34 is determined in order to reduce the number of interconnect intersections in the rearrangement interconnect region 410 to reduce the rearrangement interconnect length.

As described above, the data read order corresponding to the arrangement of the bitlines BL in the memory cell array 312 differs from the data output order from the memory output circuit 320. Therefore, the rearrangement interconnect region 410 shown in FIG. 34 is provided.

6.2 Memory Output Circuit

Figure 35:
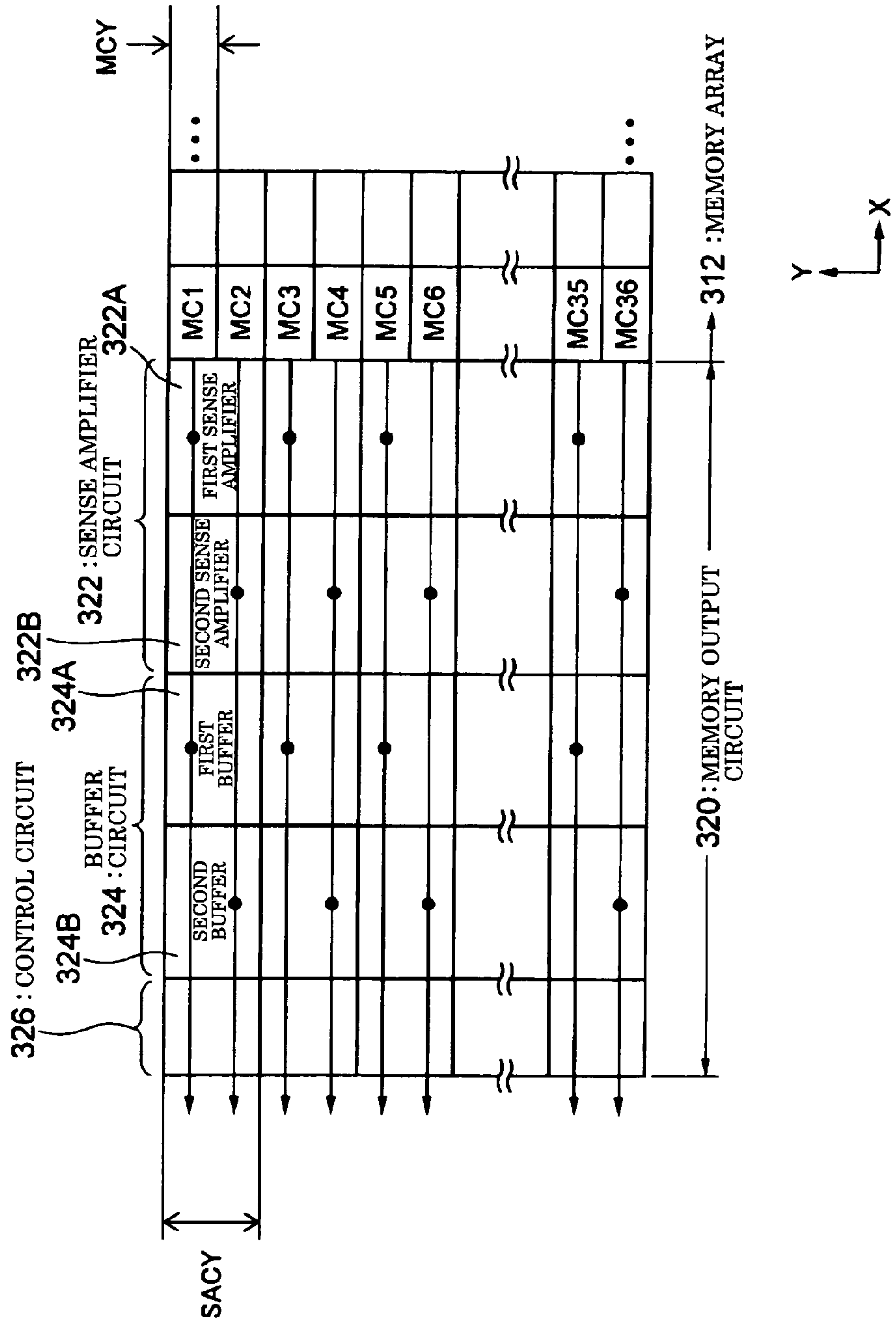
FIG. 35 is a diagram showing the memory output circuit of the RAM integrated data driver block.

An example of the memory output circuit 320 including the rearrangement interconnect region 410 is described below with reference to FIG. 35. In FIG. 35, the memory output circuit 320 includes a sense amplifier circuit 322, a buffer circuit 324, and a control circuit 326 which controls the sense amplifier circuit 322 and the buffer circuit 324, arranged along the direction X.

The sense amplifier circuit 322 includes L sense amplifier cells (L is an integer larger than 1) in the bitline direction (direction X), such as a first sense amplifier cell 322A and a second sense amplifier cell 322B (L=2), and two pieces of bit data simultaneously read in one horizontal scan period are respectively input to the first sense amplifier cell 322A and the second sense amplifier cell 322B. Therefore, the height of each of the first and second sense amplifier cells 322A and 322B may be within the range of the height of L (L=2) memory cells MC adjacent in the direction X, whereby the degrees of freedom of the circuit layout of the sense amplifier circuit 322 are ensured.

Specifically, when the height of one memory cell MC in the direction Y is MCY and the height of each of the first sense amplifier cell 322A and the second sense amplifier cell 322B (L=2) in the direction Y is SACY, if "$(L-1)\times MCY<SACY\leqq L\times MCY$" is satisfied, the degrees of freedom of the layout of the sense amplifier cells can be ensured while maintaining the height of the integrated circuit device in the direction Y equal to or less than a specific value. L is not limited to two, but may be an integer larger than 1. Note that L is an integer which satisfies "$L<M/2$".

Figure 36:
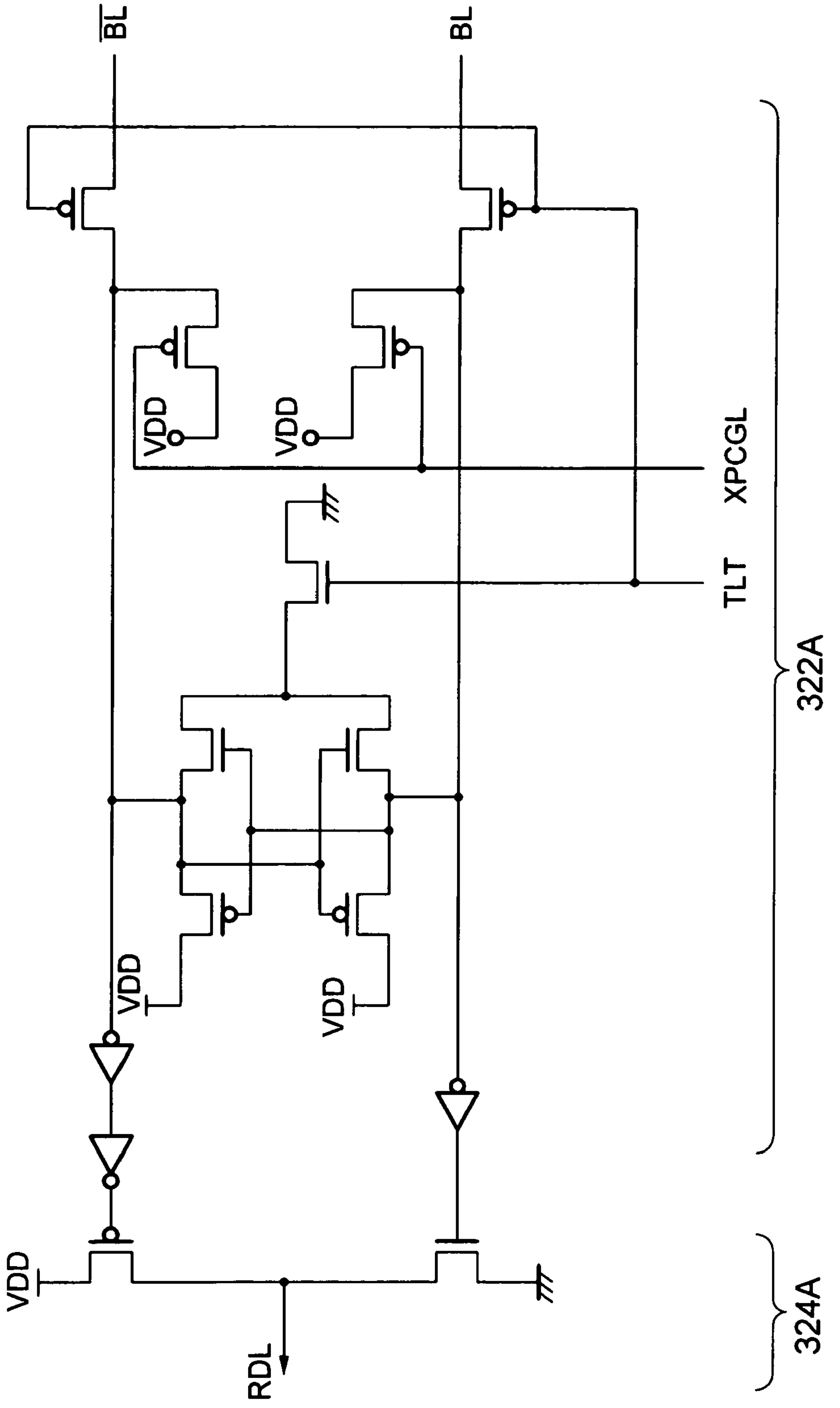
FIG. 36 is a circuit diagram of a sense amplifier and a buffer shown in FIG. 34.

The buffer circuit 324 includes a first buffer cell 324A which amplifies the output from the first sense amplifier cell 322A, and a second buffer cell 324B which amplifies the output from the second sense amplifier cell 322B. In the example shown in FIG. 35, data read from the memory cell MC1 upon selection of the wordline is detected by the first sense amplifier cell 322A, and amplified and output by the first buffer cell 324A. Data read from the memory cell MC2 upon selection of the same wordline is detected by the second sense amplifier cell 322B, and amplified and output by the second buffer cell 324B. FIG. 36 shows an example of the circuit configuration of the first sense amplifier cell 322A and the first buffer cell 324A. The first sense amplifier cell 322A and the first buffer cell 324A are controlled based on signals TLT and XPCGL from the control circuit 326.

6.3 Rearrangement Interconnect Region

Figure 37:
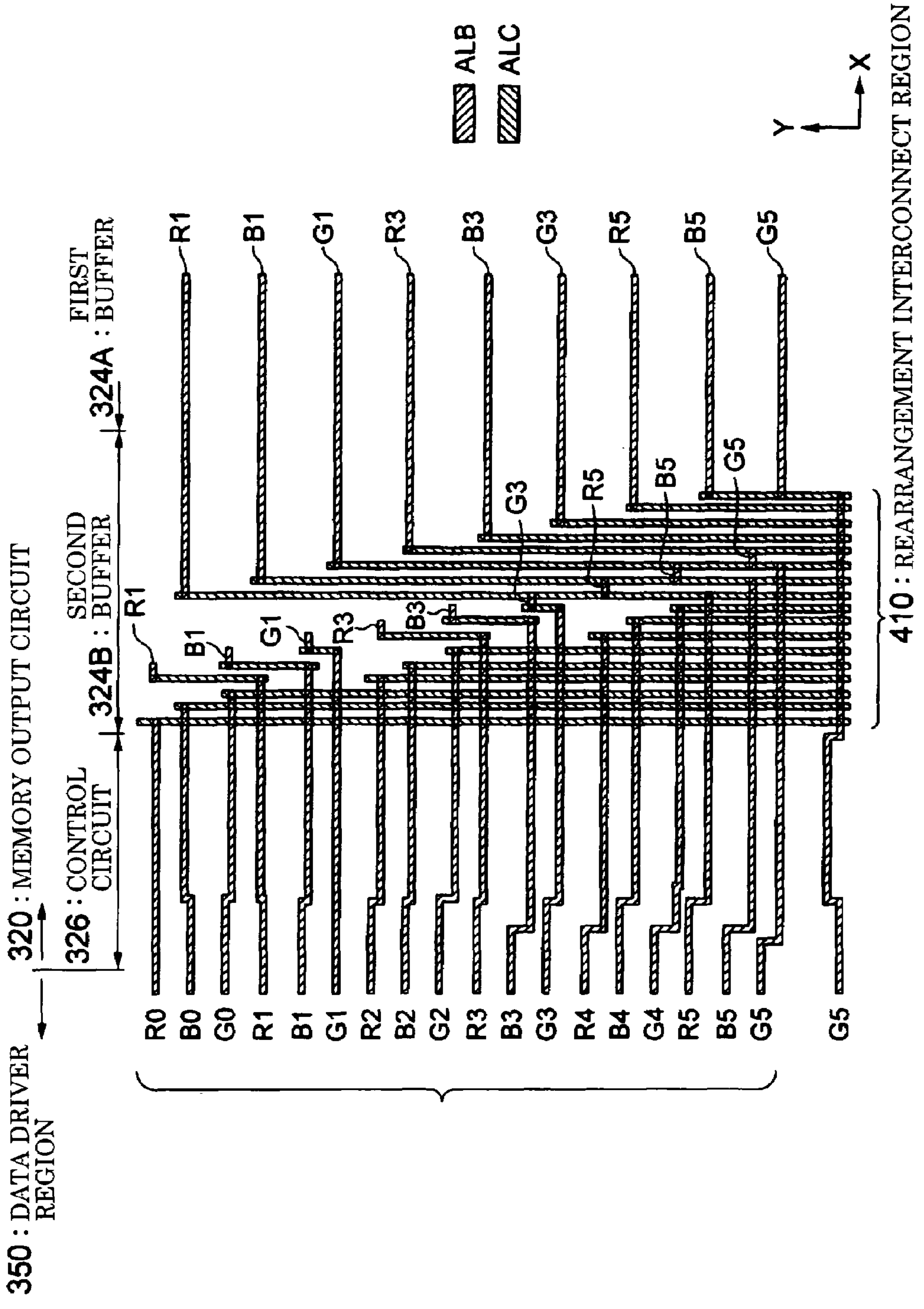
FIG. 37 is a diagram showing the details of a rearrangement interconnect region shown in FIG. 33.

In this embodiment, the rearrangement interconnect region 410 shown in FIG. 34 is disposed in the region of the second buffer cell 324B, as shown in FIG. 37. FIG. 37 mainly shows the subblock 300A shown in FIG. 33, in which output data R1 to B1, R3 to B3, and R5 to B5 from the first buffer cell 324A and output data R1 to B1, R3 to B3, and R5 to B5 from the second buffer cell 324B are illustrated.

Output terminals of the output data R1 to B1, R3 to B3, and R5 to B5 from the first buffer cell 324A are pulled out in the direction X using the second metal layer ALB, pulled out in the direction Y using the third metal layer ALC through vias, and provided toward the subblock 300B.

Output terminals of the output data R1 to B1, R3 to B3, and R5 to B5 from the second buffer cell 324B are pulled out to some extent in the direction X using the second metal layer ALB, pulled out in the direction Y using the third metal layer ALC through vias, pulled out in the direction X using the second metal layer ALB through vias, and connected with output terminals of the memory output circuit 320.

As described above, the desired rearrangement interconnects are realized in the rearrangement interconnect region 410 using the interconnect layer ALB in which a plurality of interconnects extending in the bitline direction are formed, the interconnect layer ALC in which a plurality of interconnects extending in the wordline direction are formed, and the vias which selectively connect the interconnect layers ALB and ALC. The outputs from the first and second buffer cells 324A and 324B can be rearranged within the shortest route by utilizing the region of the second buffer cell 324B, whereby the interconnect load can be reduced.

Figure 38:
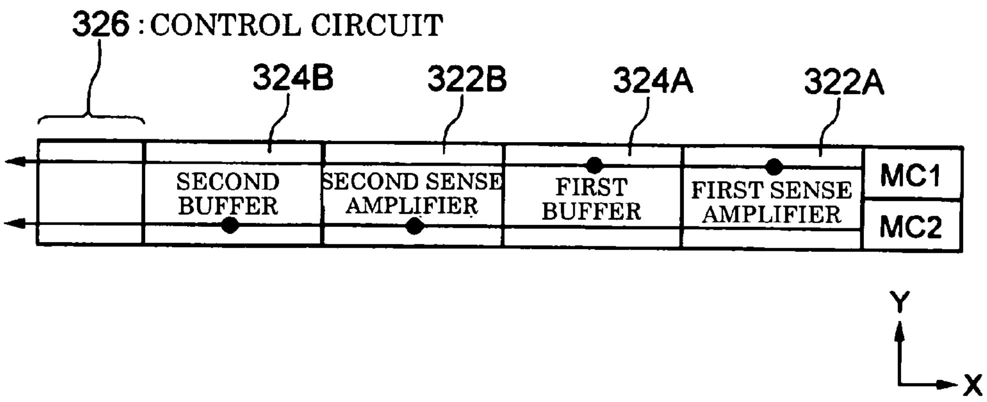
FIG. 38 is a diagram showing a memory output circuit differing from the memory output circuit shown in FIG. 35.

FIG. 38 shows a memory output circuit differing from that shown in FIG. 35. In FIG. 38, the first sense amplifier cell 322A, the first buffer cell 324A, the second sense amplifier cell 324B, the second buffer cell 324B, and the control circuit 326 are arranged in that order in the direction Y. In this case, the rearrangement interconnect region 410 can also be disposed in the region of the memory output circuit, in particular the region of the second buffer cell 324B.

Figure 39:
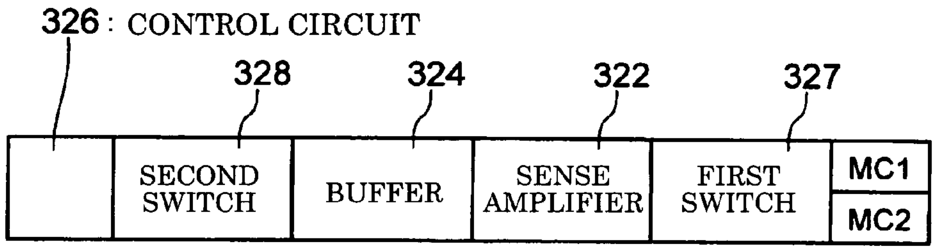
FIG. 39 is a diagram showing a memory output circuit differing from the memory output circuits shown in FIGS. 35 and 38.
Figure 40:
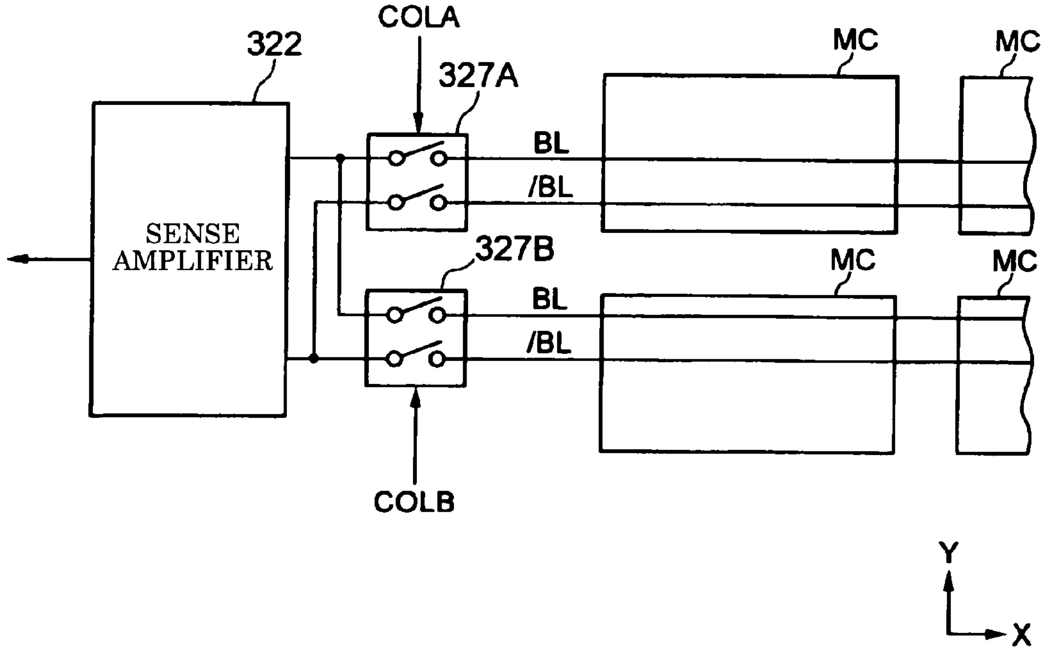
FIG. 40 is a diagram illustrative of a first switch shown in FIG. 39.

In the example shown in FIG. 39, the sense amplifier 322 and the buffer 324 are not divided corresponding to the number of readings N in one horizontal scan period. In this case, a first switch 327 is provided in the preceding stage of the sense amplifier 322, and a second switch 328 is provided in the subsequent stage of the buffer 324. As shown in FIG. 40, the first switch 327 includes two switches 327A and 327B exclusively selected using column address signals COLA and COLB. This allows one sense amplifier 322 and one buffer 324 to be used for two memory cells MC. The second switch 328 is switched in the same manner as the first switch 327 and selectively outputs data transmitted from two memory cells MC by time division to two output lines. In the example shown in FIG. 39, the rearrangement interconnect region 410 can also be disposed in the region of the memory output circuit.

In the above embodiment, the rearrangement interconnect region 410 is provided taking into consideration the layout of the memory cells determined due to data access between the host device and the memory cell array and the mirror-image arrangement of the circuit structure in the data driver. Note that rearrangement may be carried out taking into consideration one of these factors or a factor differing from these factors.

6.4 Arrangement of Data Driver and Driver Cell

Figure 41:
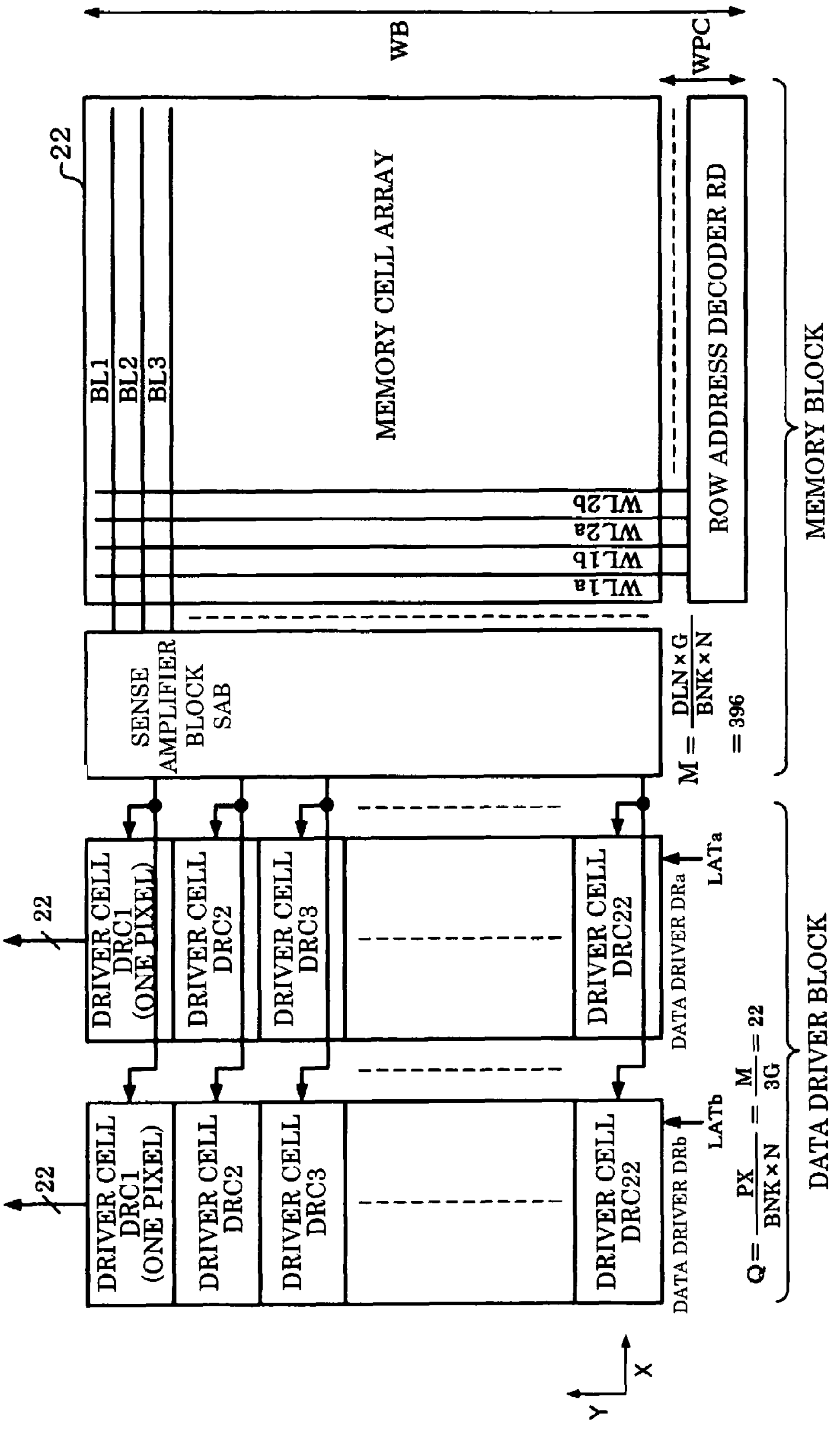
FIG. 41 is a diagram showing an arrangement example of data drivers and driver cells.

FIG. 41 shows an arrangement example of data drivers and driver cells included in the data drivers. As shown in FIG. 41, the data driver block includes a plurality of data drivers DRa and DRb (first to N-th divided data drivers) disposed along the direction X. Each of the data drivers DRa and DRb includes 22 (Q in a broad sense) driver cells DRC1 to DRC22.

When the wordline WL1*a* of the memory block has been selected and the first image data has been read from the memory block, the data driver DRa latches the read image data based on a latch signal LATa shown in FIG. 41. The data driver DRa performs D/A conversion of the latched image data and outputs a data signal DATAa corresponding to the first read image data to the data signal output line.

When the wordline WL1*b* of the memory block has been selected and the second image data has been read from the memory block, the data driver DRb latches the read image data based on a latch signal LATb shown in FIG. 41. The data driver DRb performs D/A conversion of the latched image data and outputs a data signal DATAb corresponding to the second read image data to the data signal output line.

Each of the data drivers DRa and DRb outputs the data signals for 22 data lines corresponding to 22 pixels in this manner, whereby the data signals for 44 data lines corresponding to 44 pixels are output in total in one horizontal scan period.

A problem in which the width W of the integrated circuit device in the direction Y is increased due to an increase in the size of the data driver can be prevented by disposing (stacking) the data drivers DRa and DRb along the direction X, as shown in FIG. 41. The data driver is configured in various ways depending on the type of display panel. In this case, data drivers of various configurations can be efficiently arranged by disposing the data drivers along the direction X. FIG. 41 illustrates the case where the number of data drivers disposed in the direction X is two. Note that the number of data drivers disposed in the direction X may be three or more.

In FIG. 41, each of the data drivers DRa and DRb includes 22 (Q) driver cells DRC1 to DRC22 disposed along the direction Y. Each of the driver cells DRC1 to DRC22 receives image data of one pixel. The driver cell performs D/A conversion of the image data of one pixel and outputs a data signal corresponding to the image data of one pixel.

In FIG. 41, the number of data lines of the display panel is DLN, the number of data driver blocks (number of block divisions) is BNK, and the number of readings of image data in one horizontal scan period is N.

In this case, when the number of pixels of the display panel in the horizontal scan direction is PX, the number of banks is BNK, and the number of readings in one horizontal scan period is N, the number Q of the driver cells DRC1 to DRC22 arranged along the direction Y may be expressed as $Q=PX/(BNK\times N)$. In FIG. 41, since PX=176, BNK=4, and N=2, $Q=176/(4\times 2)=22$.

Specifically, when the number of bits of data read from the display memory in one horizontal scan period is M and the grayscale value of data supplied to the data line is G bits, the number Q of the driver cells DRC1 to DRC22 arranged along the direction Y in an RGB color display may be expressed as $Q=M/3G$. In FIG. 41, since M=396 and G=6, $Q=396/(3\times 6)=22$.

The number of data lines of the display panel is DLN, the number of bits of image data per data line is G, the number of memory blocks is BNK, and the number of readings of image data from the memory block in one horizontal scan period is N. In this case, the number of sense amplifier cells (sense amplifiers which output one-bit image data) included in the sense amplifier block SAB is equal to the number of bits M of data read from the memory cell in one horizontal scan period and may be expressed as M=(DLN×G)/(BNK×N). In FIG. 41, since DLN=528, G=6, BNK=4, and N=2, M=(528×6)/(4×2)=396. The number M is the number of effective sense amplifiers corresponding to the number of effective memory cells, and excludes the number of ineffective sense amplifiers such as a dummy memory cell sense amplifier. When two sense amplifier cells (L=2) are arranged in the bitline direction, as shown in FIGS. 35 and 38, the number P of sense amplifiers arranged along the wordline direction is expressed as P=M/L=(DLN×G)/(BNK×N×L)=198.

6.5 Layout of Data Driver Block

Figure 42:
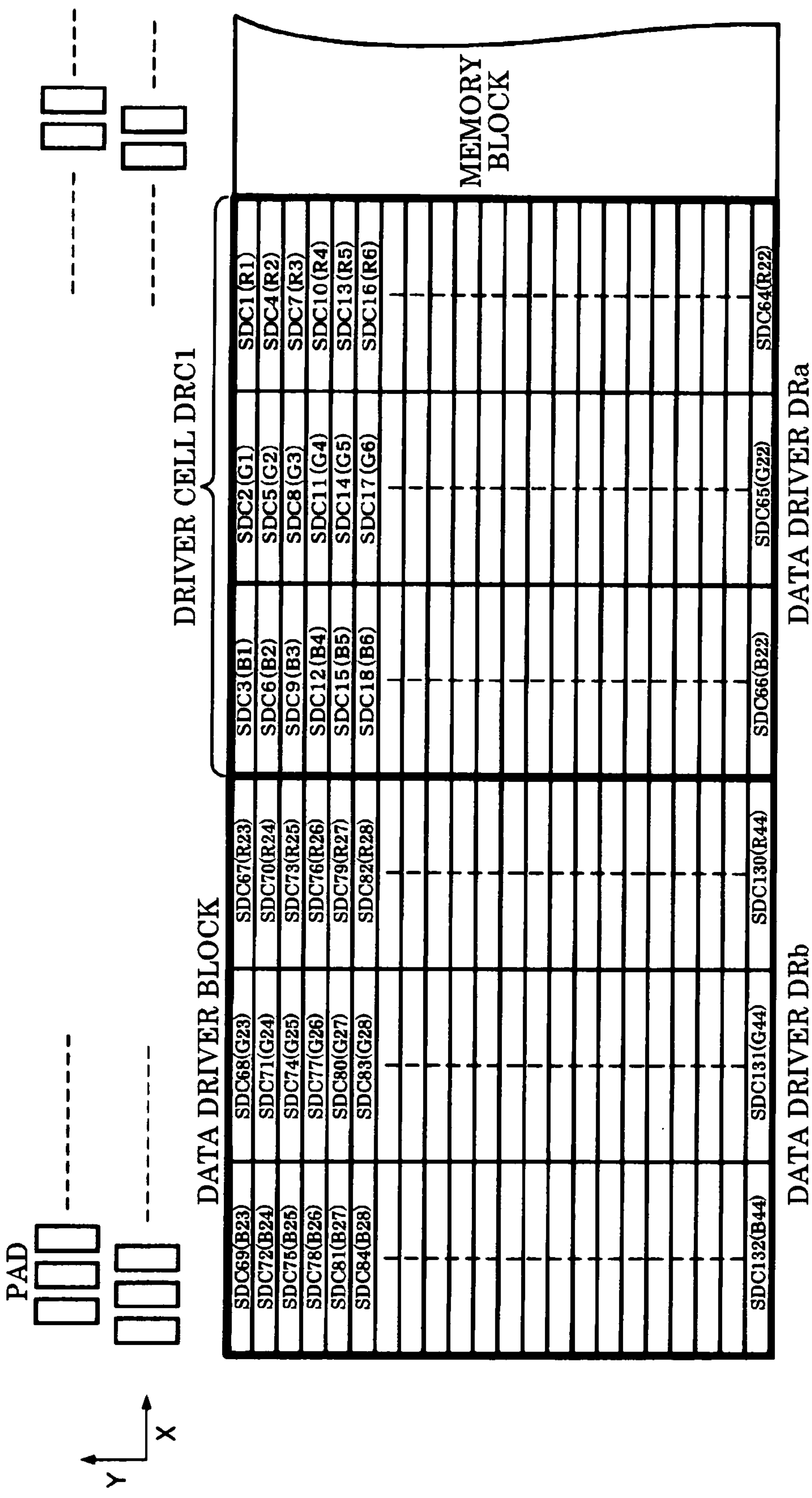
FIG. 42 is a diagram showing an arrangement example of subpixel driver cells.

FIG. 42 shows a more detailed layout example of the data driver block. In FIG. 42, the data driver block DRa and DRb (N=2) include a plurality of subpixel driver cells SDC1 to SDC132 each of which outputs a data signal corresponding to image data of one subpixel. Each of the data driver blocks is subdivided into R, G, and B along the direction X (direction along the long side of the subpixel driver cell) so that 22 (=M/3G) R, G, and B subpixel driver cells are disposed along the direction Y. Specifically, the subpixel driver cells SDC1 to SDC132 are disposed in a matrix. The pads (pad block) for electrically connecting the output lines of the data driver block with the data lines of the display panel are disposed on the side of the data driver block in the direction Y.

In FIG. 42, the subpixel driver cells SDC1, SDC4, SDC7, . . . , and SDC64 of the divided data line driver DRa are R data drive cells belonging to the first subdivided data line driver. The subpixel driver cells SDC2, SDC5, SDC8, . . . , and SDC65 are G data drive cells belonging to the second subdivided data line driver. The subpixel driver cells SDC3, SDC6, SDC9, . . . , and SDC66 are B data drive cells belonging to the Sth or third subdivided data line driver.

In the embodiment shown in FIG. 42, the number of readings N in one horizontal scan period is two. Specifically, the number N is not a multiple of three, differing from the embodiment shown in FIG. 28. However, even if the number of readings N in one horizontal scan period is not a multiple of three, the R, G, and B driver cells can be separately arranged along the second direction in color units by separately disposing the R, G, and B subdivided data drivers in color units in each of the divided data line drivers DRa and each DRb, as shown in FIG. 42.

For example, the driver cell DRC1 of the data driver DRa shown in FIG. 41 includes the subpixel driver cells SDC1, SDC2, and SDC3 shown in FIG. 42. The subpixel driver cells SDC1, SDC2, and SDC3 are R (red), G (green), and B (blue) subpixel driver cells, respectively. The R, G, and B image data (R1, G1, B1) corresponding to the first data signals is input to the subpixel driver cells SDC1, SDC2, and SDC3 from the memory block. The subpixel driver cells SDC1, SDC2, and SDC3 perform D/A conversion of the image data (R1, G1, B1), and output the first R, G, and B data signals (data voltages) to the R, G, and B pads corresponding to the first data lines.

Likewise, the driver cell DRC2 includes the R, G, and B subpixel driver cells SDC4, SDC5, and SDC6. The R, G, and B image data (R2, G2, B2) corresponding to the second data signals is input to the subpixel driver cells SDC4, SDC5, and SDC6 from the memory block. The subpixel driver cells SDC4, SDC5, and SDC6 perform D/A conversion of the image data (R2, G2, B2), and output the second R, G, and B data signals (data voltages) to the R, G, and B pads corresponding to the second data lines. The above description also applies to the remaining subpixel driver cells.

Figure 43:
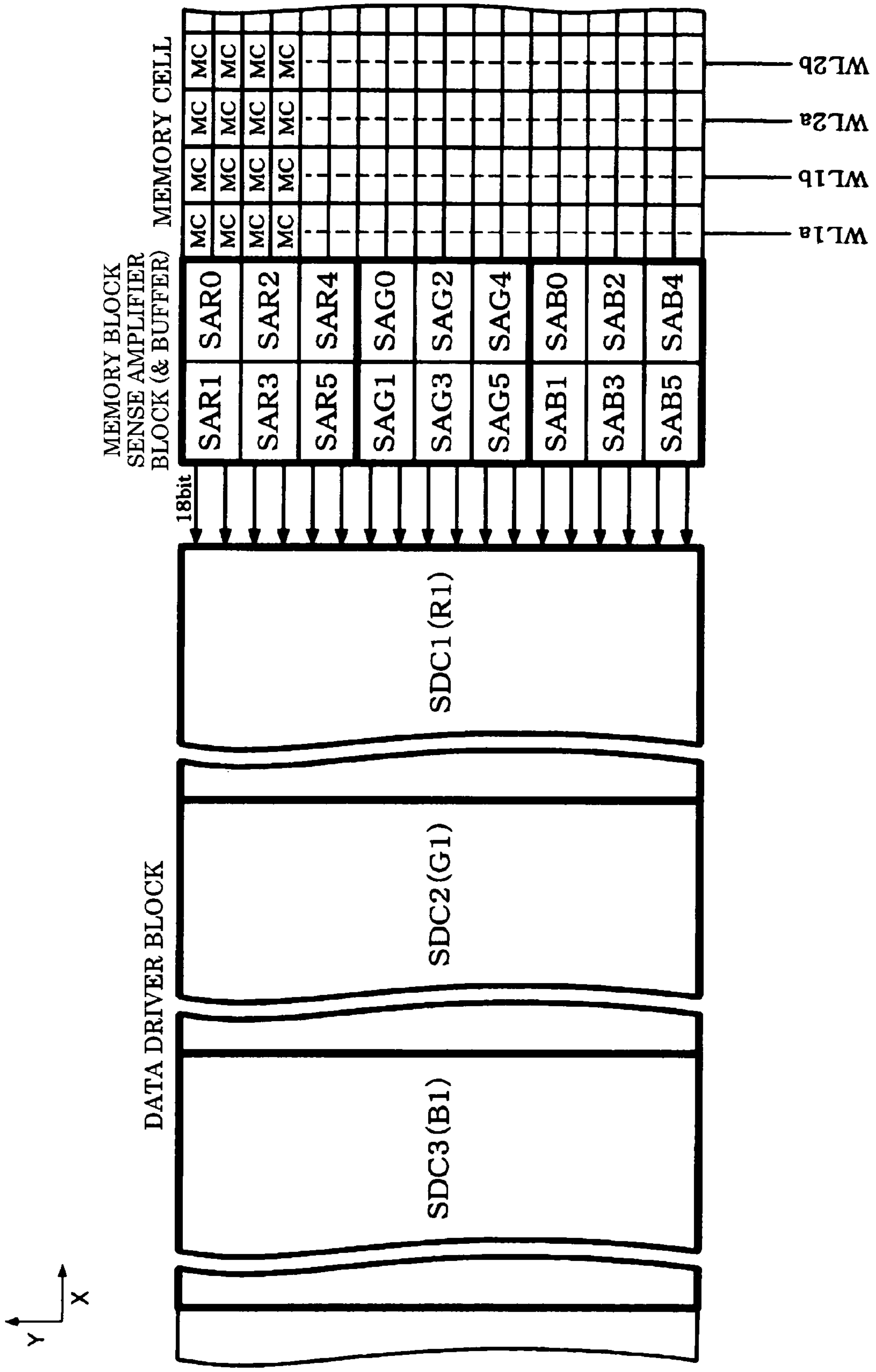
FIG. 43 is a diagram showing an arrangement example of sense amplifiers and memory cells.

The number of subpixels is not limited to three, but may be four or more. The arrangement of the subpixel driver cells is not limited to the arrangement shown in FIG. 42. For example, the R, G, and B subpixel driver cells may be stacked along the direction Y 6.6 Layout of Memory Block FIG. 43 shows a layout example of the memory block. FIG. 43 is a detailed view of the portion of the memory block corresponding to one pixel (six bits each for R, G, and B; 18 bits in total). The RGB arrangement of the sense amplifier block in FIG. 43 has been rearranged as described with reference to FIG. 37 for convenience of illustration.

The portion of the sense amplifier block corresponding to one pixel includes R sense amplifier cells SAR0 to SAR5, G sense amplifier cells SAG0 to SAG5, and B sense amplifier cells SAB0 to SAB5. In FIG. 43, two (a plurality of in a broad sense) sense amplifiers (and buffer) are stacked in the direction X. Two rows of memory cells are arranged along the direction X on the side of the stacked sense amplifier cells SAR0 and SAR1 in the direction X, the bitline of the memory cells in the upper row being connected with the sense amplifier SAR0, and the bitline of the memory cells in the lower row being connected with the sense amplifier SAR1, for example. The sense amplifier cells SAR0 and SAR1 amplify the image data signals read from the memory cells, and two bits of image data are output from the sense amplifier cells SAR0 and SAR1. The above description also applies to the relationship between the remaining sense amplifiers and the memory cells.

In the configuration shown in FIG. 43, a plurality of image data read operations in one horizontal scan period shown in FIG. 11B may be realized as follows. Specifically, in the first horizontal scan period (first scan line select period), the first image data read operation is performed by selecting the wordline WL1*a* shown in FIG. 41, and the first data signal DATAa is output. In this case, R, G, and B image data from the sense amplifier cells SAR0 to SAR5, SAG0 to SAG5, and SAB0 to SAB5 is respectively input to the subpixel driver cells SDC1, SDC2, and SDC3. Then, the second image data read operation is performed in the second horizontal scan period by selecting the wordline WL1*b*, and the second data signal DATAb is output. In this case, R, G, and B image data from the sense amplifier cells SAR0 to SAR5, SAG0 to SAG5, and SAB0 to SAB5 is respectively input to the subpixel driver cells SDC67, SDC68, and SDC69 shown in FIG. 42. In the second horizontal scan period (second scan line select period), the first image data read operation is performed by selecting the wordline WL2*a*, and the first data signal DATAa is output. Then, the second image data read operation is performed in the second horizontal scan period by selecting the wordline WL2*b*, and the second data signal DATAb is output.

7. Electronic Instrument

Figure 44A:
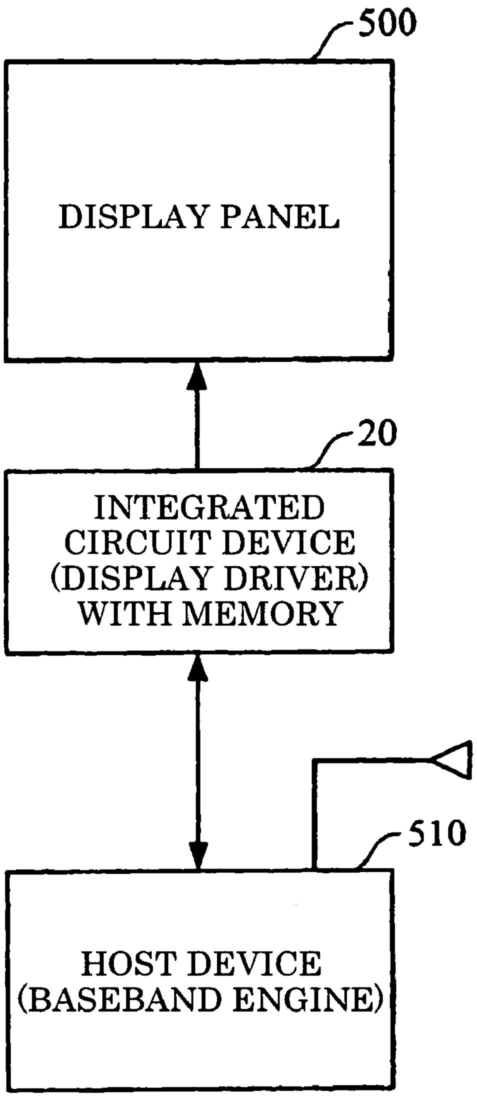
FIGS. 44A and 44B are diagrams showing electronic instruments including the integrated circuit device according to the embodiment.
Figure 44B:
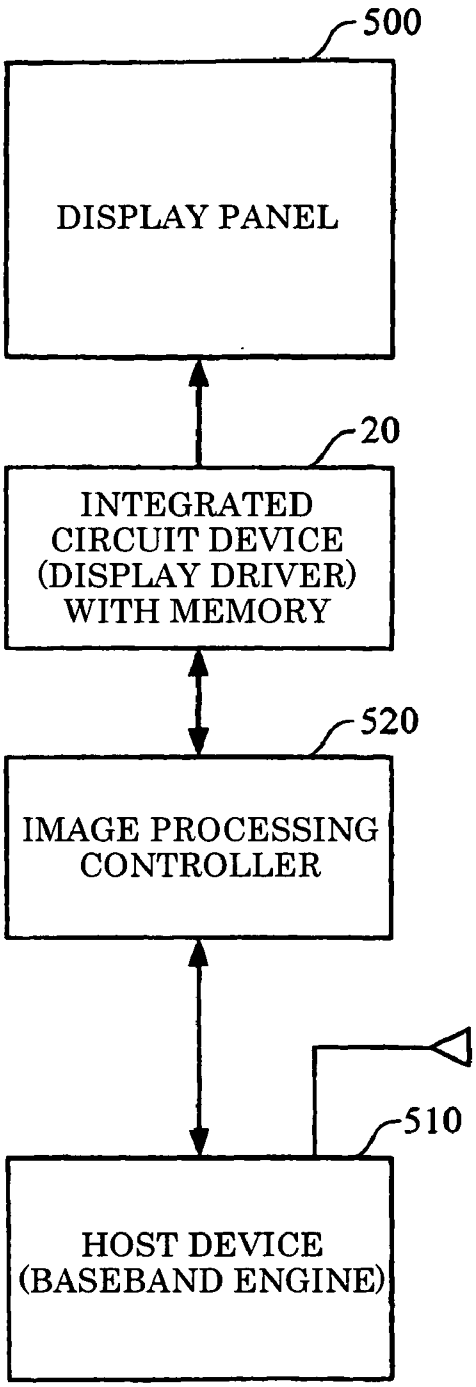

FIGS. 44A and 44B illustrate examples of an electronic instrument (electro-optical device) including the integrated circuit device 20 according to the above embodiment. The electronic instrument may include constituent elements (e.g. camera, operation section, or power supply) other than the constituent elements shown in FIGS. 44A and 44B. The electronic instrument according to this embodiment is not limited to a portable telephone, but may be a digital camera, PDA, electronic notebook, electronic dictionary, projector, rear-projection television, portable information terminal, or the like.

In FIGS. 44A and 44B, a host device 510 is a microprocessor unit (MPU), a baseband engine (baseband processor), or the like. The host device 510 controls the integrated circuit device 20 which is a display driver. The host device 410 may perform processing as an application engine and a baseband engine or processing as a graphic engine such as compression, decompression, and sizing. An image processing controller (display controller) 520 shown in FIG. 44B performs processing as a graphic engine such as compression, decompression, or sizing instead of the host device 510.

A display panel 500 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 500 may be formed by an active matrix type panel using switching elements such as a TFT or TFD. The display panel 500 may be a panel other than an active matrix type panel, or may be a panel other than a liquid crystal panel.

In FIG. 44A, the integrated circuit device 20 may include a memory. In this case, the integrated circuit device 20 writes image data from the host device 510 into the built-in memory, and reads the written image data from the built-in memory to drive the display panel. In FIG. 44B, the integrated circuit device 20 may also include a memory. In this case, image data from the host device 510 may be image-processed using a memory provided in the image processing controller 520. The processed data is stored in the memory of the integrated circuit device 20, whereby the display panel 500 is driven.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings.

In the above embodiment, image data of one display frame (screen) can be stored in the RAMs 200 provided in the display driver 20, for example. Note that the invention is not limited thereto.

The display panel 10 may be provided with Z (Z is an integer larger than 1) display drivers, and 1/Z of the image data of one display frame may be stored in each of the Z display drivers. In this case, when the total number of data lines DL for one display frame is DLN, the number of data lines driven by each of the Z display drivers is DLN/Z.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. An integrated circuit device comprising:

a RAM block including a plurality of wordlines, a plurality of bitlines, a plurality of memory cells, and a data read control circuit; and a data line driver block which drives a plurality of data line groups of a display panel based on data supplied from the RAM block;

wherein the data read control circuit reads data for pixels corresponding to data lines of each of the data line groups from the RAM block by N-time reading (N is an integer larger than one) in one horizontal scan period;

wherein the data line driver block includes first to N-th divided data line driver blocks, each of the first to N-th divided data line driver blocks driving a different data line group of the data line groups; and wherein each of the first to N-th divided data line driver blocks is disposed along a first direction in which the bitlines extend;

wherein, when data supplied from the RAM block is M bits (M is an integer larger than 1) and grayscale of a pixel corresponding to a data line is G bits, each of the first to N-th divided data line driver blocks includes (M/G) data line driver cells which drive (M/G) data lines; and wherein, when the display panel is a color display panel, (M/G) is a multiple of three, and the (M/G) data line driver cells include (M/3G) R data line driver cells each of which drives a data line corresponding to an R pixel, (M/3G) G data line driver cells each of which drives a data line corresponding to a G pixel, and (M/3G) B data line driver cells each of which drives a data line corresponding to a B pixel.

2. The integrated circuit device as defined in claim 1, wherein, in each of the first to N-th divided data line driver blocks, a first subdivided driver in which the (M/3G) R data line driver cells are arranged in a second direction in which the wordlines extend, a second subdivided driver in which the (M/3G) G data line driver cells are arranged in the second direction, and a third subdivided driver in which the (M/3G) B data line driver cells are arranged in the second direction are disposed at different positions in the first direction.

3. The integrated circuit device as defined in claim 2, wherein an identical latch signal of the first to third latch signals is supplied to each of the first to third subdivided data line drivers.

4. The integrated circuit device as defined in claim 1, wherein the data read control circuit includes a wordline control circuit, and wherein the wordline control circuit selects N different wordlines from the wordlines in one horizontal scan period, and does not select the identical wordline a plurality of times in one vertical scan period of the display panel.

5. The integrated circuit device as defined in claim 4, wherein, when the data has been read from the RAM block K (1≦K≦N, K is an integer) times in one horizontal scan period, the K-th latch signal is set to active so that the data supplied from the RAM block by the K-th read operation is latched by the K-th divided data line driver block.

6. The integrated circuit device as defined in claim 4, wherein the RAM block includes a sense amplifier circuit which outputs M-bit data by one read operation, wherein at least M memory cells are arranged in the RAM block along a second direction in which the wordlines extend, and wherein M-bit data is supplied to the sense amplifier circuit by one read operation.

7. The integrated circuit device as defined in claim 1, wherein first to N-th latch signals are respectively supplied to the first to N-th divided data line driver blocks, and wherein the first to N-th divided data line driver blocks latch the data supplied from the RAM block based on the first to N-th latch signals.

8. The integrated circuit device as defined in claim 1, wherein the wordlines are formed parallel to a direction in which the data lines of the display panel extend.

9. An electronic instrument, comprising:

the integrated circuit device as defined in claim 1; and a display panel.

10. The electronic instrument as defined in claim 9, wherein the integrated circuit device is mounted on a substrate which forms the display panel.

* * * * *

UNITED STATES PATENT AND TRADEMARK OFFICE

CERTIFICATE OF CORRECTION

PATENT NO. : 7,613,066 B2
APPLICATION NO. : 11/477719
DATED : November 3, 2009
INVENTOR(S) : Kodaira et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 767 days.

Signed and Sealed this

Fourteenth Day of December, 2010

David J. Kappos
*Director of the United States Patent and Trademark Office*